United States Patent
Lin

(10) Patent No.: US 7,157,791 B1
(45) Date of Patent: Jan. 2, 2007

(54) SEMICONDUCTOR CHIP ASSEMBLY WITH PRESS-FIT GROUND PLANE

(75) Inventor: Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 10/866,393

(22) Filed: Jun. 11, 2004

(51) Int. Cl.
*H01L 23/04* (2006.01)

(52) U.S. Cl. .................. 257/698; 257/785

(58) Field of Classification Search .......... 257/691
See application file for complete search history.

(56) References Cited

U.S. PATENT DOCUMENTS

| | | | |
|---|---|---|---|
| 4,020,430 A | 4/1977 | Vander Heyden | 333/79 |
| 5,040,999 A | 8/1991 | Collier | 439/108 |
| 5,089,929 A | 2/1992 | Hilland | 361/111 |
| 5,172,301 A | 12/1992 | Schneider | 361/386 |
| 5,559,369 A | 9/1996 | Newman | 257/668 |
| 5,722,162 A | 3/1998 | Chou et al. | 29/852 |
| 5,751,556 A * | 5/1998 | Butler et al. | 361/773 |
| 5,860,812 A | 1/1999 | Gugliotti | 439/63 |
| 5,936,837 A * | 8/1999 | Scribner et al. | 361/704 |
| 6,001,671 A | 12/1999 | Fjelstad | 438/112 |
| 6,025,650 A * | 2/2000 | Tsuji et al. | 257/786 |
| 6,081,996 A * | 7/2000 | Kruppa et al. | 29/840 |
| 6,150,615 A * | 11/2000 | Suzuki | 174/260 |
| 6,159,770 A | 12/2000 | Tetaka et al. | 438/112 |
| 6,160,309 A | 12/2000 | Le | 257/684 |
| 6,218,728 B1 | 4/2001 | Kimura | 257/693 |
| 6,325,280 B1 * | 12/2001 | Murphy | 228/246 |
| 6,404,059 B1 * | 6/2002 | Iwasaki et al. | 257/774 |
| 6,440,835 B1 | 8/2002 | Lin | 438/611 |
| 6,450,250 B1 | 9/2002 | Guerrero | 165/104.33 |
| 6,462,423 B1 | 10/2002 | Akram et al. | 257/778 |
| 6,483,718 B1 | 11/2002 | Hashimoto | 361/803 |
| 6,492,252 B1 | 12/2002 | Lin et al. | 438/612 |
| 6,504,241 B1 | 1/2003 | Yanagida | 257/686 |
| 6,554,643 B1 | 4/2003 | Whiting | 439/571 |
| 6,559,529 B1 | 5/2003 | Torti et al. | 257/684 |
| 6,576,539 B1 | 6/2003 | Lin | 438/611 |
| 6,608,259 B1 * | 8/2003 | Norskov | 174/261 |
| 6,630,373 B1 | 10/2003 | Punzalan et al. | 438/123 |
| 6,653,217 B1 | 11/2003 | Lin | 438/612 |
| 6,670,703 B1 | 12/2003 | Ahn et al. | 257/691 |
| 6,687,133 B1 | 2/2004 | Liew et al. | 361/760 |
| 6,803,649 B1 * | 10/2004 | He et al. | 257/691 |
| 2002/0096789 A1 * | 7/2002 | Bolken | 257/787 |
| 2002/0195271 A1 * | 12/2002 | Gailus | 174/262 |

OTHER PUBLICATIONS

U.S. Appl. No. 10/714,794, filed Nov. 17, 2003, entitled "Semiconductor Chip Assembly with Embedded Metal Pillar".

* cited by examiner

*Primary Examiner*—Evan Pert
*Assistant Examiner*—Benjamin P. Sandvik
(74) *Attorney, Agent, or Firm*—David M. Sigmond

(57) ABSTRACT

A semiconductor chip assembly includes a semiconductor chip that includes a conductive pad, a conductive trace that includes a pillar and a routing line, and a ground plane. The pillar is press-fit into an opening in the ground plane, and the ground plane is electrically connected to the pad.

210 Claims, 38 Drawing Sheets

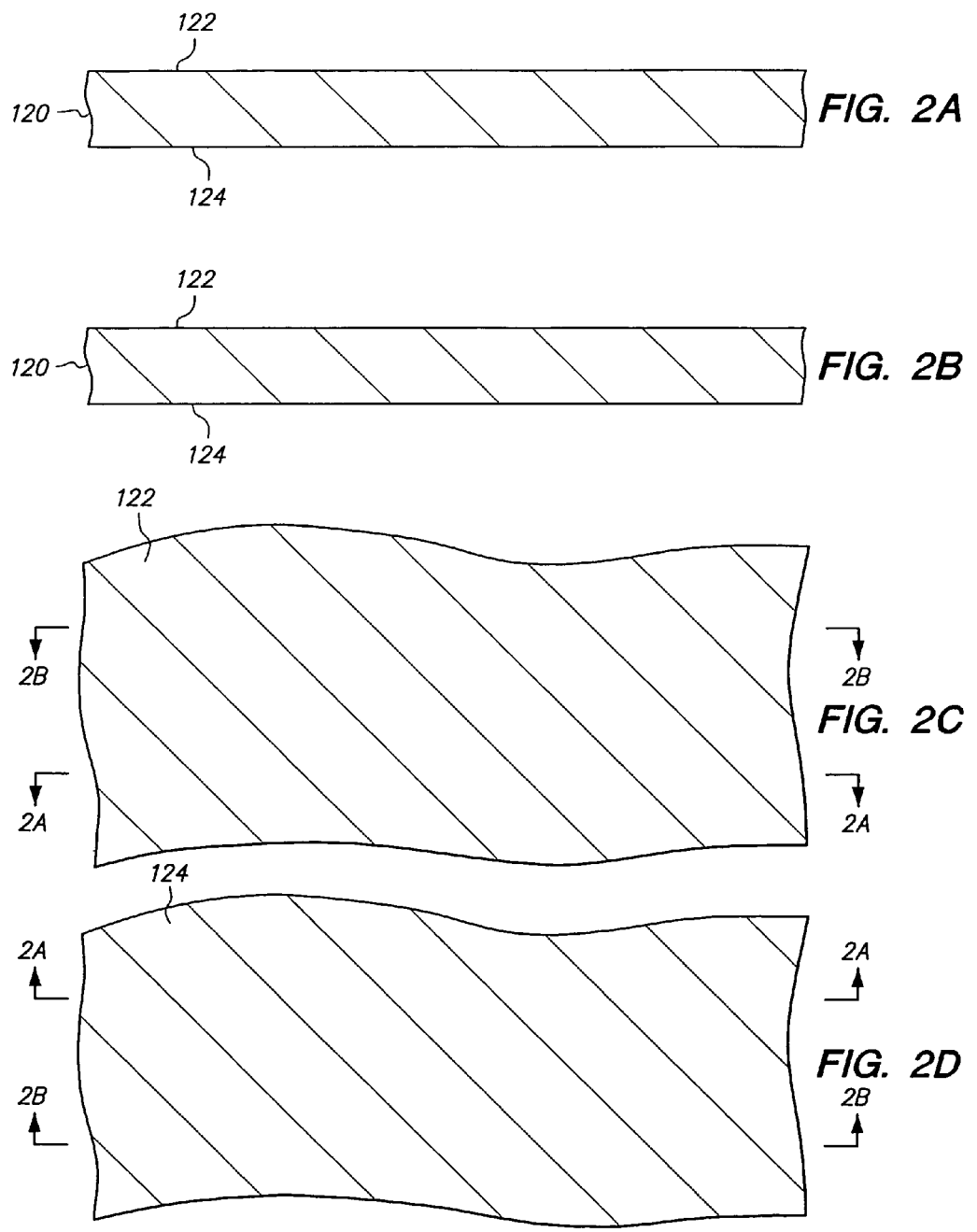

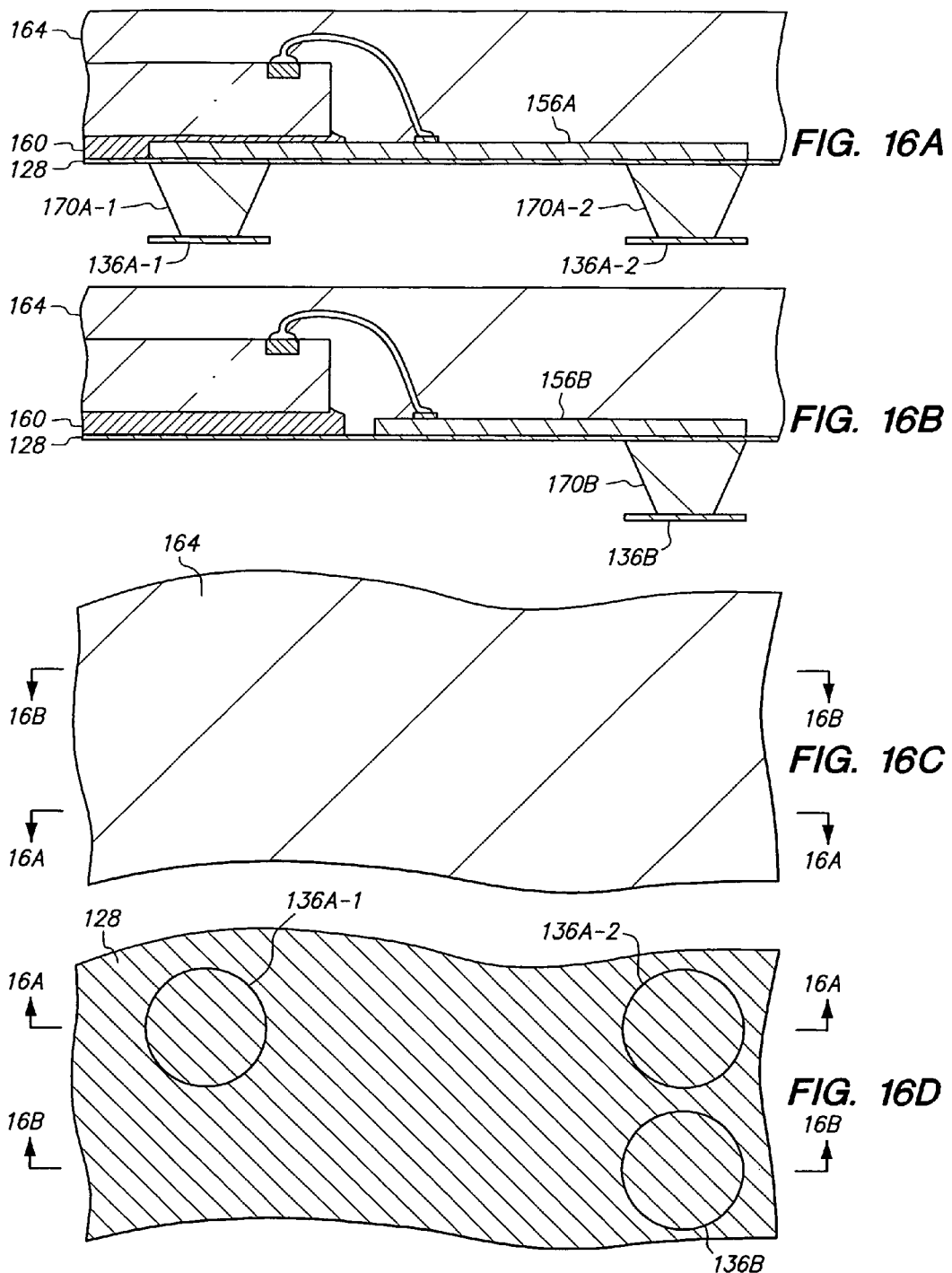

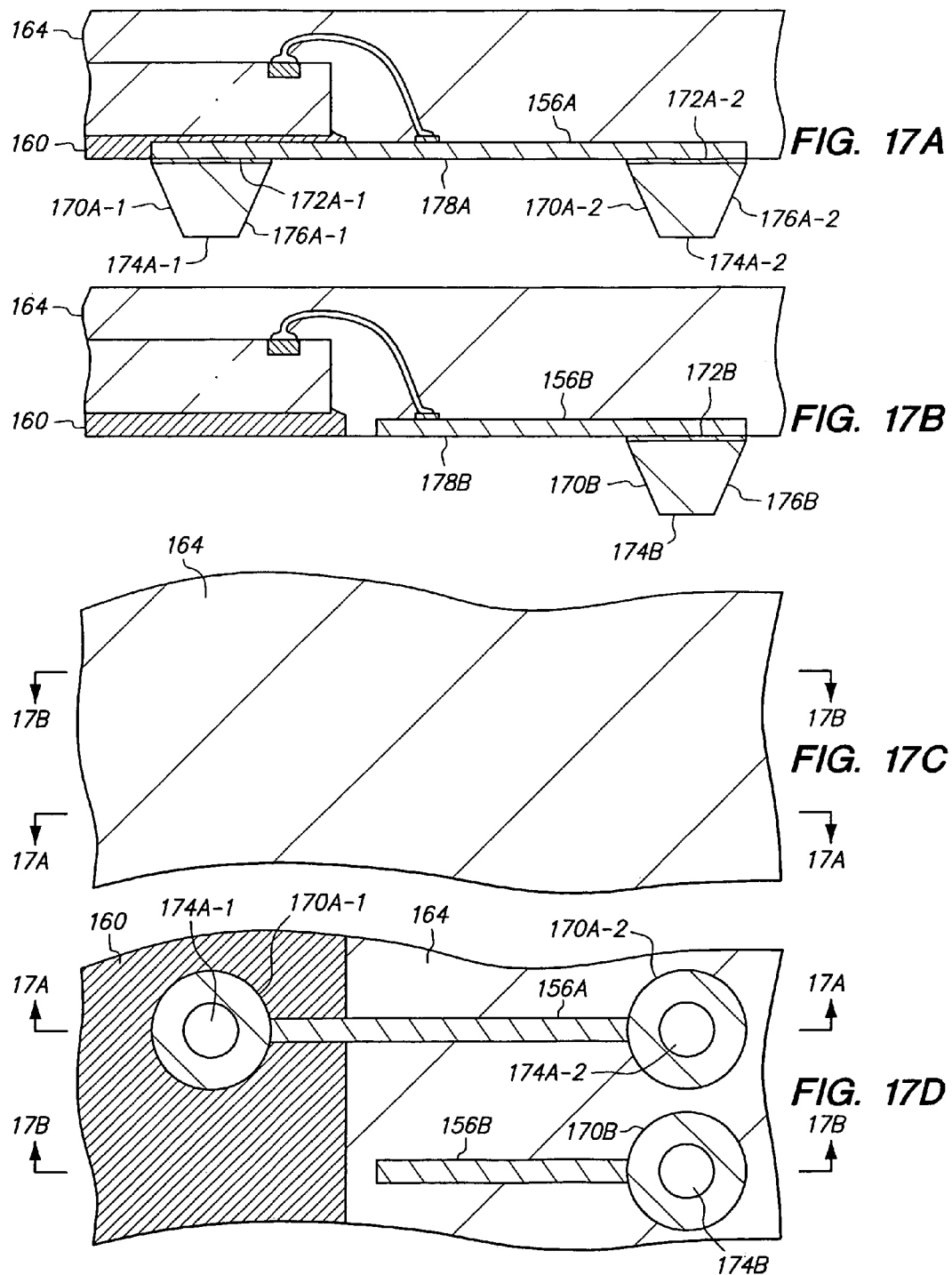

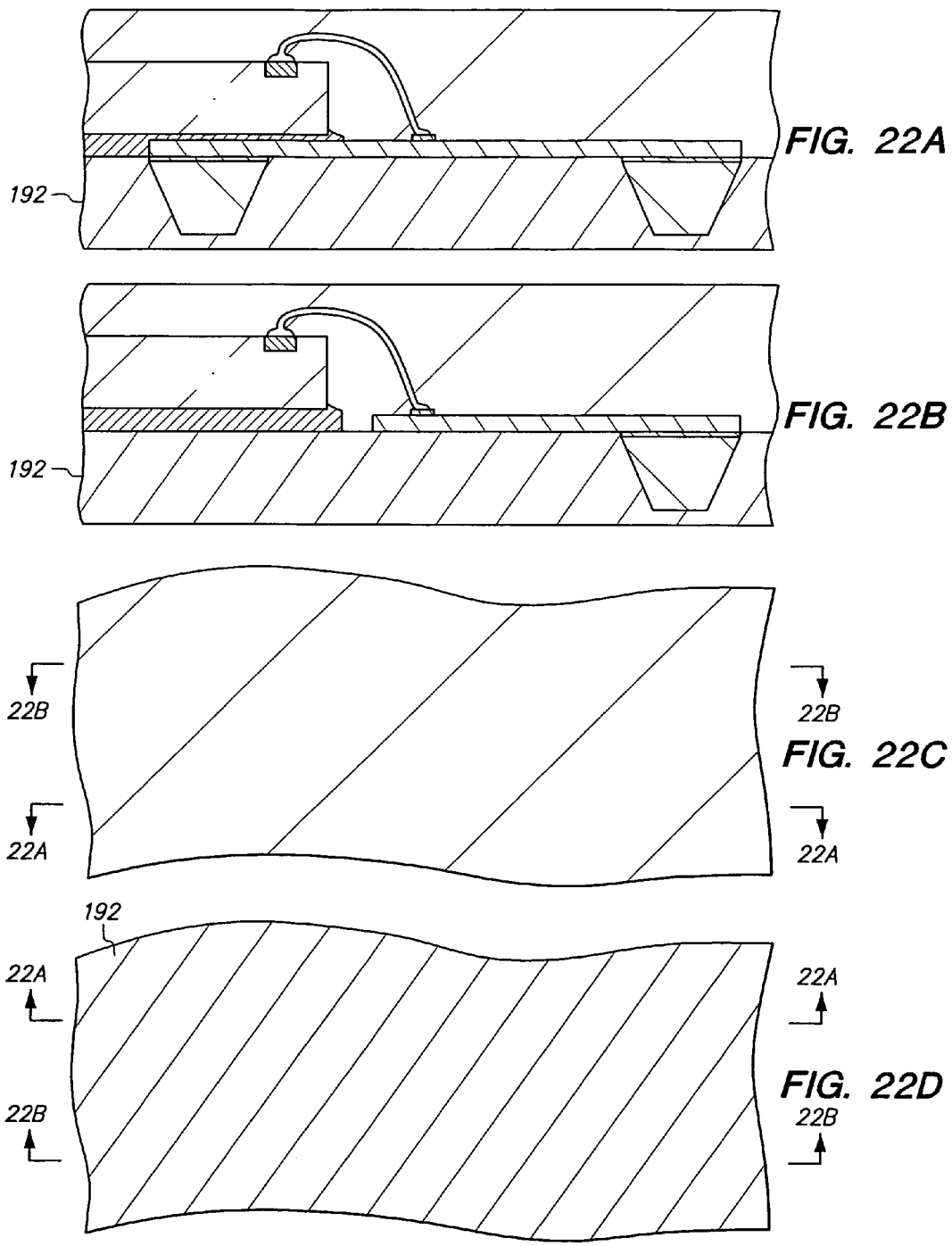

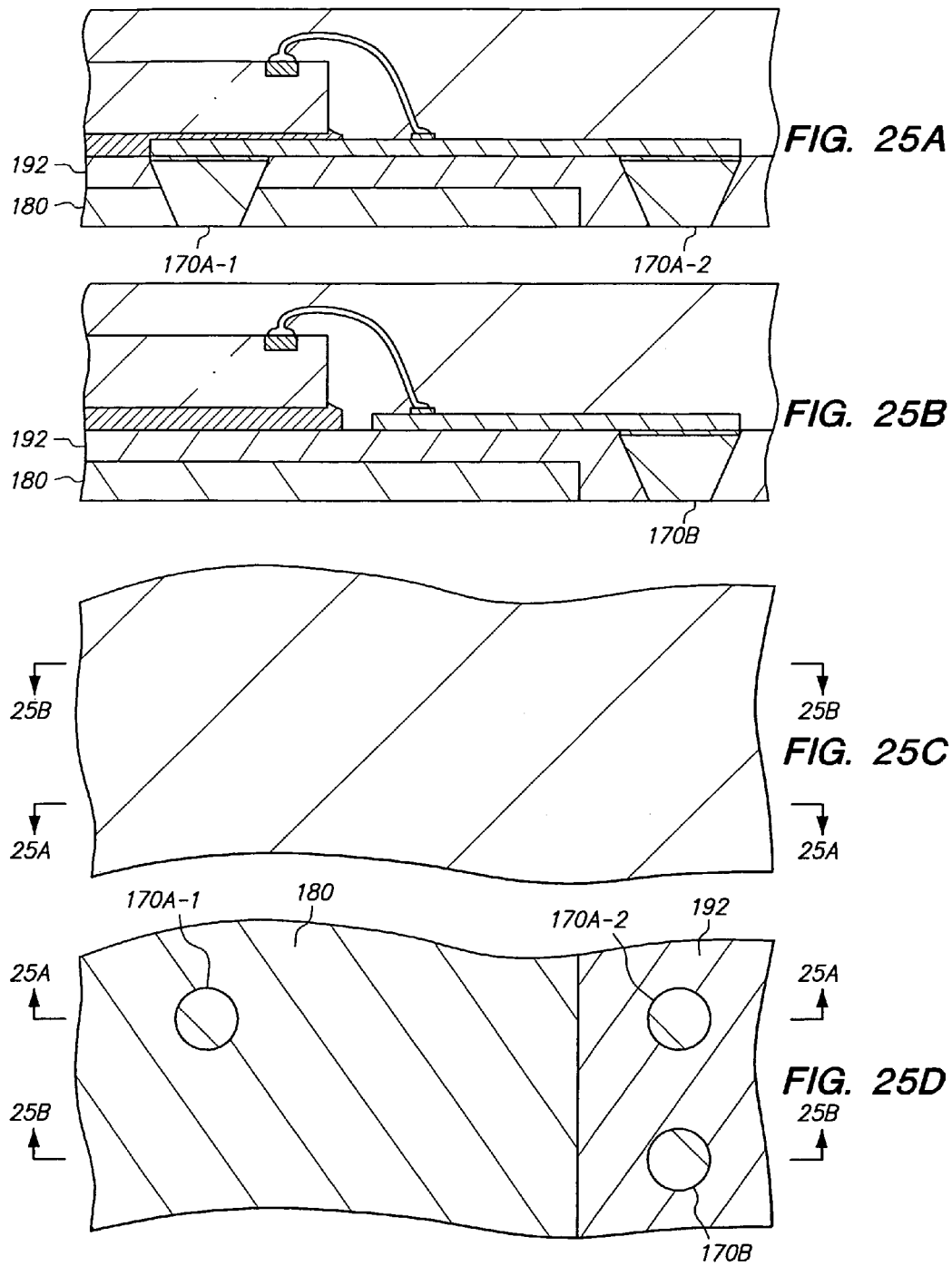

SEMICONDUCTOR CHIP ASSEMBLY WITH PRESS-FIT GROUND PLANE

BACKGROUND OF THE INVENTION

1. Field of the Invention

The present invention relates to a semiconductor chip assembly, and more particularly to a semiconductor chip assembly with a ground plane and its method of manufacture.

2. Description of the Related Art

Semiconductor chips have power, ground and input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

First-level packages include a chip and a connection technique. First-level packages provide contacts connected to the power, ground and input/output pads to provide power, ground and signal transmission for the chip. First-level packages also provide thermal expansion compatibility with the chip, heat removal from the chip, and low signal transmission delay and electrical noise.

First-level packages include through-hole packages such as the dual in-line package (DIP), single in-line package (SIP), zig-zag in-line package (ZIP) and pin grid array (PGA). First-level packages also include surface mount packages such as the small outline package (SOP), quad flat package (QFP), leadless chip carrier (LCC), plastic leaded chip carrier (PLCC), ball grid array (BGA) and chip scale package (CSP).

First-level packages can be a single-chip module (SCM) or a multi-chip module (MCM), depending on whether the package contains a single chip or multiple chips. Multi-chip modules provide the most circuits in the least amount of space, and are widely used in mainframes, workstations and consumer electronics as well as medical, aerospace, automotive and telecommunication devices.

Second-level packages includes groups of first-level packages along with other components such as capacitors, resistors, inductors, filters, switches, optical devices and radio frequency devices, mounted on a printed circuit board (PCB).

Telecommunication devices require chips to operate at high frequencies such as 30 to 300 GHz. At these frequencies, the signal lines generate electromagnetic and electrostatic fields which can cause cross-talk in adjacent signal lines. Cross-talk can increase signal line impedance, signal transmission delays and impedance mismatching leading to uncontrolled signal reflections. Thus, cross-talk is a critical problem that requires some form of compensation.

Ground planes are common in first-level packages and printed circuit boards to provide a signal return path and increase signal integrity.

Ground planes in first-level packages not only reduce cross-talk, but also reduce interference from external noise, prevent passage of incoming neutrons and increase heat removal from the chip. As a result, ground planes in first-level packages improve high frequency stability, noise immunity, isolation characteristics and heat dissipation. Furthermore, ground planes in first-level packages provide performance integration and hardware miniaturization with short design time and low cost that surpass ground planes in printed circuit boards.

Ground planes in first-level packages have been provided by the flag of the lead frame that supports the chip. However, the chip is typically mechanically attached to the flag by solder, which can run-out from underneath the chip. In addition, the chip is typically electrically connected to the flag by a lengthy wire bond, which can increase inductance and reduce power efficiency.

Ground planes in first-level packages have also been provided by a metal plate that is incorporated into a plastic encapsulant. However, it is difficult to orient and mechanically assemble the chip, the lead frame and the ground plane before the encapsulant is formed to provide a mechanically stable structure.

In view of the various development stages and limitations in currently available semiconductor chip assemblies, there is a need for a semiconductor chip assembly with a ground plane that is cost-effective, reliable, manufacturable, versatile, provides excellent mechanical and electrical properties, and makes advantageous use the particular connection joint technique best suited for a given application.

SUMMARY OF THE INVENTION

An object of the present invention is to provide a semiconductor chip assembly with a ground plane that provides a low cost, high performance, high reliability package.

Another object of the present invention is to provide a convenient, cost-effective method for manufacturing a semiconductor chip assembly with a ground plane.

Generally speaking, the present invention provides a semiconductor chip assembly that includes a semiconductor chip, a conductive trace and a ground plane. The chip includes a conductive pad. The conductive trace is press-fit into an opening in the ground plane, and the ground plane is electrically connected to the pad.

Generally speaking, the present invention also provides a method of making a semiconductor chip assembly that includes providing a semiconductor chip that includes a conductive pad, then electrically connecting a conductive trace to the pad, and then press-fitting the conductive trace into an opening in a ground plane, thereby electrically connecting the ground plane and the pad.

The chip can include first and second opposing major surfaces, and the first surface of the chip can include the pad. The first surface of the chip can face towards the ground plane, or alternatively, the first surface of the chip can face away from the ground plane. The chip can be proximate to the ground plane, and disposed within a periphery of the ground plane.

The conductive trace can contact the ground plane only at the press-fit, contact only the ground plane at the press-fit, extend into but not through the opening, and be disposed vertically beyond the chip. Furthermore, the conductive trace can include a pillar and a routing line.

The pillar can extend vertically from the routing line, have a conical shape in which its diameter decreases as it extends vertically from the routing line, be press-fit into the opening, contact the ground plane only at the press-fit, contact only the ground plane at the press-fit, extend into but not through the opening, and be disposed vertically beyond the chip.

The routing line can extend laterally from the pillar, be an essentially flat planar lead, be spaced from the ground plane and the press-fit, and be disposed vertically beyond the chip.

The pillar and the routing line can be adjacent to one another, contact one another, adhere to one another, metallurgically bonded to one another, and not integral with one another.

The opening can extend only through the ground plane, and be disposed vertically beyond the chip.

The press-fit can be confined to an interface between the conductive trace and the ground plane, confined to an interface between the pillar and the ground plane, and disposed vertically beyond the chip.

The pillar, the opening and the press-fit can be disposed within a periphery of the chip, and the routing line can extend within and outside the periphery of the chip.

The ground plane can include first and second opposing major surfaces, and the opening can extend between these surfaces. The first and second surfaces of the ground plane can be essentially parallel to the first and second surfaces of the chip. The ground plane can be a single-piece metal plate, and disposed vertically beyond the routing line and the chip.

The assembly can include a connection joint that contacts and electrically connects the routing line and the pad. The connection joint can be electroplated metal, electrolessly plated metal, solder, conductive adhesive or a wire bond.

The assembly can include an adhesive that mechanically attaches the chip to the routing line. The adhesive can also contact and be sandwiched between the routing line and the chip.

The assembly can include an encapsulant that contacts and covers the chip. The encapsulant can also contact and cover the routing line and the connection joint, cover the pillar and be spaced from the ground plane.

The assembly can include an insulative base that contacts the ground plane. The insulative base can also contact the pillar, the routing line and the encapsulant, be sandwiched between the routing line and the ground plane, and be spaced from the connection joint and the chip.

The assembly can include a metal coating that contacts and covers the ground plane, contacts the conductive trace, covers the opening and is exposed. The metal coating can also contact and cover the pillar and be spaced from the routing line.

The assembly can include an electrically conductive path between the ground plane and the pad. The electrically conductive path can include the pillar, the routing line, the connection joint and the press-fit, require the routing line and the connection joint and include the pillar and the press-fit, require the pillar, the routing line and the connection joint and include the press-fit, require the pillar, the routing line, the connection joint and the press-fit, be devoid of a pressure contact other than the press-fit, and be devoid of another ground plane.

The assembly can be a first-level package. The assembly can also be devoid of a printed circuit board and another ground plane.

In accordance with another aspect of the invention, the assembly includes a conductive trace that includes a first pillar, a second pillar and a routing line. The connection joint contacts and electrically connects the routing line and the pad. The first pillar is press-fit into the opening. An electrically conductive path between the ground plane and the pad includes the first pillar, the routing line, the connection joint and the press-fit, and the second pillar is electrically connected to the pad and is not in an electrically conductive path between the ground plane and the pad.

In this aspect of the invention, the first and second pillars can be coplanar with and laterally spaced from one another and have essentially identical thicknesses. The routing line can be spaced from the ground plane and the press-fit. In addition, the first pillar, the opening and the press-fit can be disposed within a periphery of the chip, and the second pillar can be disposed outside the periphery of the chip.

In accordance with another aspect of the invention, the assembly includes first and second conductive traces and first and second connection joints. The first conductive trace includes a first pillar and a first routing line, and the second conductive trace includes a second pillar and a second routing line. The chip includes first and second conductive pads. The first connection joint contacts and electrically connects the first routing line and the first pad, and the second connection joint contacts and electrically connects the second routing line and the second pad. The first pillar is press-fit into the opening. An electrically conductive path between the ground plane and the first pad includes the first pillar, the first routing line, the first connection joint and the press-fit, and the second conductive trace is electrically isolated from the first conductive trace and the ground plane.

In this aspect of the invention, the first and second pillars can be coplanar with and laterally spaced from one another and have essentially identical thicknesses, and the first and second routing lines can be coplanar with and laterally spaced from one another and have essentially identical thicknesses. The first and second routing lines can also be spaced from the ground plane and the press-fit. In addition, the first pillar, the opening and the press-fit can be disposed within a periphery of the chip, and the second pillar can be disposed outside the periphery of the chip.

In accordance with another aspect of the invention, the assembly includes first and second chips, first and second conductive traces and first and second connection joints. The first chip includes a first conductive pad, and the second chip includes a second conductive pad. The first conductive trace includes a first pillar and a first routing line, and the second conductive trace includes a second pillar and a second routing line. The first connection joint contacts and electrically connects the first routing line and the first pad, and the second connection joint contacts and electrically connects the second routing line and the second pad. The ground plane includes first and second openings. The first pillar is press-fit into the first opening at a first press-fit, and the second pillar is press-fit into the second opening at a second press-fit. A first electrically conductive path between the ground plane and the first pad includes the first pillar, the first routing line, the first connection joint and the first press-fit and excludes the second conductive trace and the second connection joint, and a second electrically conductive path between the ground plane and the second pad includes the second pillar, the second routing line, the second connection joint and the second press-fit and excludes the first conductive trace and the first connection joint.

In this aspect of the invention, the first and second chips can be laterally spaced from one another, the first and second pillars can be coplanar with and laterally spaced from one another and have essentially identical thicknesses, and the first and second routing lines can be coplanar with and laterally spaced from one another and have essentially identical thicknesses. The first and second routing lines can also be spaced from the ground plane and the first and second press-fits. In addition, the first pillar, the first opening and the first press-fit can be disposed within a periphery of the first chip, and the second pillar, the second opening and the second press-fit can disposed within a periphery of the second chip.

The method can include providing the chip, providing the conductive trace that includes the pillar and the routing line, forming the connection joint, and then press-fitting the pillar into the opening.

The method can include forming the routing line, then mechanically attaching the chip to the routing line, forming the pillar, and then press-fitting the pillar into the opening.

The method can include forming the routing line by selectively depositing the routing line on a metal base. For instance, the method can include providing a plating mask on the metal base, wherein the plating mask includes an opening that exposes a portion of the metal base, and then electroplating a metal line on the exposed portion of the metal base through the opening in the plating mask, wherein the routing line includes the metal line.

The method can include providing the metal base with first and second opposing surfaces, wherein the routing line is formed on the first surface of the metal base and an etch mask is formed on the second surface of the metal base.

The method can include forming the metal base, the routing line and the etch mask by sequentially providing a metal plate with first and second opposing surfaces, providing a first plating mask on the second surface of the metal plate, wherein the first plating mask includes an opening that exposes a portion of the second surface of the metal plate, simultaneously electroplating a metal layer on the first surface of the metal plate and the etch mask on the exposed portion of the second surface of the metal plate through the opening in the first plating mask, wherein the metal base includes the metal layer and the metal plate, the metal base includes first and second opposing major surfaces, the metal layer provides the first surface of the metal base, and the metal plate provides the second surface of the metal base, removing the first plating mask, providing a second plating mask on the first surface of metal base and a third plating mask on the second surface of the metal base and the etch mask, wherein the second plating mask includes an opening that exposes a portion of the first surface of the metal base, and the third plating mask covers the etch mask, electroplating a metal line on the exposed portion of the first surface of the metal base through the opening in the third plating mask, wherein the routing line includes the metal line, and removing the second and third plating masks.

The method can include etching the metal base to form the pillar. For instance, the method can include etching the metal base such that an unetched portion of the metal base that contacts the routing line forms the pillar. Likewise, the method can include etching the metal base such that an unetched portion of the metal base defined by the etch mask forms the pillar.

The method can include etching the metal base to form the pillar, thereby etching through the metal base, removing a first portion of the metal base that contacts the routing line without removing a second portion of the metal base that contacts the routing line, reducing but not eliminating contact area between the metal base and the routing line, removing most of the metal base, exposing the routing line, electrically isolating the routing line from other routing lines that contact the metal base, and electrically isolating the pad from other conductive pads of the chip.

The method can include mechanically attaching the chip to the routing line using an adhesive. For instance, the method can include depositing an adhesive on and in contact with the metal base, then placing the chip on the adhesive, and then hardening the adhesive. Likewise, the method can include mechanically attaching the chip to the pillar and the routing line, or alternatively, mechanically attaching the chip to the metal base and the routing line and then forming the pillar.

The method can include forming the connection joint by plating the connection joint on the routing line and the pad. For instance, the connection joint can be electroplated or electrolessly plated on the routing line and the pad. Alternatively, the method can include forming the connection joint by depositing a non-solidified material on the routing line and the pad and then hardening the non-solidified material. For instance, solder paste can be deposited on the routing line and the pad and then hardened by reflowing, or conductive adhesive can be deposited on the routing line and the pad and then hardened by curing. Alternatively, the method can include forming the connection joint by wire bonding.

The method can include forming the encapsulant on and in contact with the chip. Likewise, the method can include forming the encapsulant on and in contact with the metal base, the routing line and the connection joint. Likewise, the method can include forming the encapsulant by transfer molding.

The method can include depositing the insulative base over the pillar, the routing line and the encapsulant, then contacting the insulative base and the ground plane, then press-fitting the pillar into the opening, and then hardening the insulative base. The method can also include moving the pillar and the ground plane towards one another such that the insulative base contacts the ground plane and enters the opening before the pillar enters the opening. The method can also include hardening the insulative base by curing the insulative base.

The method can include removing a portion of the insulative base after hardening the insulative base, thereby exposing another pillar that, for instance, is electrically connected to the pad, or alternatively, is electrically connected to another conductive pad of the chip and electrically isolated from the ground plane. The method can include removing the portion of the insulative base by laser ablation, plasma etching or grinding.

The method can include etching the metal base to form the pillar before or after mechanically attaching the chip to the routing line, before or after forming the connection joint, and before or after forming the encapsulant. Likewise, the method can include forming the connection joint during or after mechanically attaching the chip to the routing line, and before or after forming the encapsulant.

The method can include forming the routing line, then mechanically attaching the chip to the routing line, then forming the connection joint and the encapsulant, and then press-fitting the pillar into the opening.

The method can include forming the routing line, then mechanically attaching the chip to the routing line, then forming the connection joint and the encapsulant, and then forming the insulative base and press-fitting the pillar into the opening.

The method can include forming the routing line on the metal base, then mechanically attaching the chip to the metal base and the routing line, then etching the metal base to form the pillar, and then press-fitting the pillar into the opening.

The method can include forming the routing line on the metal base, then etching the metal base to form the pillar, then mechanically attaching the chip to the pillar and the routing line, and then press-fitting the pillar into the opening.

The method can include forming the routing line and the etch mask on the metal base, then mechanically attaching the chip to the metal base, the routing line and the etch mask, then etching the metal base using the etch mask to form the pillar, and then press-fitting the pillar into the opening.

The method can include forming the routing line and the etch mask on the metal base, then etching the metal base using the etch mask to form the pillar, then mechanically attaching the chip to the pillar and the routing line, and then press-fitting the pillar into the opening.

The method can include forming the routing line on the metal base, then mechanically attaching the chip to the metal base and the routing line, then forming the connection joint, then forming the encapsulant, then etching the metal base to form the pillar, and then press-fitting the pillar into the opening.

The method can include forming the routing line on the metal base, then mechanically attaching the chip to the metal base and the routing line, then forming the encapsulant, then etching the metal base to form the pillar, then forming the connection joint, and then press-fitting the pillar into the opening.

The method can include forming the routing line on the metal base, then etching the metal base to form the pillar, then mechanically attaching the chip to the pillar and the routing line, then forming the connection joint, then forming the encapsulant, and then press-fitting the pillar into the opening.

The method can include forming the routing line on the metal base, then etching the metal base to form the pillar, then mechanically attaching the chip to the pillar and the routing line, then forming the encapsulant, then forming the connection joint, and then press-fitting the pillar into the opening.

In accordance with another aspect of the present invention, the method includes forming the routing line on the metal base, then mechanically attaching the chip to the routing line, etching the metal base, wherein a first unetched portion of the metal base forms a first pillar that contacts the routing line, and a second unetched portion of the metal base forms a second pillar that contacts the routing line, and then press-fitting the first pillar into the opening in the ground plane, thereby electrically connecting the ground plane and the pad, wherein the second pillar is electrically connected to the pad and is not in an electrically conductive path between the ground plane and the pad.

In this aspect of the invention, the method can include etching the metal base to remove a first portion of the metal base that contacts the routing line without removing second and third portions of the metal base that contact the routing line, thereby reducing but not eliminating contact area between the metal base and the routing line and exposing the routing line.

In this aspect of the invention, the method can include depositing the insulative base over the first and second pillars and the routing line, then contacting the insulative base and the ground plane, then press-fitting the first pillar into the opening, and then hardening the insulative base.

In this aspect of the invention, the method can include providing the metal base, the ground plane and the chip each with first and second opposing major surfaces, then selectively depositing the routing line on the first surface of the metal base, then mechanically attaching the chip to the metal base and the routing line such that the first surface of the metal base faces in a first direction and towards the chip, the second surface of the metal base faces in a second direction and away from the chip, the metal base and the routing line are disposed vertically beyond the chip in the second direction, and the first and second directions are opposite vertical directions, then forming the encapsulant to extend vertically beyond the chip, the metal base and the routing line in the first direction, then etching the metal base such that the first and second pillars extend vertically from the routing line in the second direction and are disposed vertically beyond the chip and the encapsulant in the second direction, and then press-fitting the first pillar into the opening such that the ground plane is disposed vertically beyond the chip, the encapsulant and the routing line in the second direction.

In accordance with another aspect of the present invention, the method includes forming first and second routing lines on the metal base, then mechanically attaching the chip to the first and second routing lines, wherein the chip includes first and second conductive pads, etching the metal base, wherein a first unetched portion of the metal base forms a first pillar that contacts the first routing line, and a second unetched portion of the metal base forms a second pillar that contacts the second routing line, and then press-fitting the first pillar into the opening in the ground plane, thereby electrically connecting the ground plane and the first pad, wherein the second pillar and the second routing line are electrically connected to the second pad and electrically isolated from the ground plane.

In this aspect of the invention, the method can include forming the first and second routing lines by selectively depositing the first and second routing lines on the metal base. For instance, the method can include providing a plating mask on the metal base, wherein the plating mask includes first and second openings that expose first and second portions of the metal base, electroplating first and second metal lines on the exposed first and second portions of the metal base through the first and second openings in the plating mask, wherein the first and second routing lines include the first and second metal lines, and then removing the plating mask.

In this aspect of the invention, the method can include forming a first connection joint that contacts and electrically connects the first routing line and the first pad before press-fitting the first pillar, and forming a second connection joint that contacts and electrically connects the second routing line and the second pad before press-fitting the first pillar into the opening. The method can also include etching the metal base to remove portions of the metal base that contact the first and second routing lines without removing other portions of the metal base that contact the first and second routing lines, thereby reducing but not eliminating contact area between the metal base and the first and second routing lines, exposing the first and second routing lines and electrically isolating the first and second routing lines from one another. The method can also include etching the metal base after mechanically attaching the chip to the first and second routing lines and forming the first and second connection joints, thereby electrically isolating the first and second pads from one another.

In this aspect of the invention, the method can include depositing the insulative base over the first and second pillars and the first and second routing lines, then contacting the insulative base and the ground plane, then press-fitting the first pillar into the opening, and then hardening the insulative base.

In this aspect of the invention, the method can include providing the metal base, the ground plane and the chip each with first and second opposing major surfaces, then selectively depositing the first and second routing lines on the first surface of the metal base, thereby electrically connecting the first and second routing lines, then mechanically attaching the chip to the metal base and the first and second routing lines such that the first surface of the metal base faces in a first direction and towards the chip, the second surface of the metal base faces in a second direction and away from the chip, the metal base and the first and second routing lines are disposed vertically beyond the chip in the second direction, and the first and second directions are opposite vertical directions, then forming the encapsulant to extend vertically beyond the chip, the metal base and the first and second routing lines in the first direction, then etching the metal base such that the first pillar extends vertically from the first routing line in the second direction, the second pillar extends vertically from the second routing line in the second direction, and the first and second pillars are disposed vertically beyond the chip and the encapsulant in the second direction, and then press-fitting the first pillar into the opening such that the ground plane is disposed vertically beyond the chip, the encapsulant and the first and second routing lines in the second direction.

In accordance with another aspect of the present invention, the method includes forming first and second routing lines on the metal base, then mechanically attaching a first chip to the first routing line, wherein the first chip includes a first conductive pad, mechanically attaching a second chip to the second routing line, wherein the second chip includes a second conductive pad, etching the metal base, wherein a first unetched portion of the metal base forms a first pillar that contacts the first routing line, and a second unetched portion of the metal base forms a second pillar that contacts the second routing line, and then press-fitting the first pillar into a first opening in the ground plane at a first press-fit and the second pillar into a second opening in the ground plane at a second press-fit, thereby electrically connecting the ground plane to the first and second pads, wherein a first electrically conductive path between the ground plane and the first pad includes the first pillar, the first routing line and the first press-fit and excludes the second pillar and the second routing line, and a second electrically conductive path between the ground plane and the second pad includes the second pillar, the second routing line and the second press-fit and excludes the first pillar and the first routing line.

In this aspect of the invention, the method can include forming the first and second routing lines by selectively depositing the first and second routing lines on the metal base. For instance, the method can include providing a plating mask on the metal base, wherein the plating mask includes first and second openings that expose first and second portions of the metal base, electroplating the first and second metal lines on the exposed first and second portions of the metal base through the first and second openings in the plating mask, wherein the first and second routing lines include the first and second metal lines, and then removing the plating mask.

In this aspect of the invention, the method can include forming a first connection joint that contacts and electrically connects the first routing line and the first pad before press-fitting the first pillar into the first opening, and forming a second connection joint that contacts and electrically connects the second routing line and the second pad before press-fitting the second pillar into the second opening. The method can also include etching the metal base to remove portions of the metal base that contact the first and second routing lines without removing other portions of the metal base that contact the first and second routing lines, thereby reducing but not eliminating contact area between the metal base and the first and second routing lines, exposing the first and second routing lines and electrically isolating the first and second routing lines from one another. The method can also include etching the metal base after mechanically attaching the first and second chips to the first and second routing lines and forming the first and second connection joints, thereby electrically isolating the first and second pads from one another.

In this aspect of the invention, the method can include forming the encapsulant to contact and cover the first and second chips after mechanically attaching the first and second chips to the first and second routing lines and before press-fitting the first and second pillars into the first and second openings. The method can also include forming the encapsulant before forming the first and second pillars. The method can also include depositing the insulative base over the first and second pillars and the first and second routing lines, then contacting the insulative base and the ground plane, then press-fitting the first and second pillars into the first and second openings, and then hardening the insulative base.

In this aspect of the invention, the method can include providing the metal base, the ground plane and the first and second chips each with first and second opposing major surfaces, then selectively depositing the first and second routing lines on the first surface of the metal base, thereby electrically connecting the first and second routing lines, then mechanically attaching the first and second chips to the metal base and the first and second routing lines such that the first surface of the metal base faces in a first direction and towards the first and second chips, the second surface of the metal base faces in a second direction and away from the first and second chips, the metal base and the first and second routing lines are disposed vertically beyond the first and second chips in the second direction, and the first and second directions are opposite vertical directions, then forming the encapsulant to extend vertically beyond the first and second chips, the metal base and the first and second routing lines in the first direction, then etching the metal base such that the first pillar extends vertically from the first routing line in the second direction, the second pillar extends vertically from the second routing line in the second direction, and the first and second pillars are disposed vertically beyond the first and second chips and the encapsulant in the second direction, and then press-fitting the first and second pillars into the first and second openings such that the ground plane is disposed vertically beyond the first and second chips, the encapsulant and the first and second routing lines in the second direction.

An advantage of the present invention is that the semiconductor chip assembly can be manufactured conveniently and cost-effectively. Another advantage is that the encapsulant can be provided before the metal base is etched, thereby enhancing mechanical support and protection for the routing line after the pillar is formed. Another advantage is that the pillar can be formed using etching (i.e., subtractively) rather than by electroplating or electroless plating (i.e., additively) which improves uniformity and reduces manufacturing time and cost. Another advantage is that the assembly can include a connection joint made from a wide variety of materials and processes, thereby making advantageous use of mature connection joint technologies in a unique and improved manufacturing approach. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A–28A are cross-sectional views showing a method of making a semiconductor chip assembly in accordance with a first embodiment of the present invention;

FIGS. 1B–28B are cross-sectional views corresponding to FIGS. 1A–28A, respectively;

FIGS. 1C–28C are top plan views corresponding to FIGS. 1A–28A and 1B–28B, respectively;

FIGS. 1D–28D are bottom plan views corresponding to FIGS. 1A–28A and 1B–28B, respectively;

DETAILED DESCRIPTION OF THE PREFERRED EMBODIMENTS

Figure 1A:
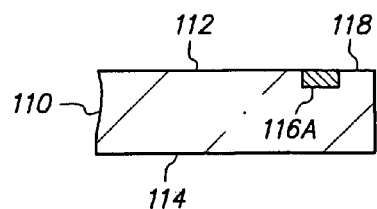
Figure 1B:
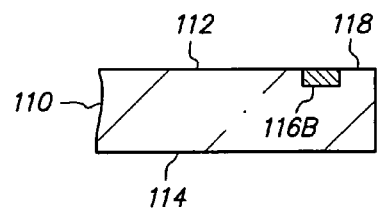
Figure 1C:
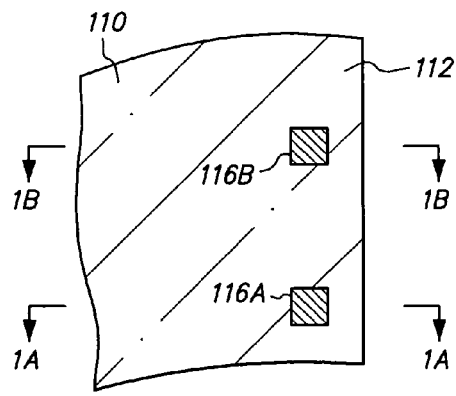
Figure 1D:
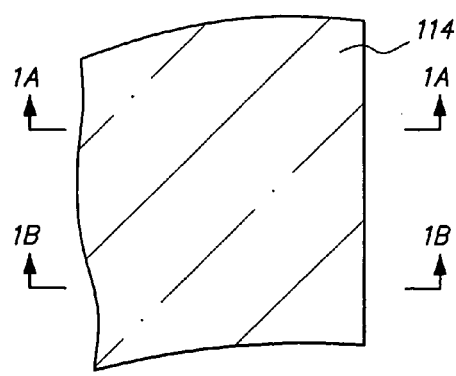
Figure 3A:
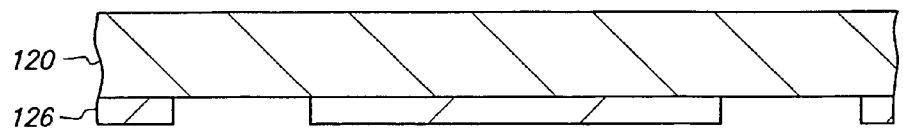
Figure 3B:
Figure 3C:
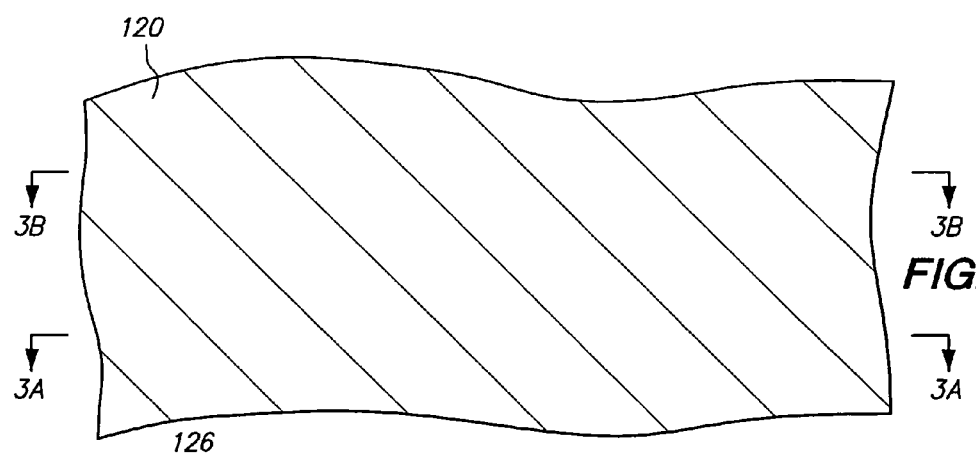
Figure 3D:
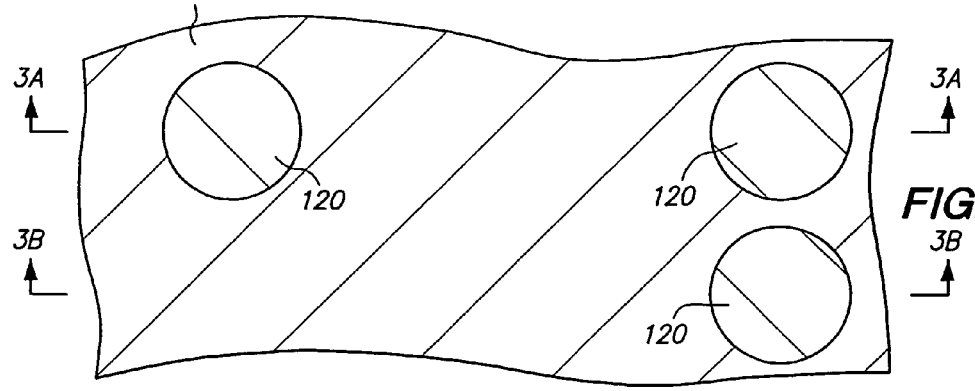
Figure 4A:
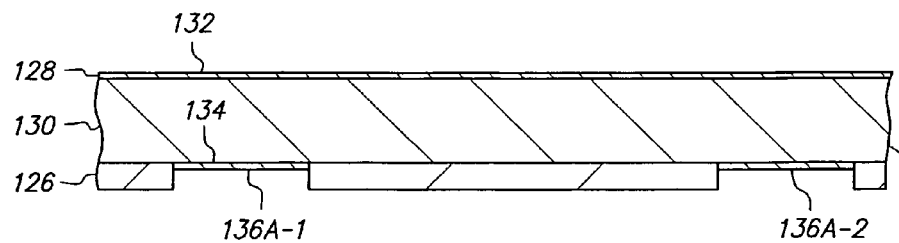
Figure 4B:
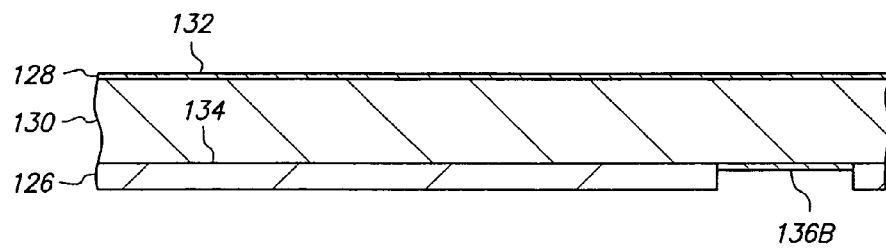
Figure 4C:
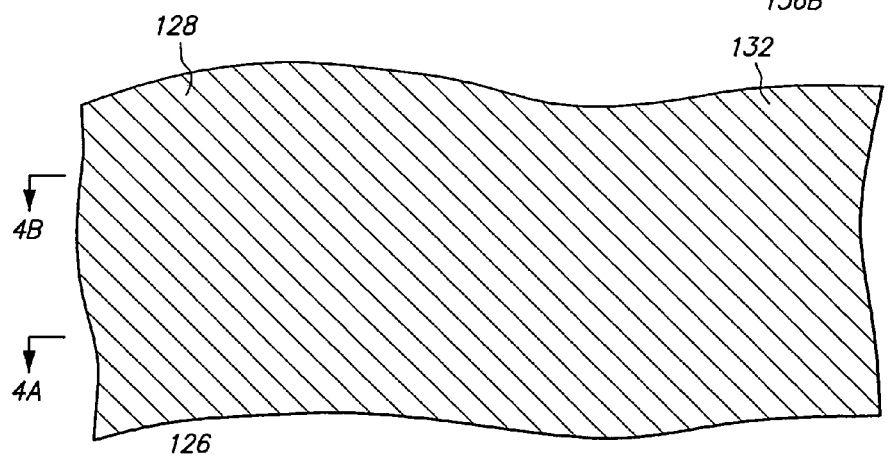
Figure 4D:
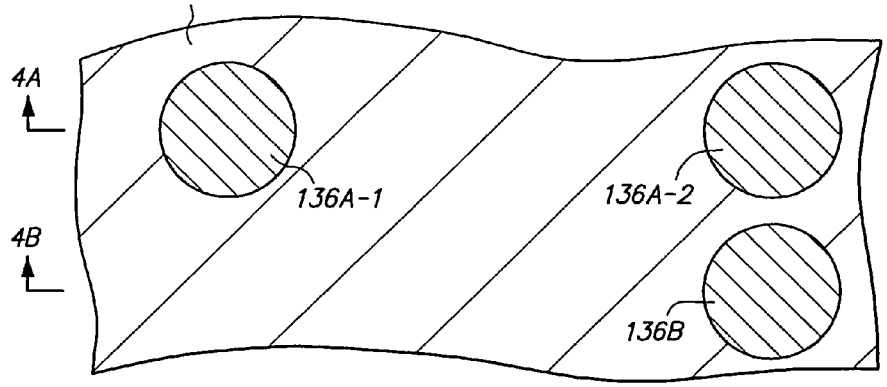
Figure 5A:
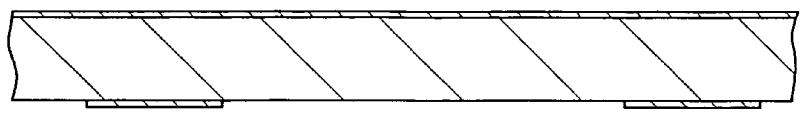
Figure 5B:
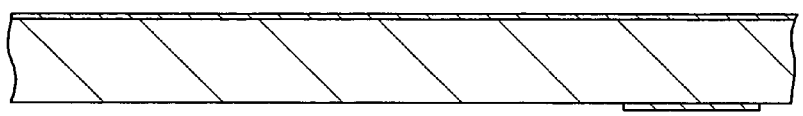
Figure 5C:
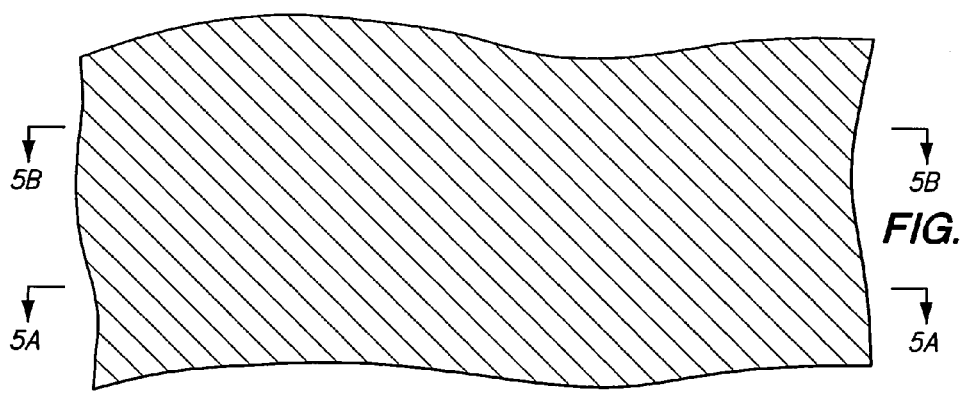
Figure 5D:
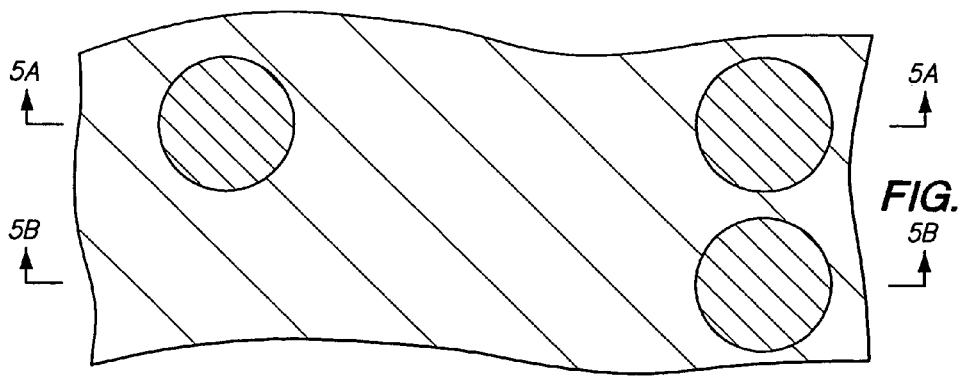
Figure 6A:
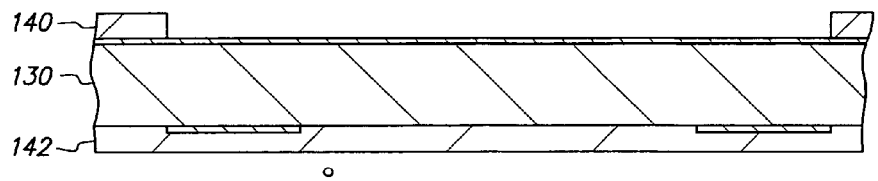
Figure 6B:
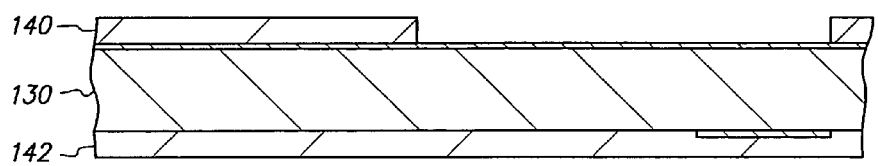
Figure 6C:
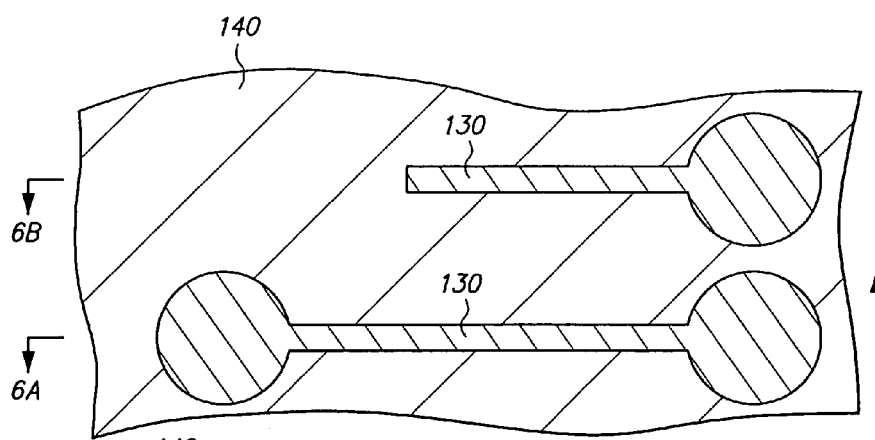
Figure 6D:
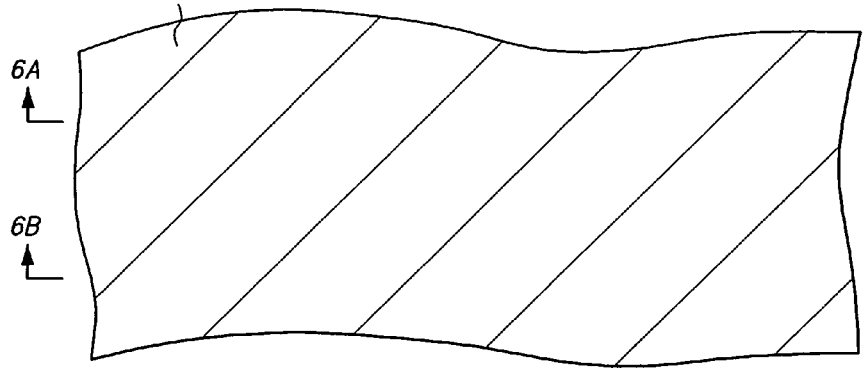
Figure 7A:
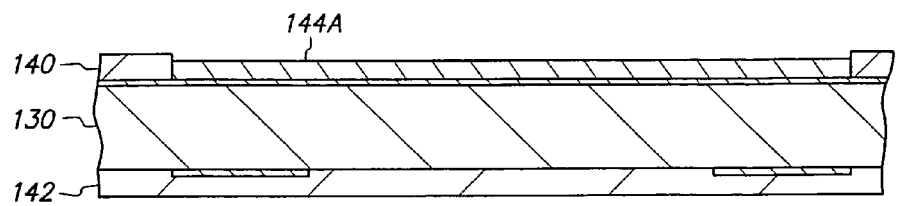
Figure 7B:
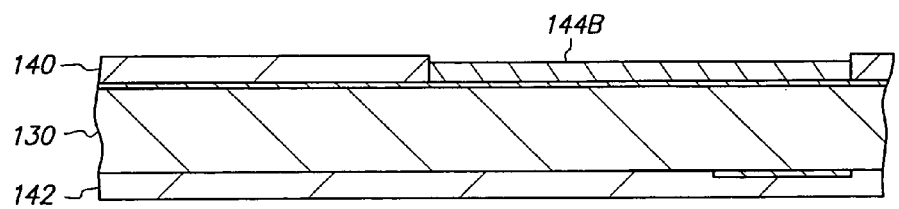
Figure 7C:
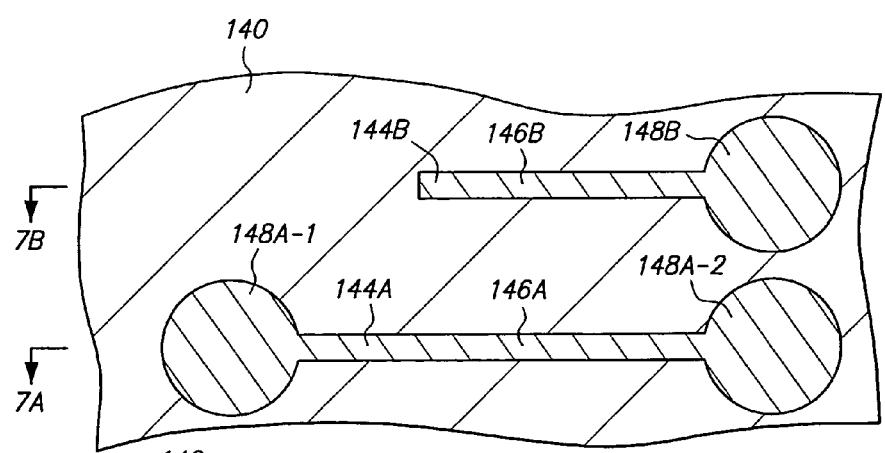
Figure 7D:
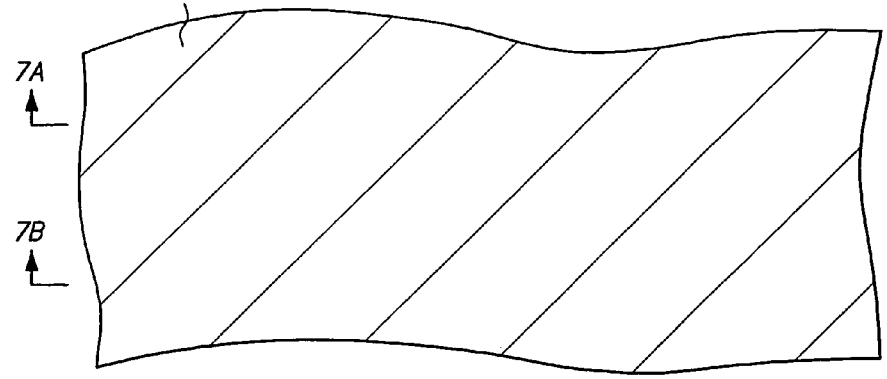
Figure 8A:
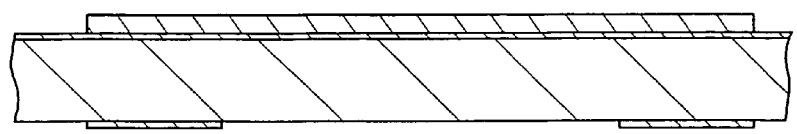
Figure 8B:
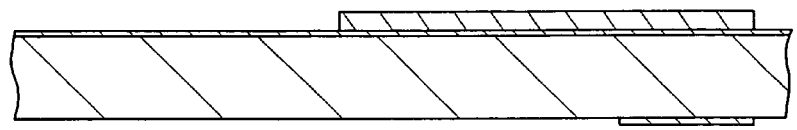
Figure 8C:
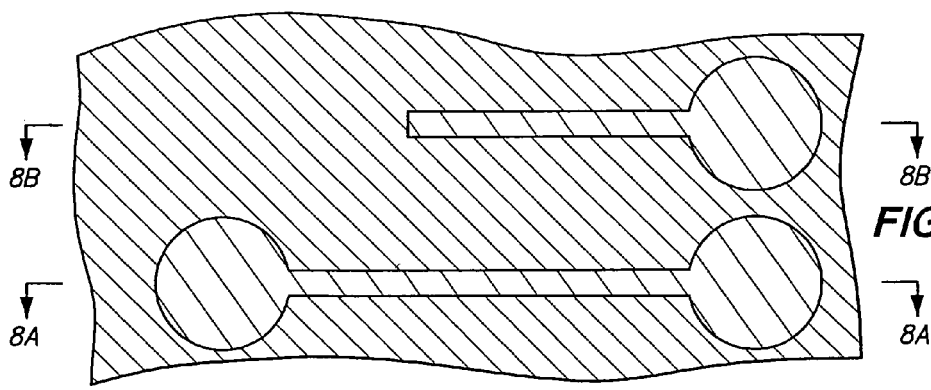
Figure 8D:
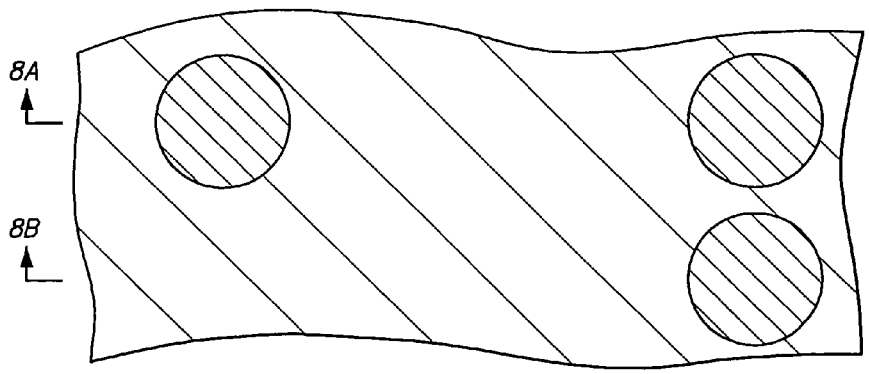
Figure 9A:
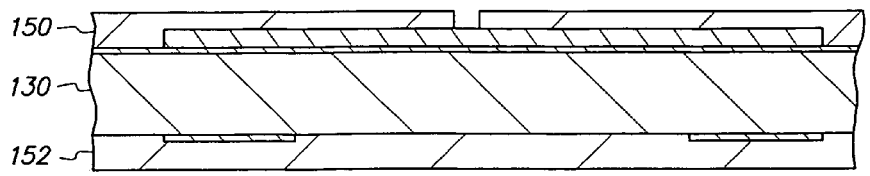
Figure 9B:
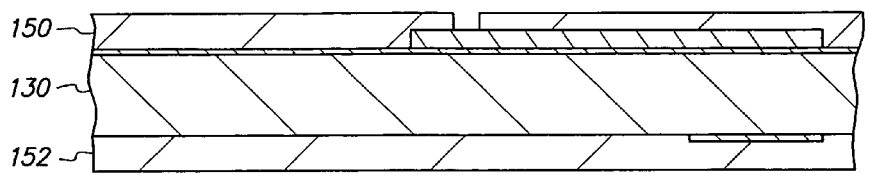
Figure 9C:
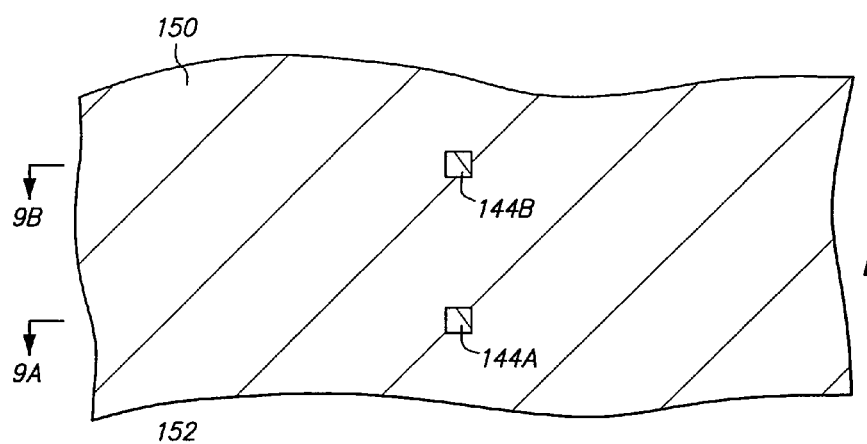
Figure 9D:
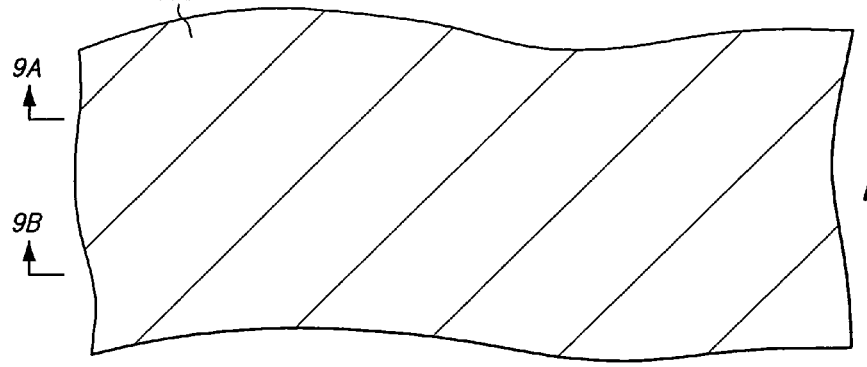
Figure 10A:
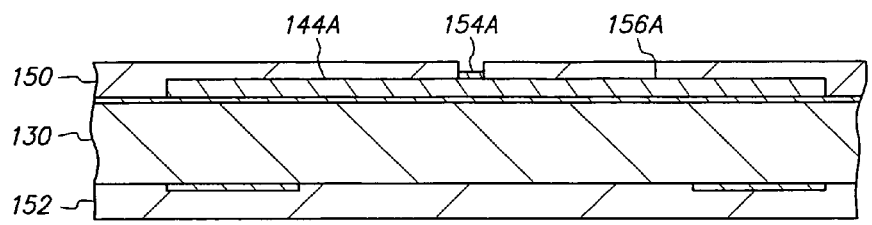
Figure 10B:
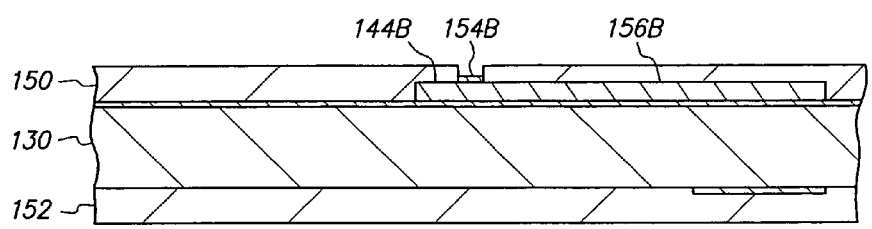
Figure 10C:
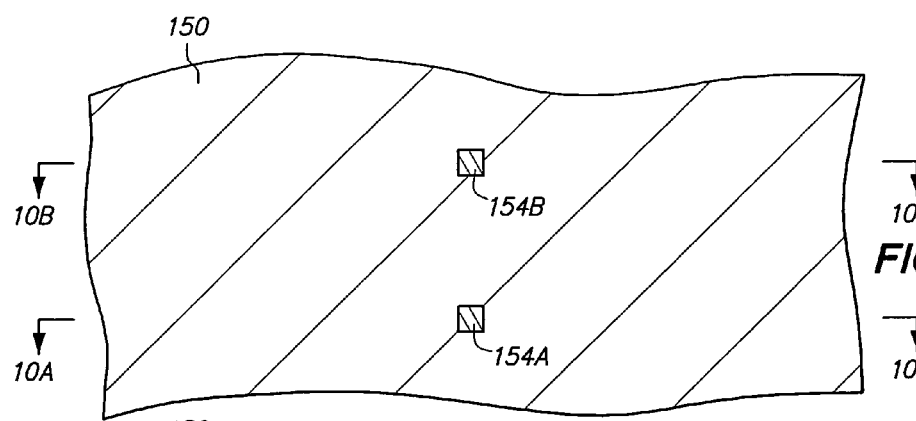
Figure 10D:
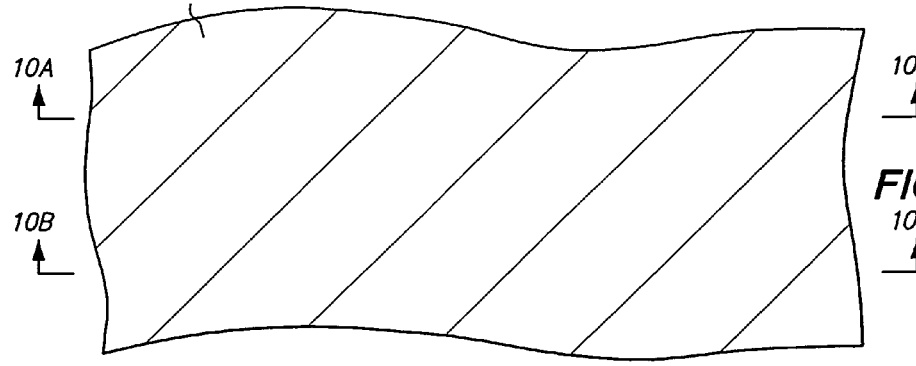
Figure 11A:
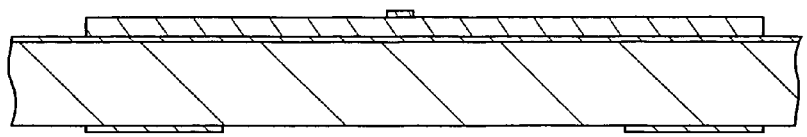
Figure 11B:
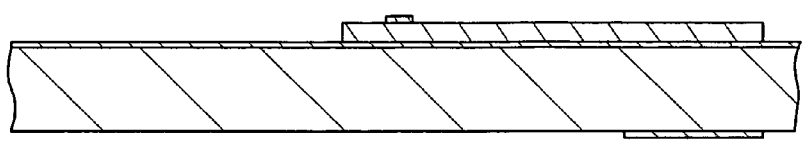
Figure 11C:
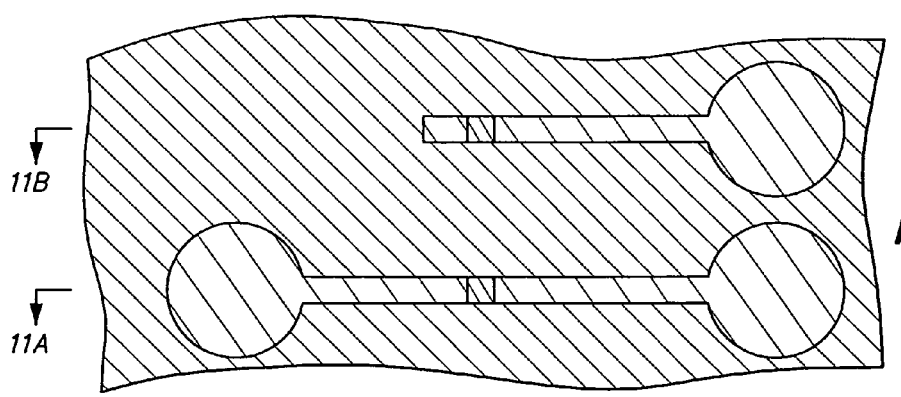
Figure 11D:
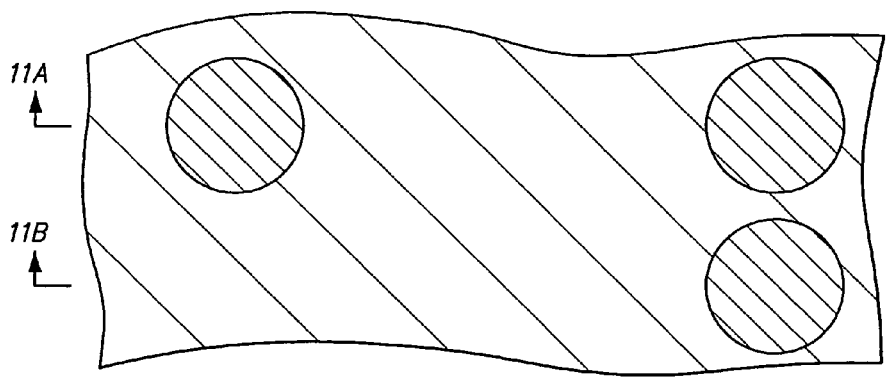
Figure 12A:
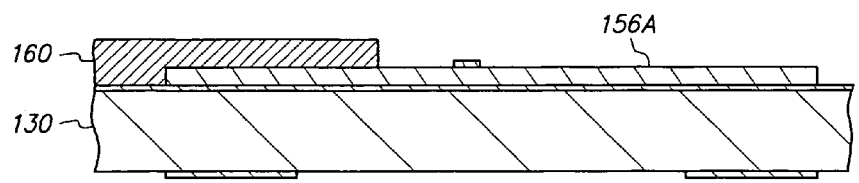
Figure 12B:
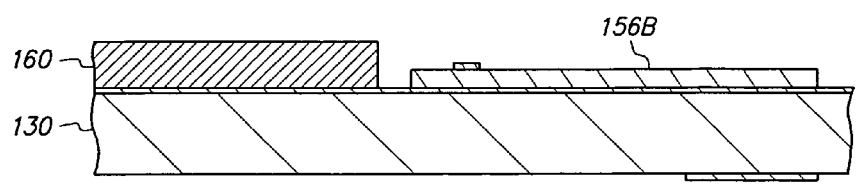
Figure 12C:
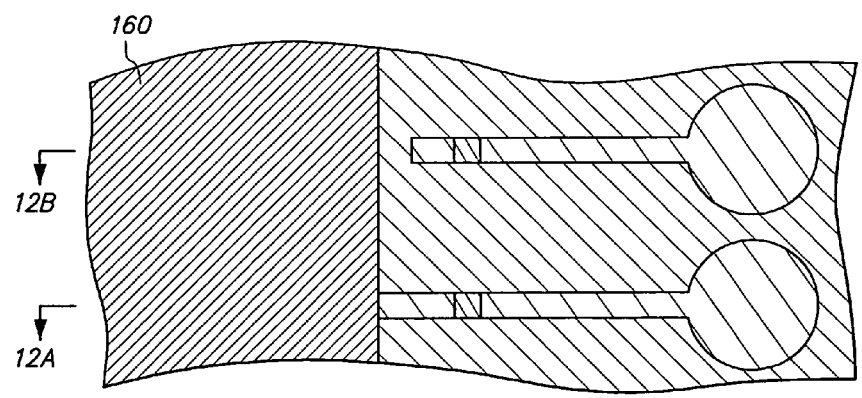
Figure 12D:
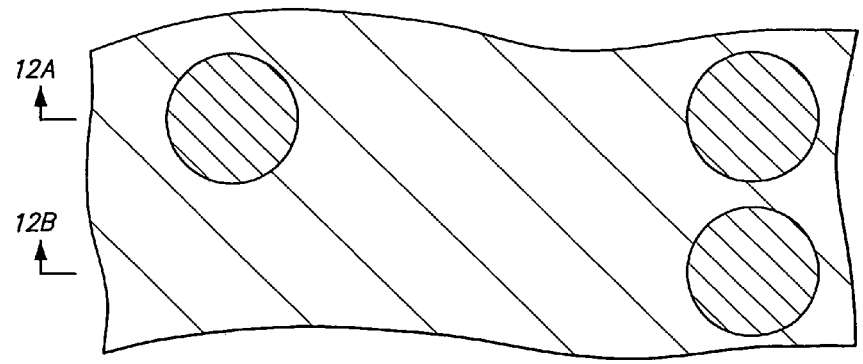
Figure 13A:
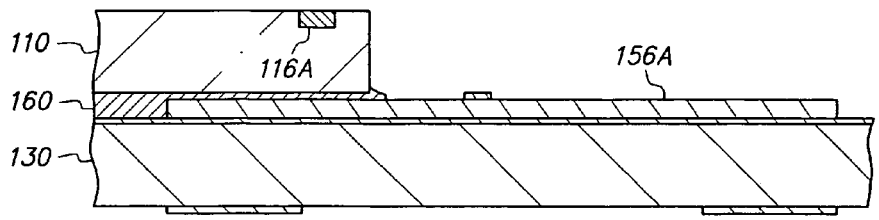
Figure 13B:
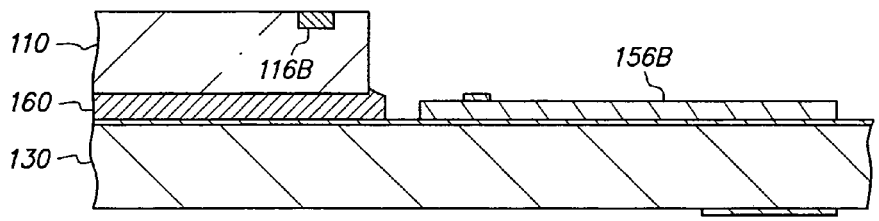
Figure 13C:
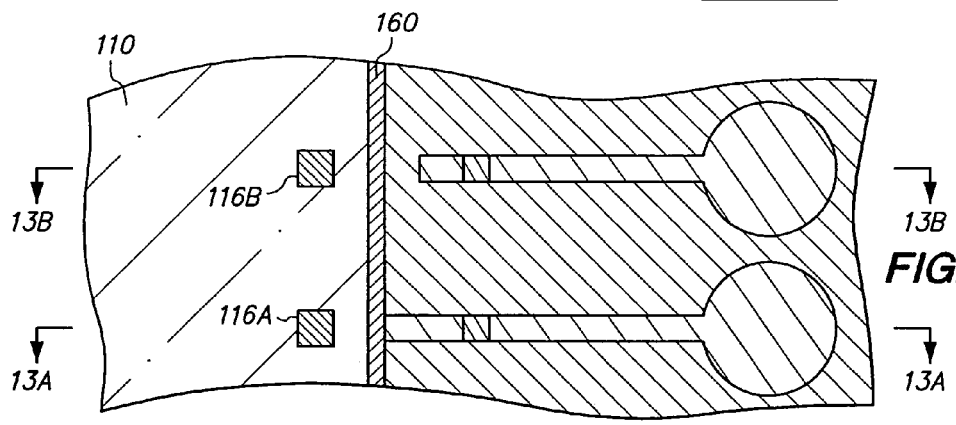
Figure 13D:
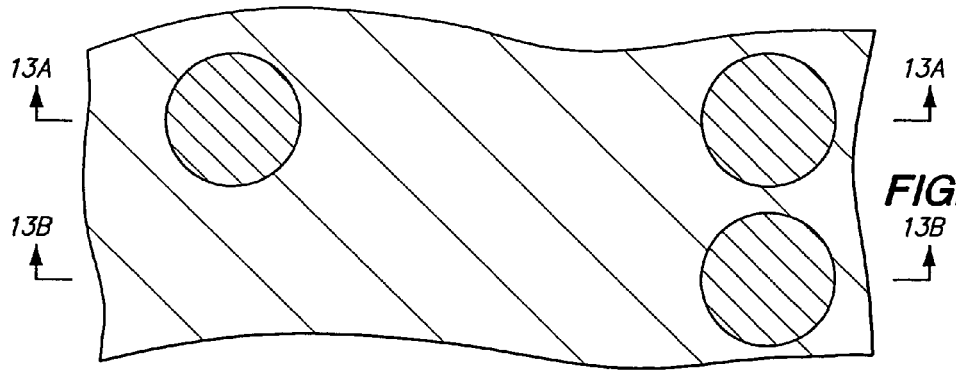
Figure 14A:
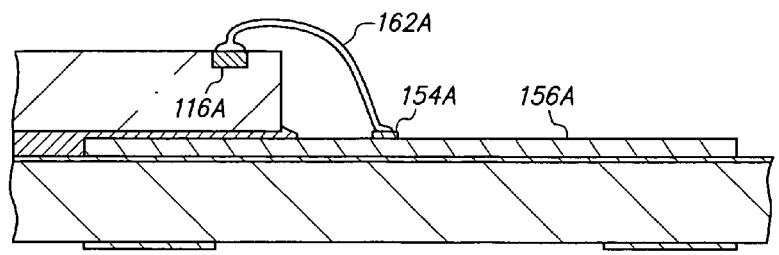
Figure 14B:
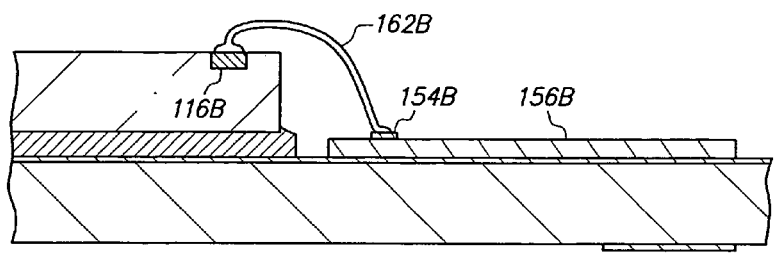
Figure 14C:
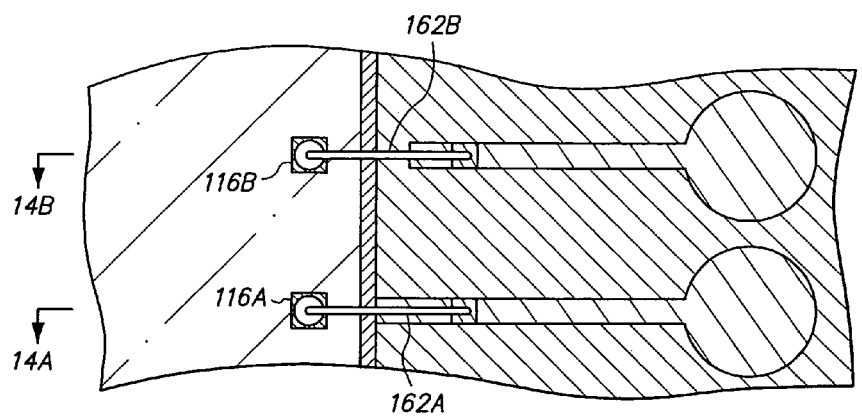
Figure 14D:
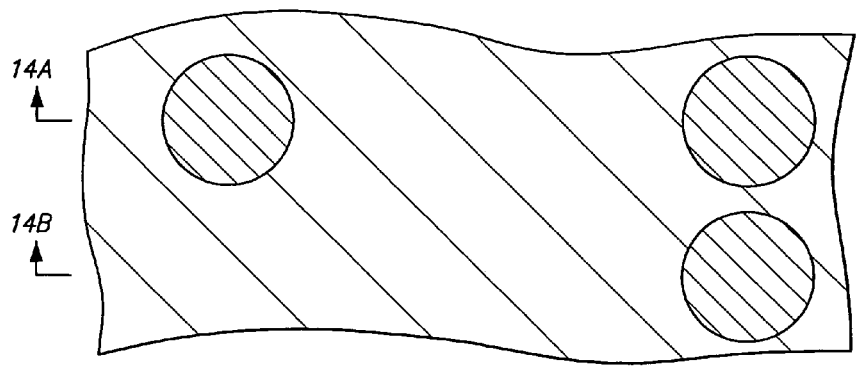
Figure 15A:
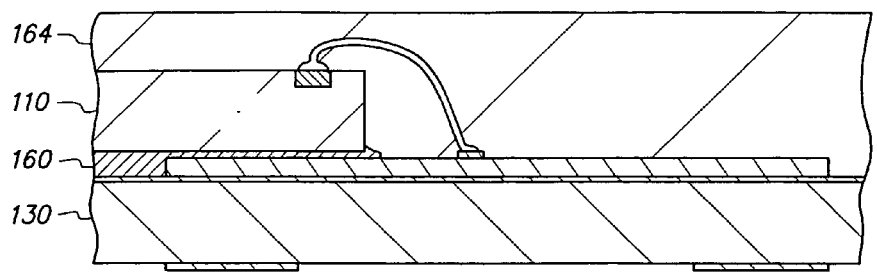
Figure 15B:
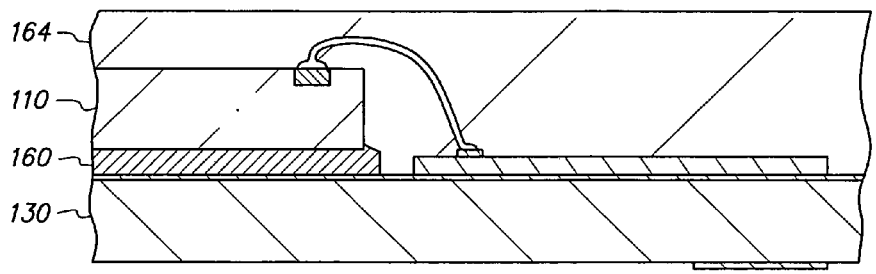
Figure 15C:
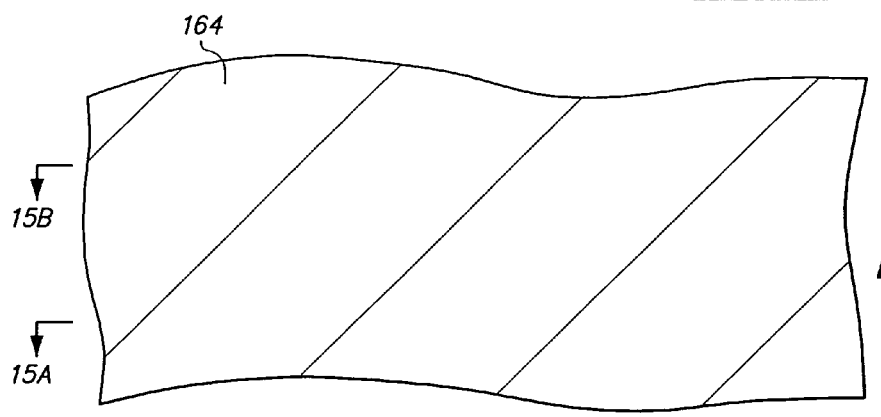
Figure 15D:
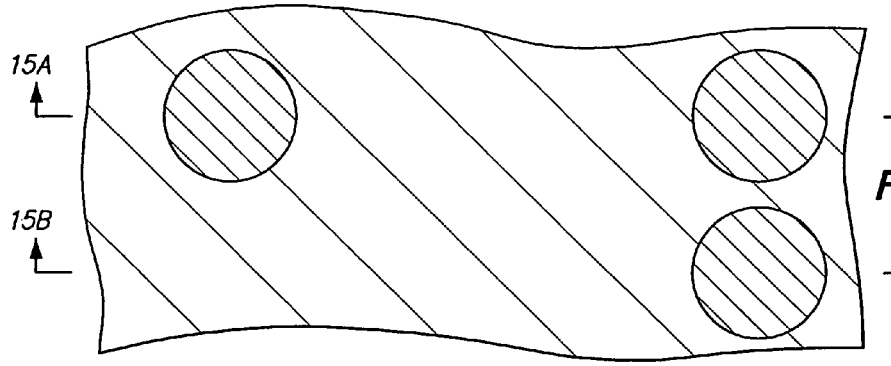
Figure 18A:
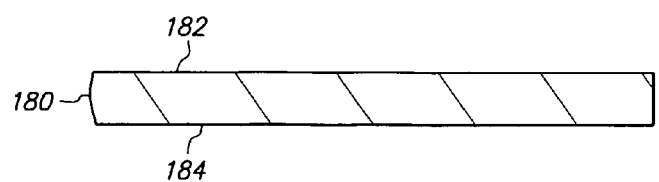
Figure 18B:
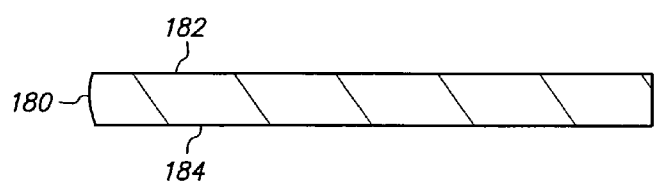
Figure 18C:
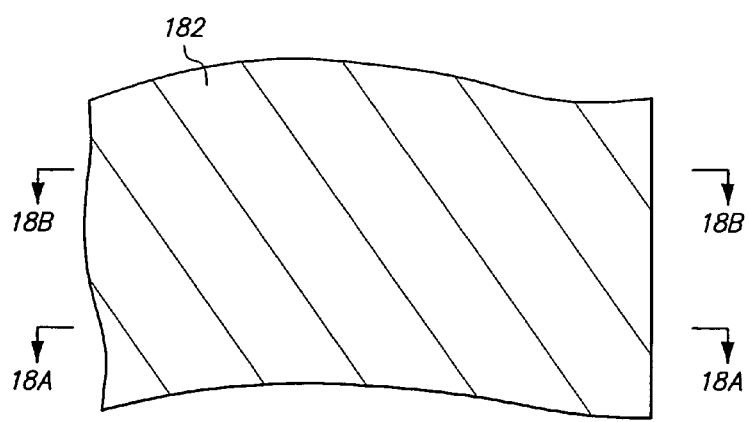
Figure 18D:
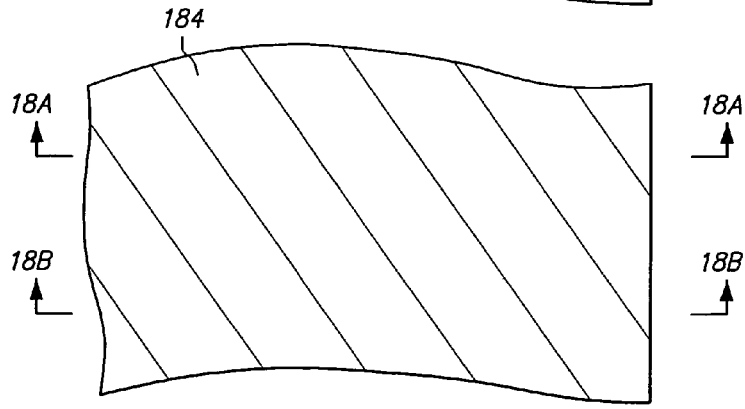
Figure 19A:
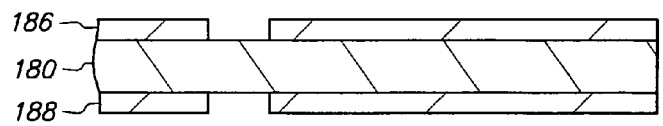
Figure 19B:
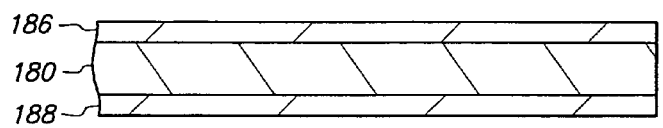
Figure 19C:
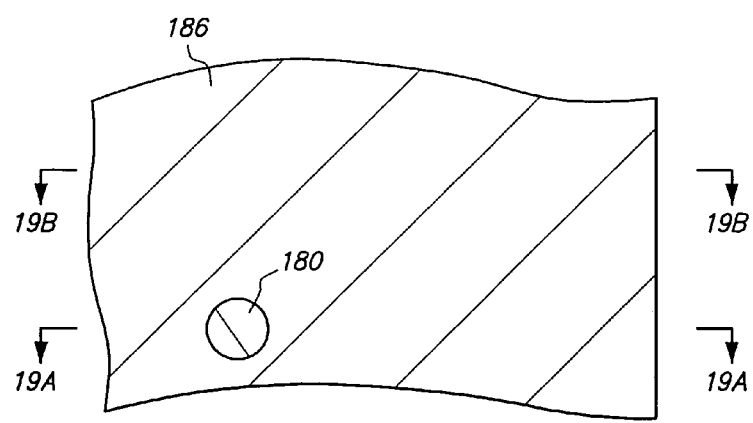
Figure 19D:
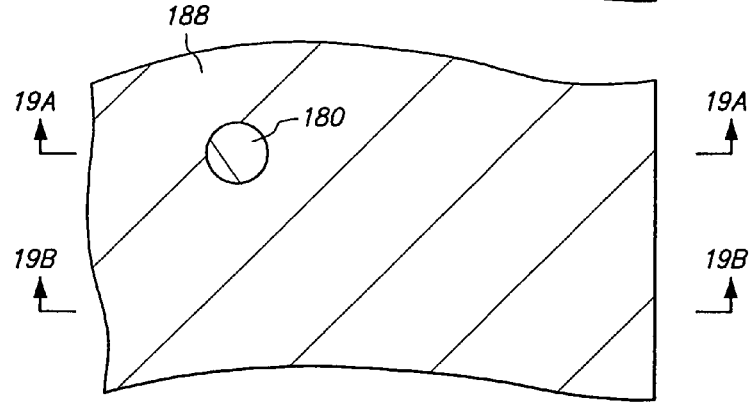
Figure 20A:
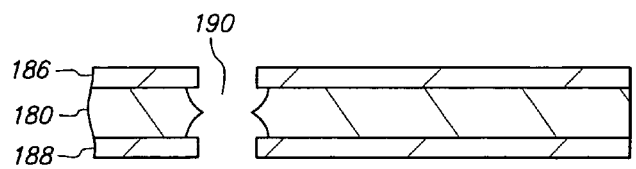
Figure 20B:
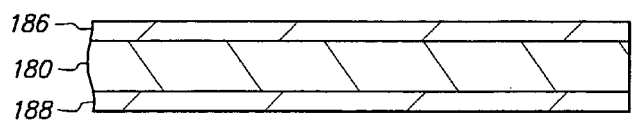
Figure 20C:
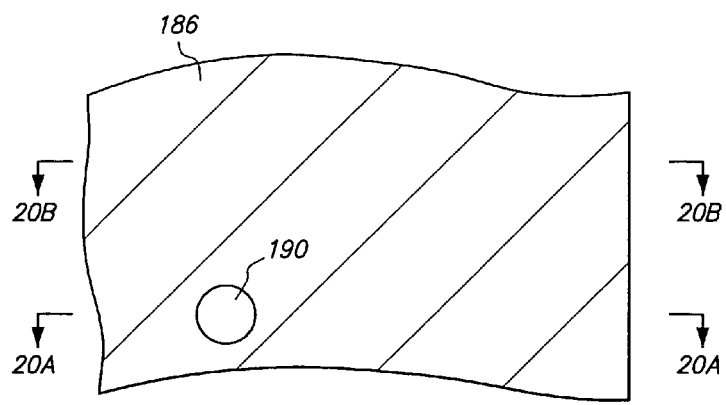
Figure 20D:
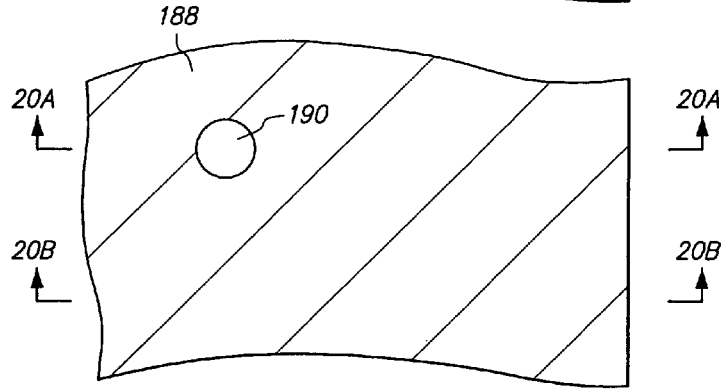
Figure 21A:
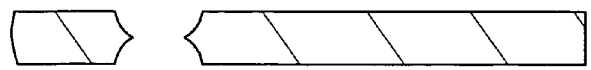
Figure 21B:
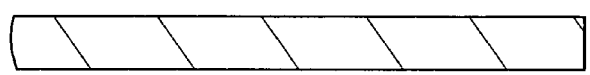
Figure 21C:
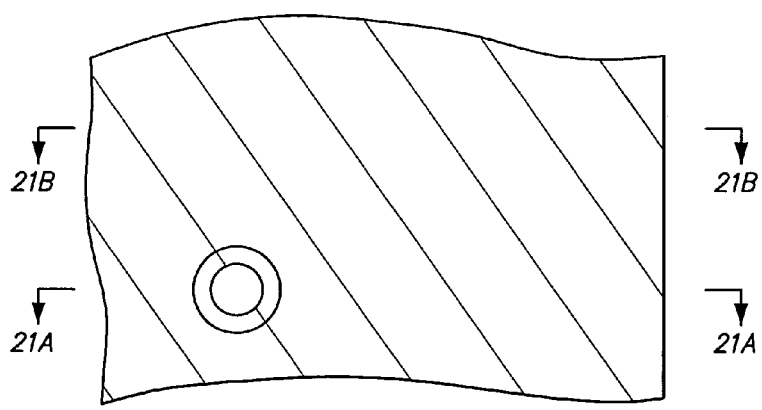
Figure 21D:
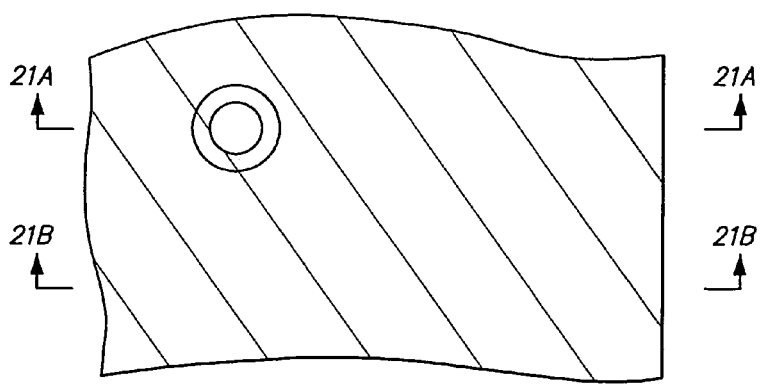
Figure 23A:
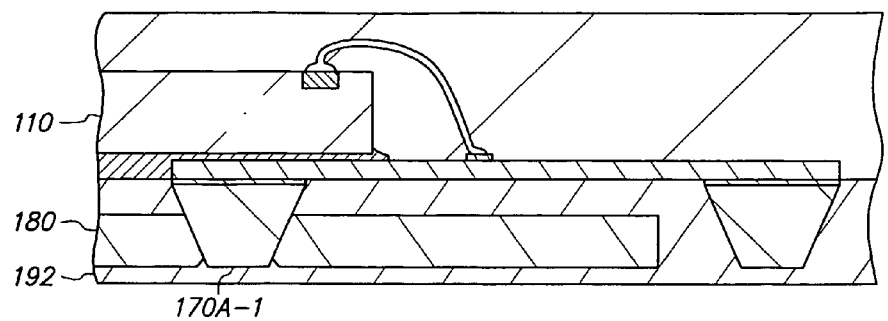
Figure 23B:
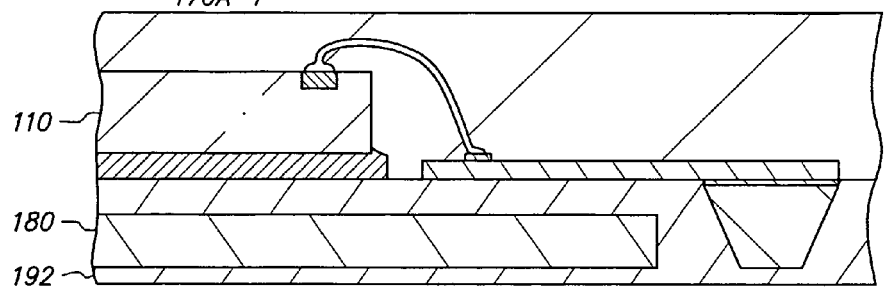
Figure 23C:
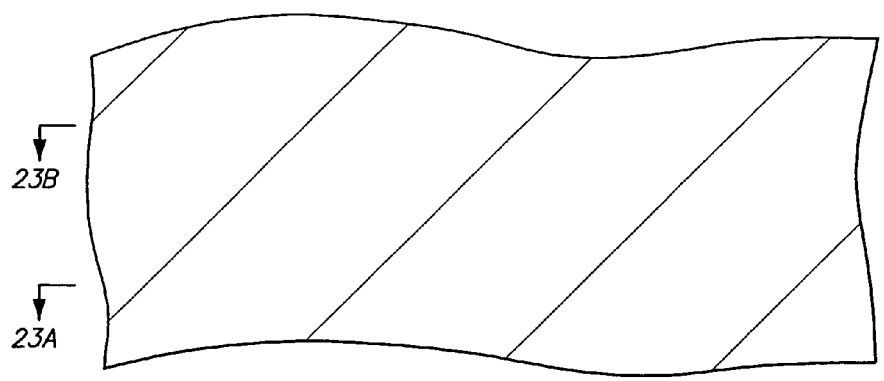
Figure 23D:
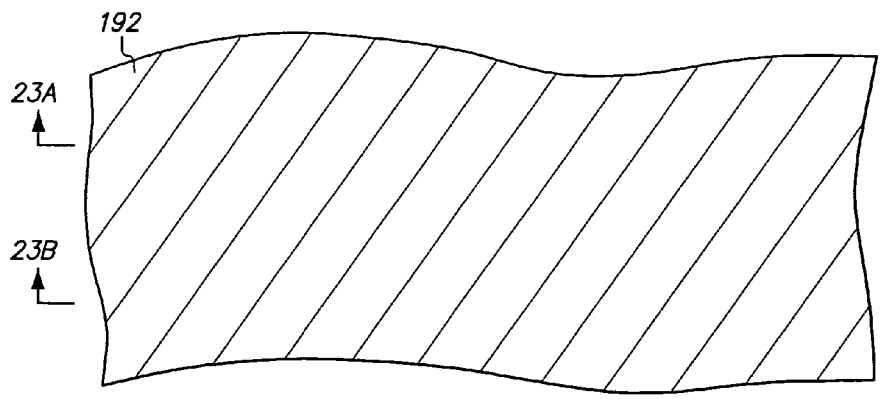
Figures 24A, 24B, 24C, 24D:
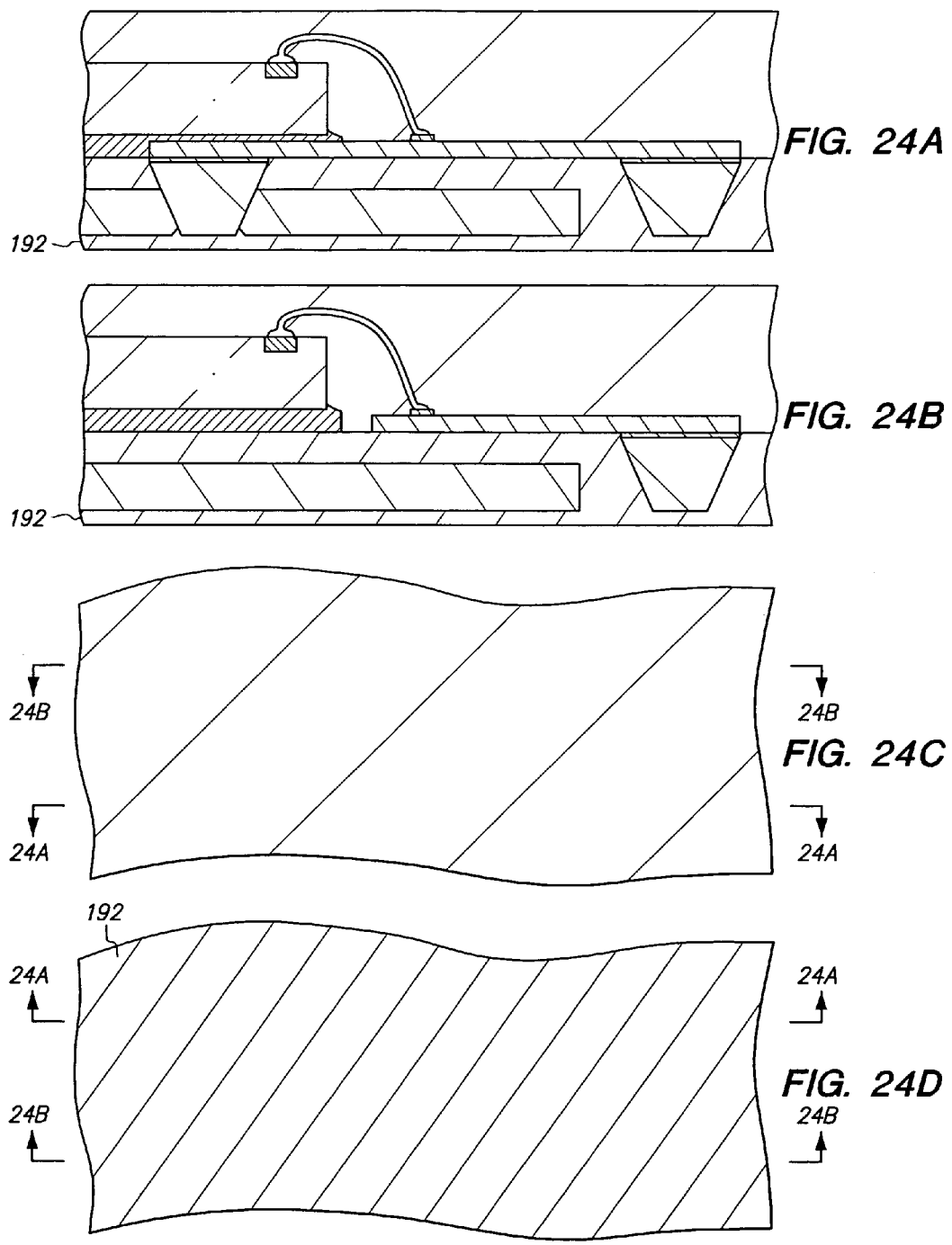
Figure 26A:
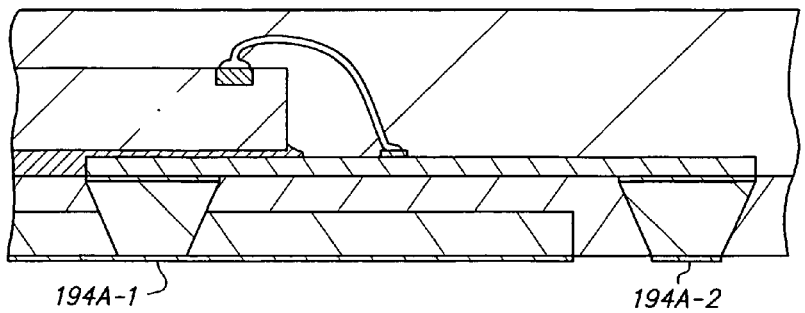
Figure 26B:
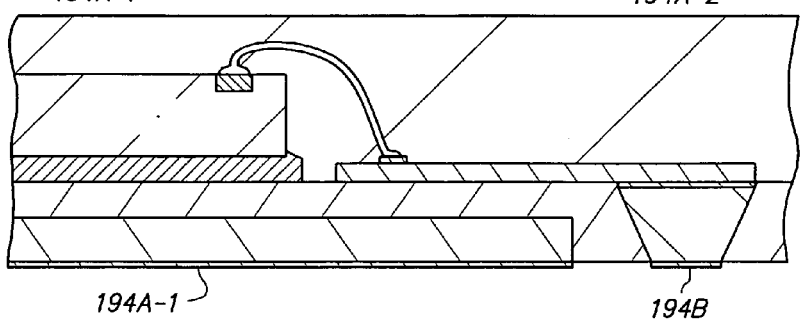
Figure 26C:
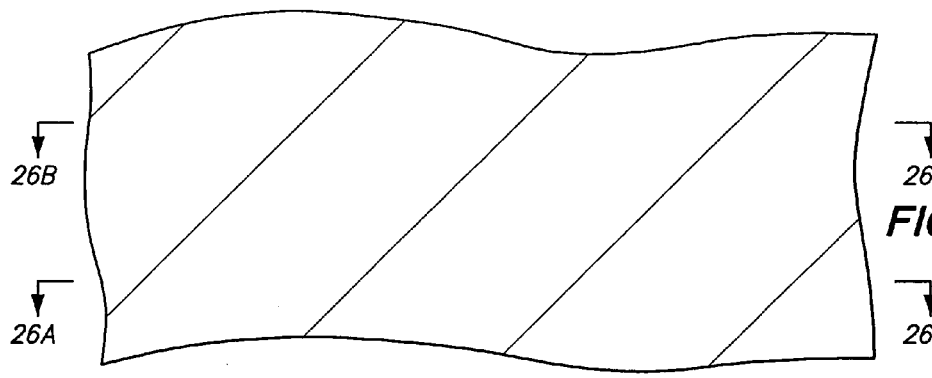
Figure 26D:
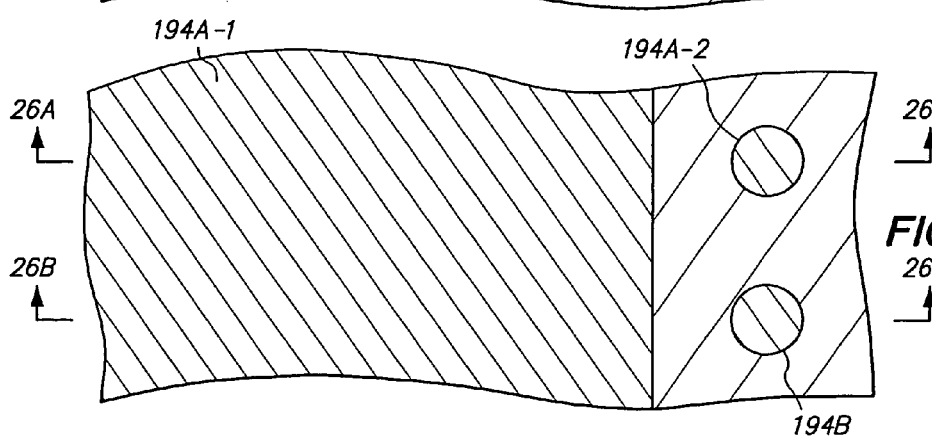
Figure 27A:
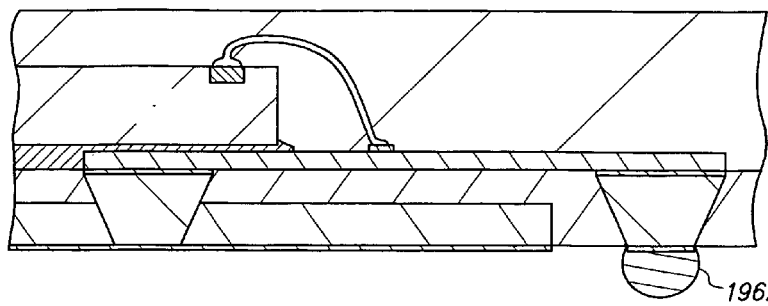
Figure 27B:
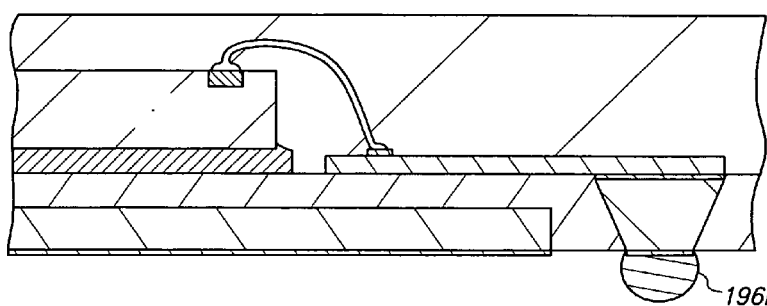
Figure 27C:
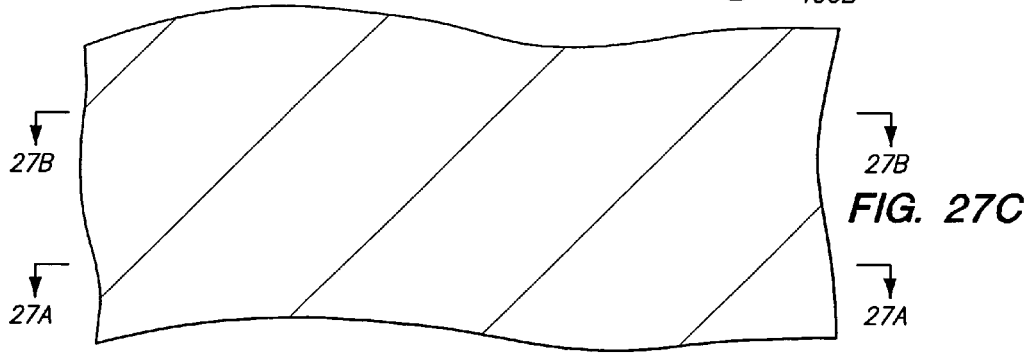
Figure 27D:
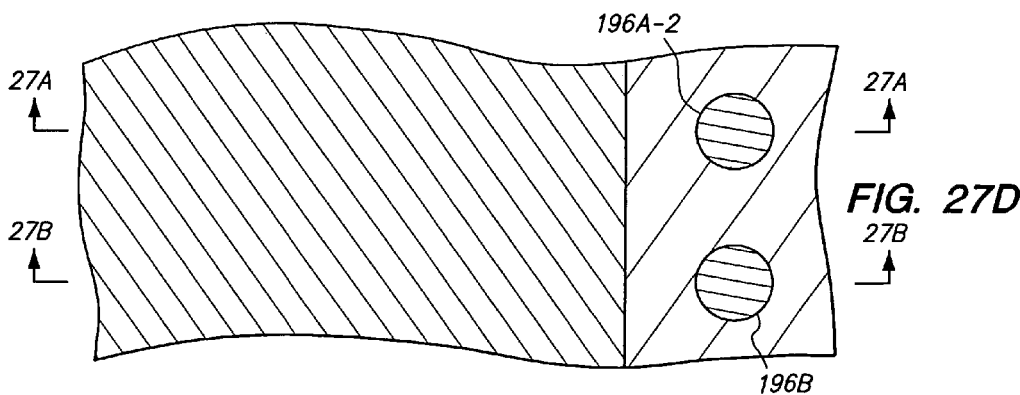
Figure 28A:
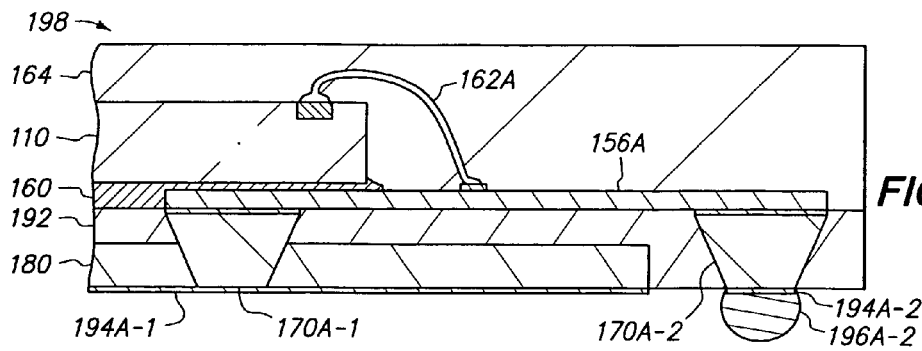
Figure 28B:
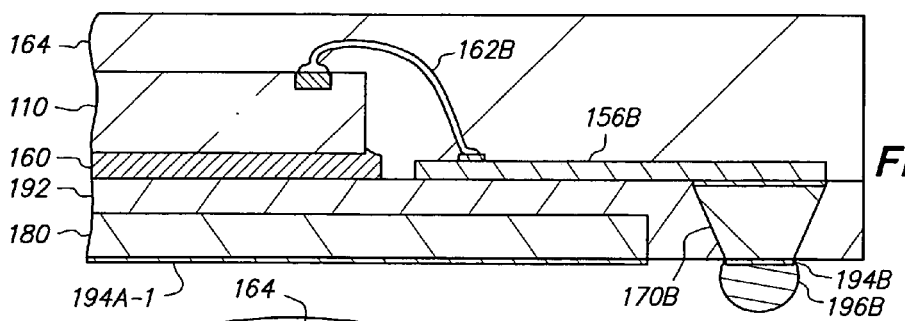
Figure 28C:
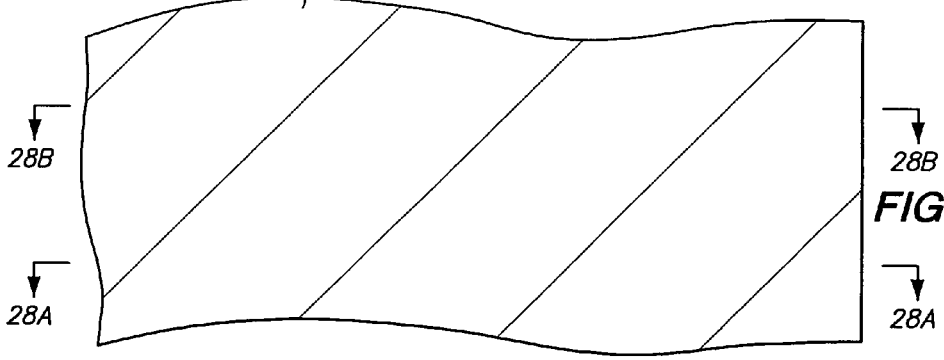
Figure 28D:
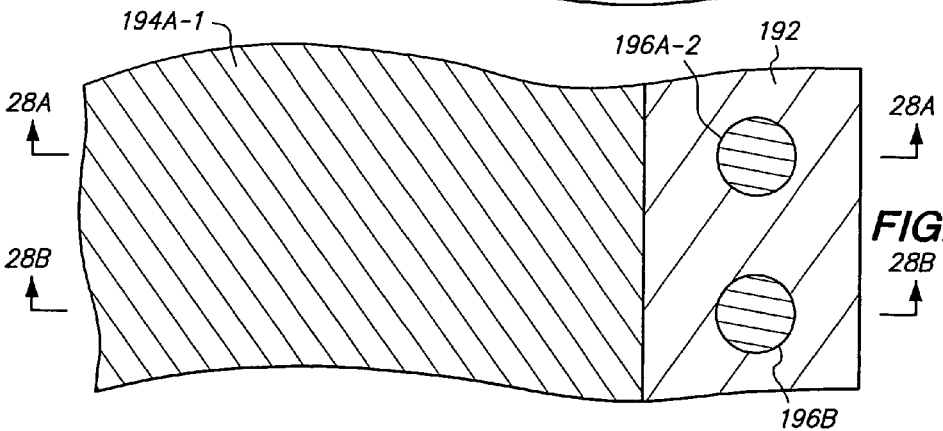
Figure 29A:
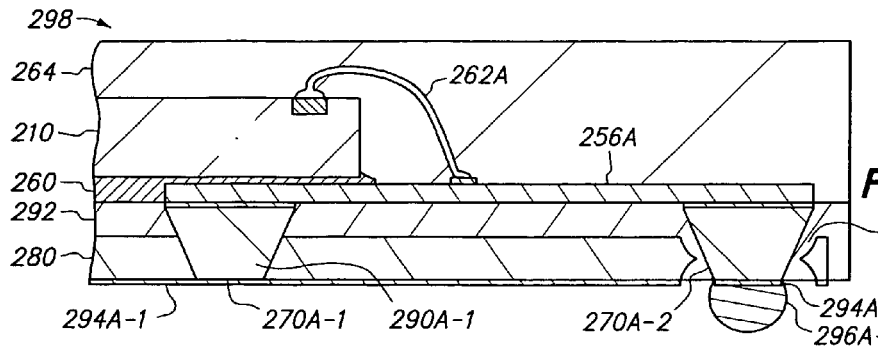
FIGS. 29A, 29B, 29C and 29D are cross-sectional, cross-sectional, top and bottom views, respectively, of a semiconductor chip assembly in accordance with a second embodiment of the present invention.
Figure 29B:
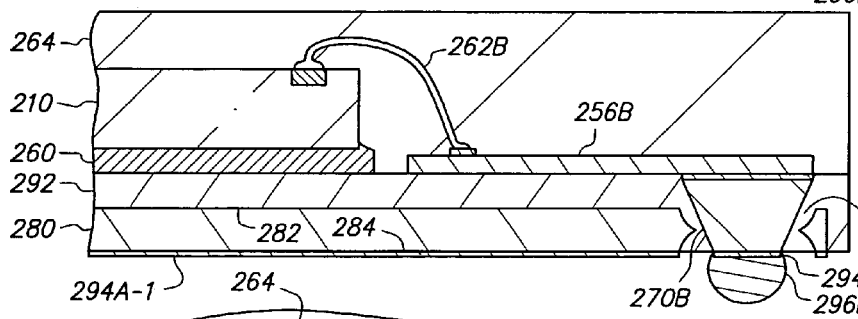
Figure 29C:
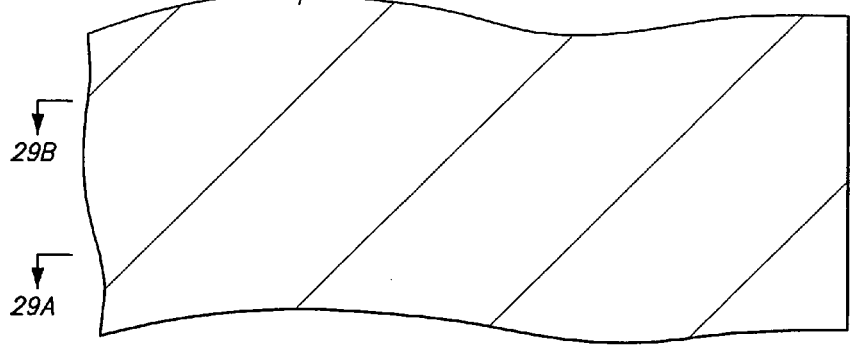
Figure 29D:
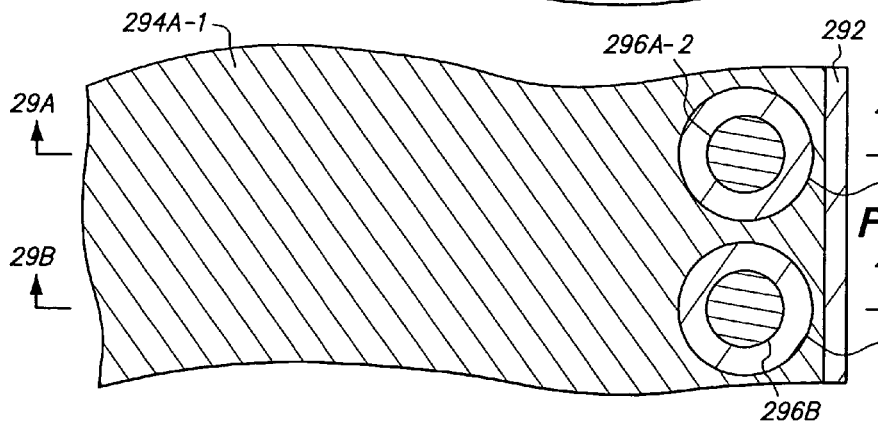
Figure 30A:
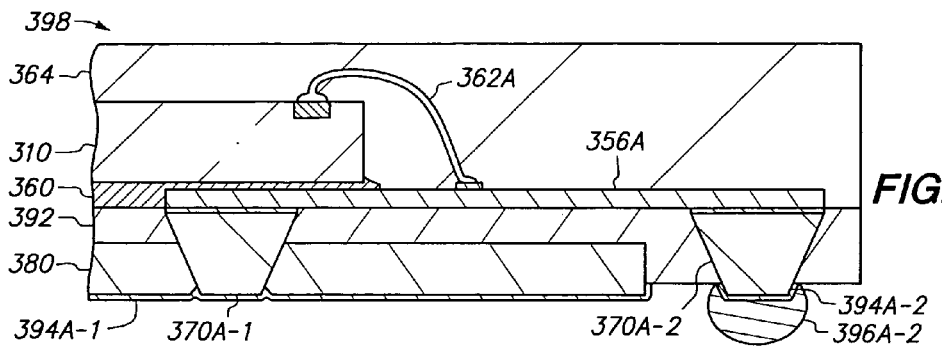
FIGS. 30A, 30B, 30C and 30D are cross-sectional, cross-sectional, top and bottom views, respectively, of a semiconductor chip assembly in accordance with a third embodiment of the present invention.
Figure 30B:
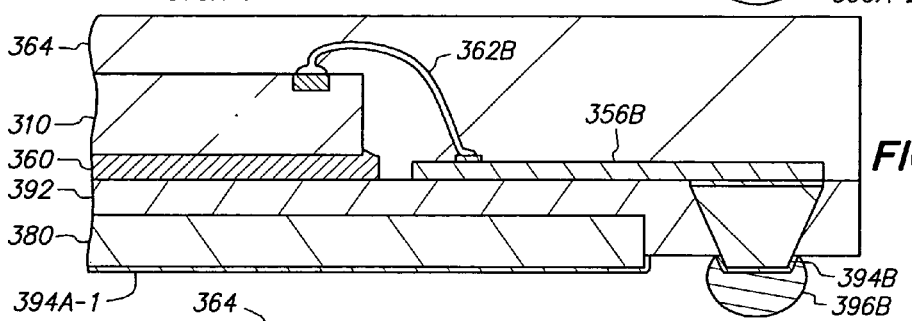
Figure 30C:
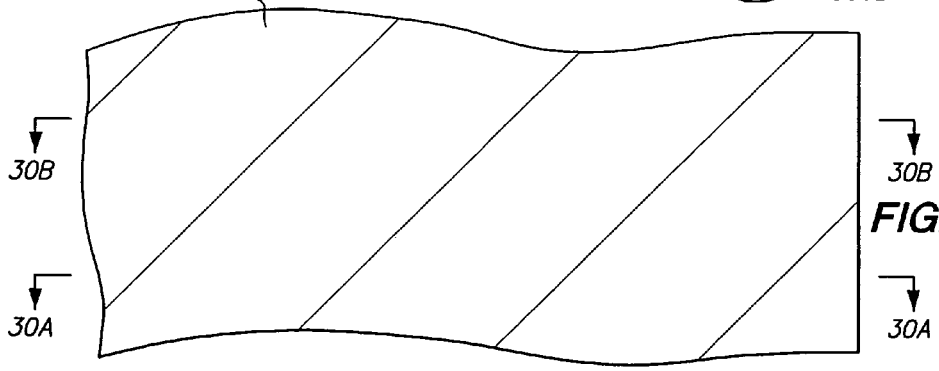
Figure 30D:
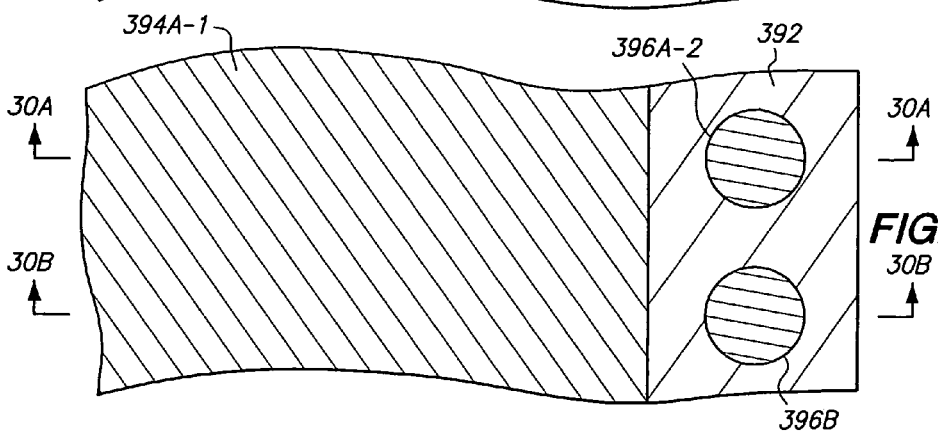
Figure 31A:
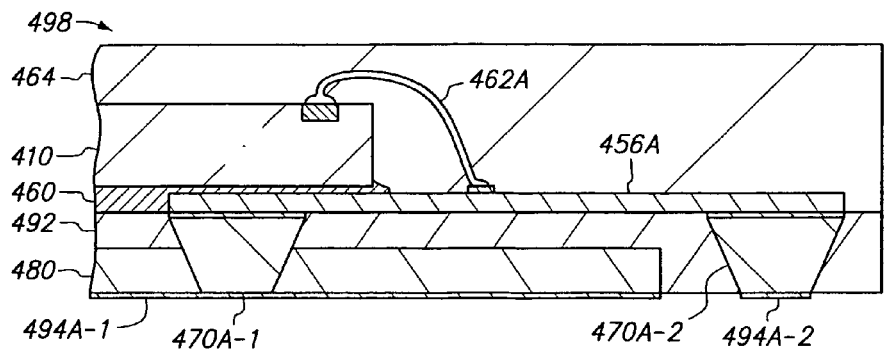
FIGS. 31A, 31B, 31C and 31D are cross-sectional, cross-sectional, top and bottom views, respectively, of a semiconductor chip assembly in accordance with a fourth embodiment of the present invention.
Figure 31B:
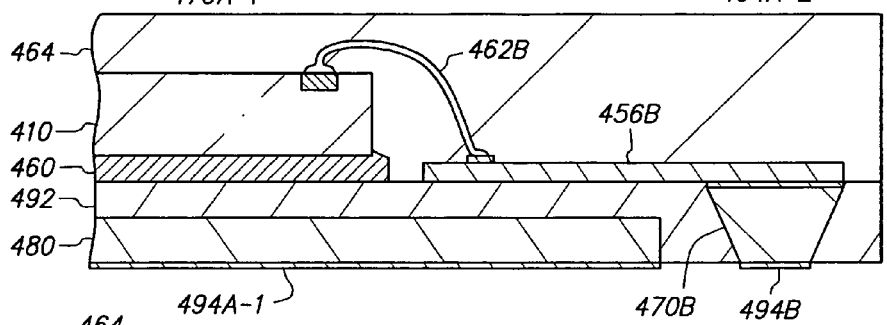
Figure 31C:
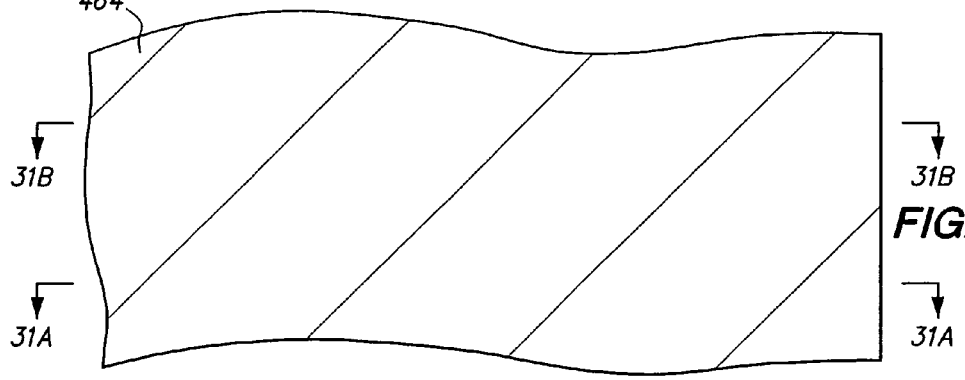
Figure 31D:
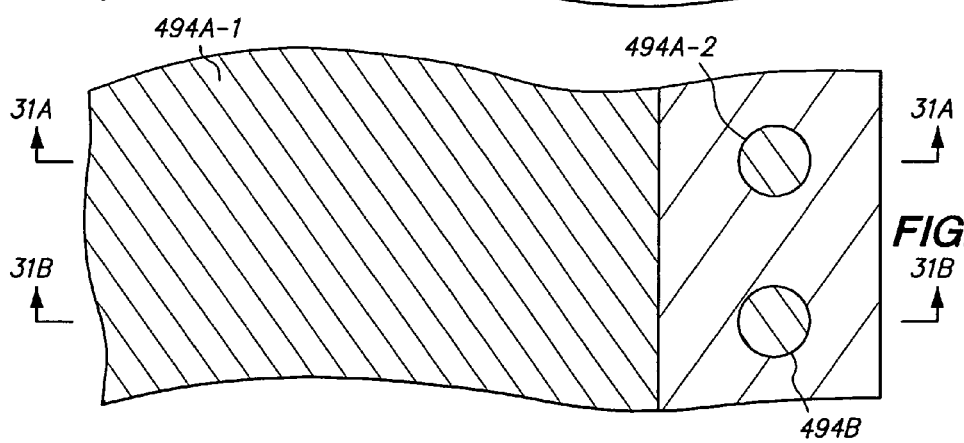
Figure 32A:
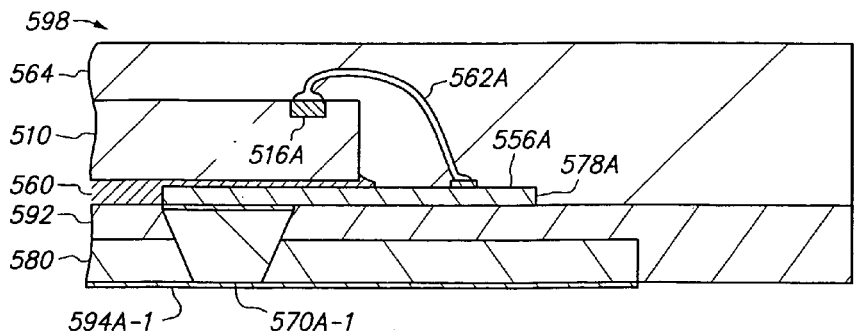
FIGS. 32A, 32B, 32C and 32D are cross-sectional, cross-sectional, top and bottom views, respectively, of a semiconductor chip assembly in accordance with a fifth embodiment of the present invention.
Figure 32B:
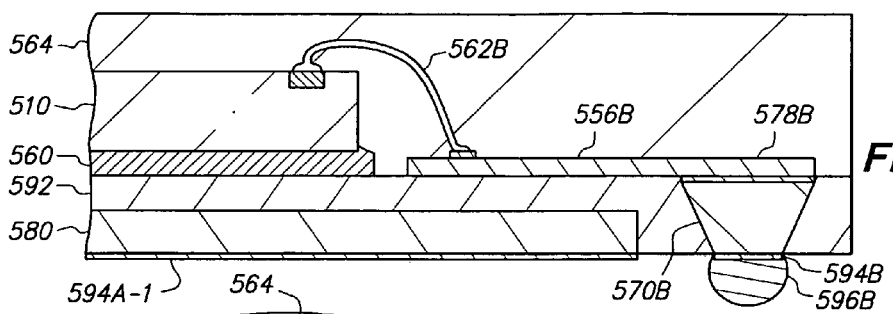
Figure 32C:
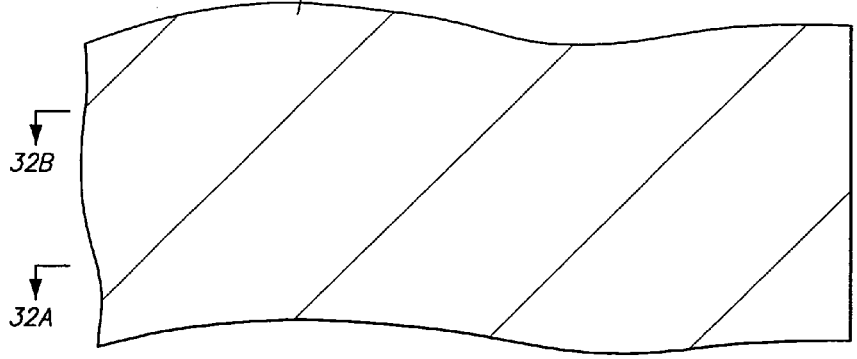
Figure 32D:
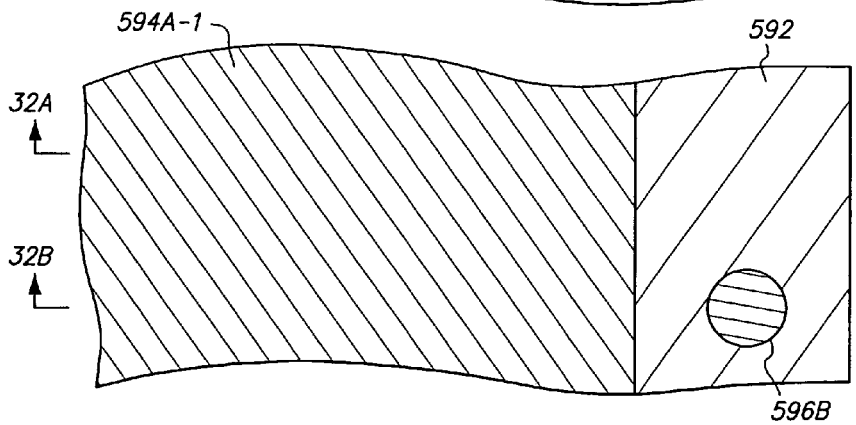
Figure 33A:
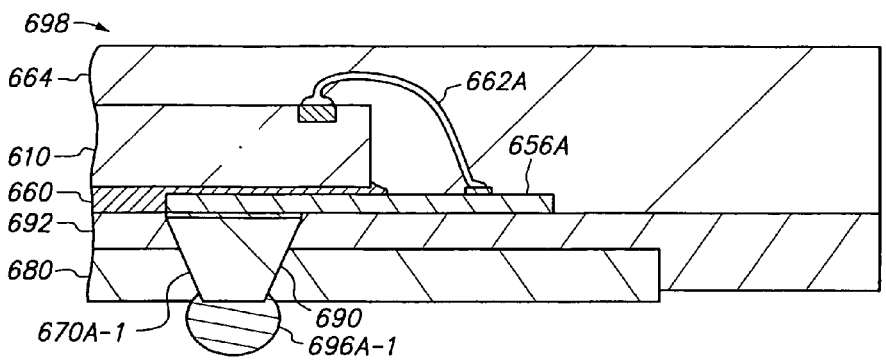
FIGS. 33A, 33B, 33C and 33D are cross-sectional, cross-sectional, top and bottom views, respectively, of a semiconductor chip assembly in accordance with a sixth embodiment of the present invention.
Figure 33B:
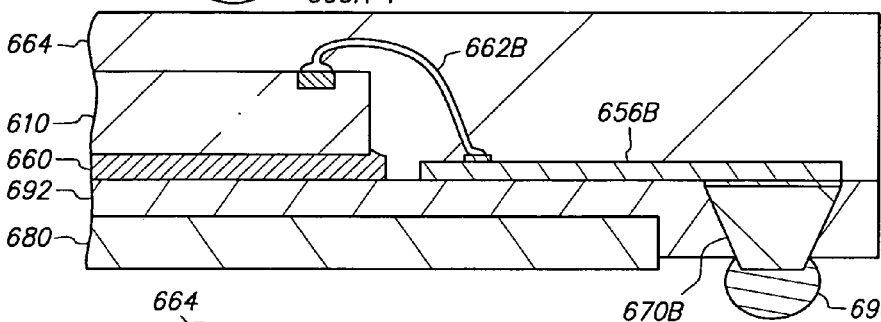
Figure 33C:
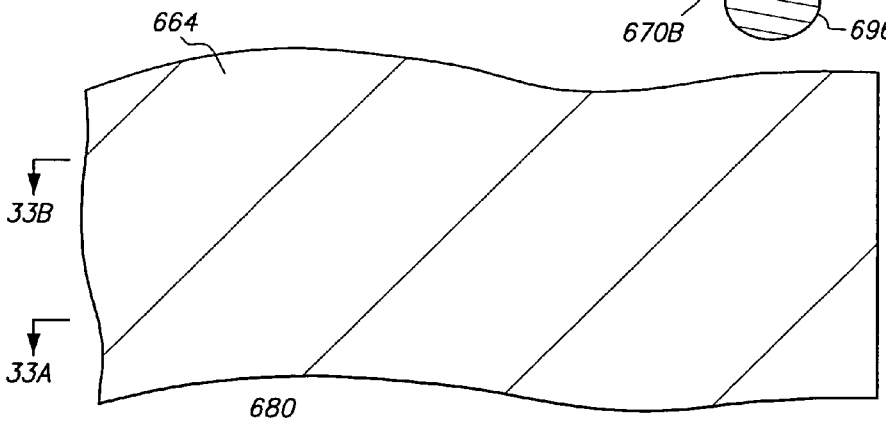
Figure 33D:
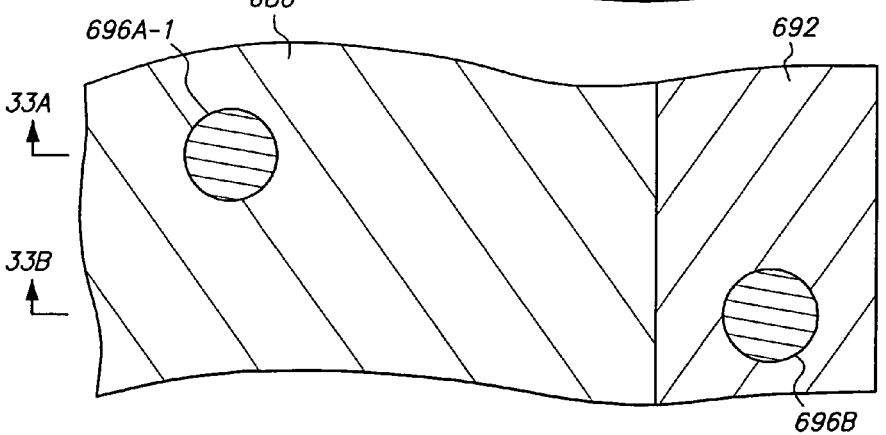
Figure 34A:
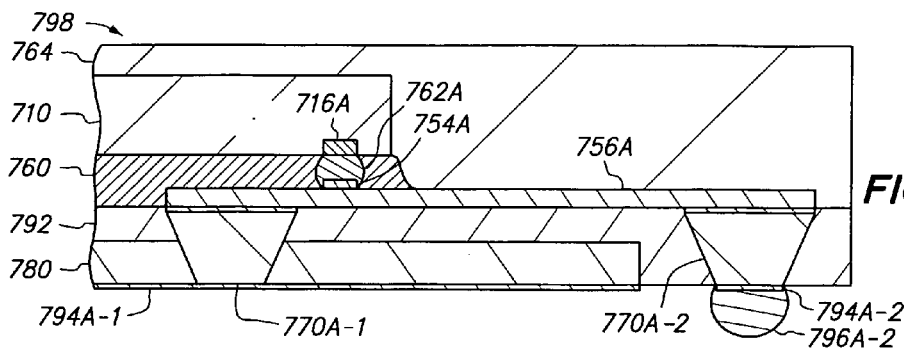
FIGS. 34A, 34B, 34C and 34D are cross-sectional, cross-sectional, top and bottom views, respectively, of a semiconductor chip assembly in accordance with a seventh embodiment of the present invention.
Figure 34B:
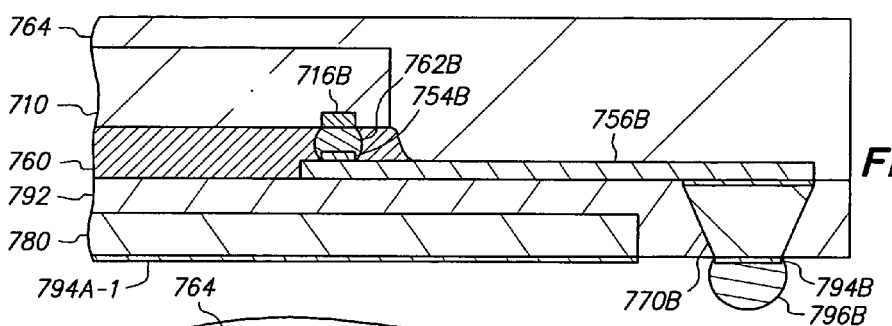
Figure 34C:
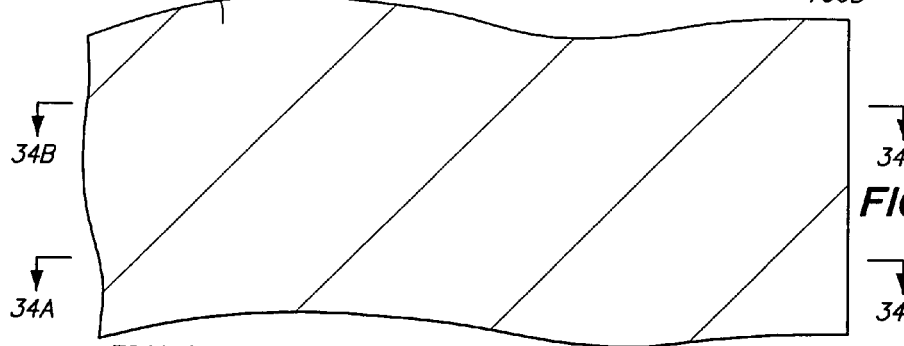
Figure 34D:
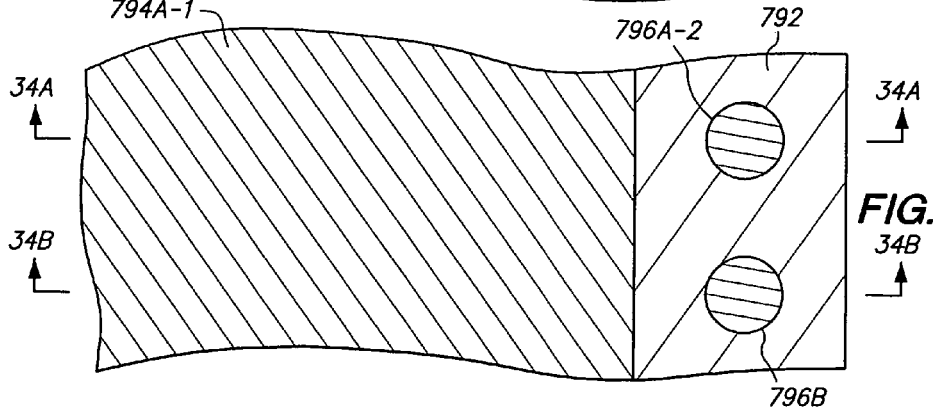

FIGS. 1A–28A, 1B–28B, 1C–28C and 1D–28D are cross-sectional, cross-sectional, top and bottom views, respectively, of a method of making a semiconductor chip assembly in accordance with a first embodiment of the present invention.

FIGS. 1A, 1B, 1C and 1D are cross-sectional, cross-sectional, top and bottom views, respectively, of semiconductor chip 110 which is an integrated circuit in which various transistors, circuits, interconnect lines and the like are formed (not shown). Chip 110 includes opposing major surfaces 112 and 114 and has a thickness (between surfaces 112 and 114) of 150 microns. Surface 112 is the active surface and includes conductive pads 116A and 116B and passivation layer 118. Pads 116A and 116B provide bonding sites to electrically couple chip 110 with external circuitry. Pad 116A is a ground pad, and pad 116B is an input/output pad.

Pads 116A and 116B are substantially aligned with passivation layer 118 so that surface 112 is essentially flat. Alternatively, pads 116A and 116B can extend above or be recessed below passivation layer 118. Pads 116A and 116B have a length and width of 100 microns.

Pads 116A and 116B have an aluminum base that is cleaned by dipping chip 110 in a solution containing 0.05 M phosphoric acid at room temperature for 1 minute and then rinsed in distilled water. Pads 116A and 116B can have the aluminum base serve as a surface layer, or alternatively, pads 116A and 116B can be treated to include a surface layer that covers the aluminum base, depending on the nature of a connection joint that shall subsequently contact the surface layer. In this embodiment, the connection joint is a gold wire bond. Therefore, pads 116A and 116B need not be treated to accommodate this connection joint. Alternatively, pads 116A and 116B can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process.

Chip 110 includes many other pads on surface 112, and only pads 116A and 116B are shown for convenience of illustration. In addition, chip 110 has already been singulated from other chips that it was previously attached to on a wafer.

FIGS. 2A, 2B, 2C and 2D are cross-sectional, cross-sectional, top and bottom views, respectively, of metal plate 120 which includes opposing major surfaces 122 and 124. Metal plate 120 is a copper plate with a thickness of 150 microns.

FIGS. 3A, 3B, 3C and 3D are cross-sectional, cross-sectional, top and bottom views, respectively, of photoresist layer 126 formed on metal plate 120. Photoresist layer 126 is deposited using a dry film lamination process in which a hot roll presses photoresist layer 126 onto surface 124. A reticle (not shown) is positioned proximate to photoresist layer 126. Thereafter, photoresist layer 126 is patterned by selectively applying light through the reticle, applying a developer solution to remove the photoresist portions rendered soluble by the light, and then hard baking, as is conventional. As a result, photoresist layer 126 contains openings that selectively expose surface 124 of metal plate 120. In addition, surface 122 of metal plate 120 remains fully exposed. Photoresist layer 126 has a thickness of 25 microns.

FIGS. 4A, 4B, 4C and 4D are cross-sectional, cross-sectional, top and bottom views, respectively, of metal layer 128 and etch masks 136A-1, 136A-2 and 136B formed on metal plate 120.

Metal layer 128 is blanketly electroplated on surface 122, and etch masks 136A-1, 136A-2 and 136B are electroplated on the exposed portions of surface 124. Metal layer 128 and etch masks 136A-1, 136A-2 and 136B are composed of nickel and have a thickness of 2 microns.

Metal layer 128 and etch masks 136A-1, 136A-2 and 136B are simultaneously formed by an electroplating operation using photoresist layer 126 as a plating mask. Thus, metal layer 128 and etch masks 136A-1, 136A-2 and 136B are formed additively. Initially, a plating bus (not shown) is connected to metal plate 120, current is applied to the plating bus from an external power source, and metal plate 120 is submerged in an electrolytic nickel plating solution such as Technic Techni Nickel "S" at room temperature. As a result, the nickel electroplates (deposits or grows) on surface 122 and the exposed portions of surface 124. The nickel electroplating operation continues until the nickel has the desired thickness. Thereafter, the structure is removed from the electrolytic nickel plating solution and rinsed in distilled water to remove contaminants.

Metal layer 128 is a flat sheet. Etch masks 136A-1, 136A-2 and 136B have a circular shape with a diameter of 500 microns and are laterally spaced from one another.

Metal base 130 includes metal plate 120 and metal layer 128. Thus, metal base 130 has a thickness of 152 microns (150+2). Metal base 130 also includes opposing major surfaces 132 and 134. Metal layer 128 provides surface 132 and is spaced from surface 134, and metal plate 120 provides surface 134 (at surface 124) and is spaced from surface 132. Furthermore, etch masks 136A-1, 136A-2 and 136B contact surface 134.

FIGS. 5A, 5B, 5C and 5D are cross-sectional, cross-sectional, top and bottom views, respectively, of metal base 130 and etch masks 136A-1, 136A-2 and 136B after photoresist layer 126 is stripped. Photoresist layer 126 is removed using a solvent, is such as a mild alkaline solution with a pH of 9, that is highly selective of photoresist with respect to copper and nickel. Therefore, no appreciable amount of metal base 130 or etch masks 136A-1, 136A-2 and 136B is removed.

FIGS. 6A, 6B, 6C and 6D are cross-sectional, cross-sectional, top and bottom views, respectively, of photoresist layers 140 and 142 formed on metal base 130 and etch masks 136A-1, 136A-2 and 136B. Photoresist layers 140 and 142 are deposited using a dry film lamination process in which hot rolls simultaneously press photoresist layers 140 and 142 onto surfaces 132 and 134, respectively. Thereafter, photoresist layer 140 is patterned by selectively applying light through a reticle (not shown), applying a developer solution to remove the photoresist portions rendered soluble by the light, and then hard baking, as is conventional. As a result, photoresist layer 140 contains openings that selectively expose surface 132 of metal base 130, and photoresist layer 142 remains unpatterned. In addition, photoresist layer 142 covers surface 134 of metal base 130 and etch masks 136A-1, 136A-2 and 136B. Photoresist layers 140 and 142 have a thickness of 25 microns.

FIGS. 7A, 7B, 7C and 7D are cross-sectional, cross-sectional, top and bottom views, respectively, of metal lines 144A and 144B formed on metal base 130.

Metal lines 144A and 144B are electroplated on the exposed portions of surface 132. Metal lines 144A and 144B are composed of copper and have a thickness of 20 microns.

Metal lines 144A and 144B are simultaneously formed by an electroplating operation using photoresist layers 140 and 142 as plating masks. Thus, metal lines 144A and 144B are formed additively. Initially, a plating bus (not shown) is connected to metal base 130, current is applied to the plating bus from an external power source, and metal base 130 is submerged in an electrolytic copper plating solution such as Sel-Rex CUBATH M™ at room temperature. As a result, the copper electroplates on the exposed portions of surface 132. The copper electroplating operation continues until the copper has the desired thickness. Thereafter, the structure is removed from the electrolytic copper plating solution and rinsed in distilled water to remove contaminants.

Metal line 144A is a flat planar lead that includes elongated region 146A with a width (orthogonal to its elongated length) of 100 microns and enlarged circular regions 148A-1 and 148A-2 with a diameter of 500 microns, and metal line 144B is a flat planar leads that includes elongated region 146B with a width (orthogonal to its elongated length) of 100 microns and enlarged circular region 148B with a diameter of 500 microns. Furthermore, etch mask 136A-1 and enlarged circular region 148A-1 are vertically aligned with one another, etch mask 136A-2 and enlarged circular region 148A-2 are vertically aligned with one another, and etch mask 136B and enlarged circular region 148B are vertically aligned with one another.

FIGS. 8A, 8B, 8C and 8D are cross-sectional, cross-sectional, top and bottom views, respectively, of metal base 130, etch masks 136A-1, 136A-2 and 136B and metal lines 144A and 144B after photoresist layers 140 and 142 are stripped. Photoresist layers 140 and 142 are removed using a solvent, such as a mild alkaline solution with a pH of 9, that is highly selective of photoresist with respect to copper and nickel. Therefore, no appreciable amount of metal base 130, etch masks 136A-1, 136A-2 and 136B or metal lines 144A and 144B is removed.

FIGS. 9A, 9B, 9C and 9D are cross-sectional, cross-sectional, top and bottom views, respectively, of photoresist layers 150 and 152 formed on metal base 130, etch masks 136A-1, 136A-2 and 136B and metal lines 144A and 144B. Photoresist layers 150 and 152 are deposited using a dry film lamination process in which hot rolls simultaneously press photoresist layers 150 and 152 onto surfaces 132 and 134, respectively. Thereafter, photoresist layer 150 is patterned by selectively applying light through a reticle (not shown), applying a developer solution to remove the photoresist portions rendered soluble by the light, and then hard baking, as is conventional. As a result, photoresist layer 150 contains openings that selectively expose metal lines 144A and 144B, and photoresist layer 152 remains unpatterned. In addition, photoresist layer 152 covers surface 134 of metal base 130 and etch masks 136A-1, 136A-2 and 136B. Photoresist layers 150 and 152 have a thickness of 25 microns.

FIGS. 10A, 10B, 10C and 10D are cross-sectional, cross-sectional, top and bottom views, respectively, of terminals 154A and 154B formed on metal lines 144A and 144B.

Terminals 154A and 154B are electroplated on the exposed portions of metal lines 144A and 144B, respectively. Terminals 154A and 154B are composed of nickel electroplated on metal lines 144A and 144B, and gold electroplated on the nickel. The nickel contacts and is sandwiched between metal lines 144A and 144B and the gold, and the gold contacts the nickel. Thus, the nickel is buried beneath the gold, and the gold is spaced and separated from metal lines 144A and 144B and is exposed. Terminals 154A and 154B have a thickness of 3.5 microns. In particular, the nickel has a thickness of 3 microns, and the gold has a thickness of 0.5 microns. For convenience of illustration, the nickel and gold are shown as a single layer.

Terminals 154A and 154B are simultaneously formed by an electroplating operation using photoresist layers 150 and 152 as plating masks. Thus, terminals 154A and 154B are formed additively. Initially, a plating bus (not shown) is connected to metal base 130, current is applied to the plating bus from an external power source, and metal base 130 is submerged in an electrolytic nickel plating solution such as Technic Techni Nickel "S" at room temperature. As a result, the nickel electroplates on the exposed portions of metal lines 144A and 144B. The nickel electroplating operation continues until the nickel has the desired thickness. Thereafter, the structure is removed from the electrolytic nickel plating solution and submerged in an electrolytic gold plating solution such as Technic Orotemp at room temperature while current is applied to the plating bus to electroplate the gold on the nickel. The gold electroplating operation continues until the gold has the desired thickness. Thereafter, the structure is removed from the electrolytic gold plating solution and rinsed in distilled water to remove contaminants.

Terminals 154A and 154B contact and are electrically connected to metal lines 144A and 144B, respectively.

Routing line 156A includes metal line 144A and terminal 154A, and routing line 156B includes metal line 144B and terminal 154B. Routing lines 156A and 156B are essentially flat planar leads that are coplanar with one another, laterally spaced from one another and have essentially identical thicknesses.

Etch masks 136A-1, 136A-2 and 136B and routing lines 156A and 156B contact metal base 130, are spaced and separated from one another, and are electrically connected to one another by metal base 130.

FIGS. 11A, 11B, 11C and 11D are cross-sectional, cross-sectional, top and bottom views, respectively, of metal base 130, etch masks 136A-1, 136A-2 and 136B and routing lines 156A and 156B after photoresist layers 150 and 152 are stripped. Photoresist layers 150 and 152 are removed using a solvent, such as a mild alkaline solution with a pH of 9, that is highly selective of photoresist with respect to copper, nickel and gold. Therefore, no appreciable amount of metal base 130, etch masks 136A-1, 136A-2 and 136B or routing lines 156A and 156B is removed.

FIGS. 12A, 12B, 12C and 12D are cross-sectional, cross-sectional, top and bottom views, respectively, of adhesive 160 formed on metal base 130 and routing line 156A.

Adhesive 160 may include an organic surface protectant such as HK 2000 which is promptly applied to the structure after photoresist layers 150 and 152 are removed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is dispensed over selected portions of metal base 130 and routing line 156A using stencil printing. During stencil printing, a stencil (not shown) is placed over metal base 130 and routing lines 156A and 156B, a stencil opening is aligned with metal base 130 and routing line 156A and offset from routing line 156B, and then a squeegee (not shown) pushes the liquid resin along the surface of the stencil opposite metal base 130 and routing lines 156A and 156B, through the stencil opening and onto metal base 130 and routing line 156A but not routing line 156B. The liquid resin is compliant enough at room temperature to conform to virtually any shape. Therefore, the liquid resin flows over and covers portions of metal base 130 and routing line 156A and remains spaced and separated from routing line 156B. Adhesive 160 has a thickness of 30 microns as measured from routing line 156A.

FIGS. 13A, 13B, 13C and 13D are cross-sectional, cross-sectional, top and bottom views, respectively, of chip 110 mechanically attached to metal base 130, etch masks 136A-1, 136A-2 and 136B and routing lines 156A and 156B by adhesive 160.

Adhesive 160 extends between and contacts chip 110 and metal base 130, and likewise, adhesive 160 extends between and contacts chip 110 and routing line 156A. Surface 114 of chip 110 faces towards metal base 130 and routing line 156A and is covered by adhesive 160, and surface 112 of chip 110 faces away from metal base 130 and routing line 156A and is exposed. Chip 110 and metal base 130 do not contact one another, and chip 110 and routing line 156A do not contact one another.

Adhesive 160 is sandwiched between chip 110 and metal base 130 and between chip 110 and routing line 156A using relatively low pressure from a pick-up head that places chip 110 on adhesive 160, holds chip 110 against adhesive 160 for 5 seconds and then releases chip 110. The pick-up head is heated to a relatively low temperature such as 150° C., and adhesive 160 receives heat from the pick-up head transferred through chip 110. As a result, adhesive 160 proximate to chip 110 is partially polymerized (B stage) and forms a gel but is not fully cured, and adhesive 160 that is partially polymerized provides a loose mechanical bond between chip 110 and metal base 130 and between chip 110 and routing line 156A.

Chip 110 and metal base 130 are positioned relative to one another so that chip 110 is disposed within the periphery of adhesive 160. Chip 110 and metal base 130 can be aligned using an automated pattern recognition system.

Thereafter, the structure is placed in an oven and adhesive 160 is fully cured (C stage) and hardened at relatively low temperature in the range of 200 to 250° C. to form a solid adhesive insulative thermosetting polyimide layer that mechanically attaches chip 110 to metal base 130 and routing line 156A. Adhesive 160 is 5 microns thick between chip 110 and routing line 156A.

At this stage, routing line 156A extends within and outside the periphery of chip 110, routing line 156B is disposed outside the periphery of chip 110, and metal base 130 and routing lines 156A and 156B are disposed vertically beyond chip 110.

FIGS. 14A, 14B, 14C and 14D are cross-sectional, cross-sectional, top and bottom views, respectively, of connection joints 162A and 162B formed on pads 116A and 116B and routing lines 156A and 156B.

Connection joint 162A is a wire bond composed of gold that is ball bonded to pad 116A and then wedge bonded to terminal 154A. Likewise, connection joint 162B is a wire bond composed of gold that is ball bonded to pad 116B and then wedge bonded to terminal 154B. Thus, connection joint 162A contacts and electrically connects pad 116A and routing line 156A, and connection joint 162B contacts and electrically connects pad 116B and routing line 156B. Furthermore, connection joints 162A and 162B extend within and outside the periphery of chip 110.

At this stage, pad 116A is electrically connected to routing line 156A by connection joint 162A, pad 116B is electrically connected to routing line 156B by connection joint 162B, and routing lines 156A and 156B are electrically connected to one another by metal base 130. As a result, pads 116A and 116B are electrically connected to one another by metal base 130, routing lines 156A and 156B and connection joints 162A and 162B.

FIGS. 15A, 15B, 15C and 15D are cross-sectional, cross-sectional, top and bottom views, respectively, of encapsulant 164 formed on chip 110, metal base 130, routing lines 156A and 156B, adhesive 160 and connection joints 162A and 162B.

Encapsulant 164 is deposited by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a preheater, a mold, a press and a cure oven. The mold includes an upper mold section and a lower mold section, also called "platens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, the structure is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm$^2$ and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The lower mold section contacts and makes sealing engagement with and is generally flush with metal base 130. However, the upper mold section is spaced from connection joints 162A and 162B by 100 microns. As a result, the molding compound contacts the exposed portions of the chip 110, metal base 130, routing lines 156A and 156B, adhesive 160 and connection joints 162A and 162B in the cavity. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the molded structure from the mold, and excess molding compound attached to the molded structure that solidified in the runners and the gates is trimmed and removed. The molded structure is then loaded into a magazine and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the structure, the flame retardant reduces flammability, the stress-relief agent reduces crack propagation, the coloring agent reduces photonic activity and device visibility, and the mold-release agent facilitates removal from the mold.

Encapsulant 164 contacts and covers chip 110, metal base 130, routing lines 156A and 156B, adhesive 160 and connection joints 162A and 162B and is spaced from etch masks 136A-1, 136A-2 and 136B.

Encapsulant 164 is a solid adherent compressible protective layer that provides environmental protection such as moisture resistance and particle protection for chip 110 as well as mechanical support for routing lines 156A and 156B outside the periphery of chip 110.

Encapsulant 164 extends vertically beyond chip 110, metal base 130, etch masks 136A-1, 136A-2 and 136B, routing lines 156A and 156B, adhesive 160 and connection joints 162A and 162B, and is 100 microns thick beyond connection joints 162A and 162B. Furthermore, metal base 130 is disposed vertically beyond encapsulant 164.

FIGS. 16A, 16B, 16C and 16D are cross-sectional, cross-sectional, top and bottom views, respectively, of pillars 170A-1, 170A-2 and 170B partially formed from metal base 130.

Pillars 170A-1, 170A-2 and 170B are partially formed by applying a first wet chemical etch to metal base 130 using etch masks 136A-1, 136A-2 and 136B to selectively protect metal base 130. Metal base 130 is provided by metal plate 120 and metal layer 128. Metal plate 120 is copper and metal layer 128 is nickel. Etch masks 136A-1, 136A-2 and 136B contact metal plate 120 at surface 134 and are nickel.

A first back-side wet chemical etch is applied to surface 134 of metal base 130 and etch masks 136A-1, 136A-2 and 136B. For instance, the first wet chemical etch can be sprayed on surface 134 and etch masks 136A-1, 136A-2 and 136B, or the structure can be dipped in the first wet chemical etch since encapsulant 164 provides front-side protection.

The first wet chemical etch is a copper etching solution, such as a solution containing alkaline ammonia, that is highly selective of copper with respect to nickel and the molding compound, and therefore, highly selective of metal plate 120 with respect to metal layer 128, etch masks 136A-1, 136A-2 and 136B and encapsulant 164.

The first wet chemical etch etches completely through metal plate 120 and removes most of metal plate 120, thereby effecting a pattern transfer of etch masks 136A-1, 136A-2 and 136B onto metal plate 120 and exposing metal layer 128, but not exposing routing lines 156A and 156B, adhesive 160 or encapsulant 164. However, unetched portions of metal plate 120 defined by etch masks 136A-1, 136A-2 and 136B remain intact and form portions of pillars 170A-1, 170A-2 and 170B, respectively. In addition, no appreciable amount of metal layer 128, etch masks 136A-1, 136A-2 and 136B or encapsulant 164 is removed. Furthermore, metal layer 128 protects the underlying routing lines 156A and 156B from the first wet chemical etch.

The optimal etch time for exposing the structure to the first wet chemical etch in order to etch through metal plate 120 and partially form pillars 170A-1, 170A-2 and 170B with the desired shapes and dimensions without excessively exposing the nickel features to the first wet chemical etch can be established through trial and error.

FIGS. 17A, 17B, 17C and 17D are cross-sectional, cross-sectional, top and bottom views, respectively, of the structure after etch masks 136A-1, 136A-2 and 136B are removed and pillars 170A-1, 170A-2 and 170B are fully formed from metal base 130.

Etch masks 136A-1, 136A-2 and 136B are removed and pillars 170A-1, 170A-2 and 170B are fully formed by applying a second wet chemical etch.

A second back-side wet chemical etch is applied to metal layer 128, etch masks 136A-1, 136A-2 and 136B and pillars 170A-1, 170A-2 and 170B. For instance, the second wet chemical etch can be sprayed on metal layer 128, etch masks 136A-1, 136A-2 and 136B and pillars 170A-1, 170A-2 and 170B, or the structure can be dipped in the second wet chemical etch since encapsulant 164 provides front-side protection.

The second wet chemical etch is a nickel etching solution, such as a dilute mixture of nitric and hydrochloric acid, that is highly selective of nickel with respect to polyimide and the molding compound.

The second wet chemical etch removes etch masks 136A-1, 136A-2 and 136B, thereby exposing surfaces 174A-1, 174A-2 and 174B of pillars 170A-1, 170A-2 and 170B, respectively.

The second wet chemical etch also etches completely through metal layer 128 and removes most of metal layer 128, thereby effecting a pattern transfer of etch masks 136A-1, 136A-2 and 136B onto metal layer 128 and exposing routing lines 156A and 156B, adhesive 160 and encapsulant 164. However, unetched portions of metal layer 128 defined by etch masks 136A-1, 136A-2 and 136B remain intact and form portions of pillars 170A-1, 170A-2 and 170B, respectively. In addition, no appreciable amount of adhesive 160 or encapsulant 164 is removed. Furthermore, metal lines 144A and 144B protect the underlying terminals 154A and 154B from the second wet chemical etch.

Since metal layer 128 and etch masks 136A-1, 136A-2 and 136B are extremely thin relative to the copper of routing lines 156A and 156B and pillars 170A-1, 170A-2 and 170B, and the structure is removed from the nickel etching solution soon after the exposed portions of metal layer 128 are removed and etch masks 136A-1, 136A-2 and 136B are stripped, it is not critical that the nickel etching solution be highly selective of nickel with respect to copper. In fact, the nickel etching solution is also selective of copper. As a result, the nickel etching solution also removes a slight amount of the exposed copper features. However, the nickel etching solution is not applied long enough to appreciably affect the exposed copper features. Therefore, the nickel etching solution has no appreciable affect on routing lines 156A and 156B or pillars 170A-1, 170A-2 and 170B.

The second wet chemical etch may slightly undercut the nickel portion of pillars 170A-1 and 170A-2 and 170B relative to the copper portion of pillars 170A-1 and 170A-2 and 170B. For convenience of explanation, this slight undercut is ignored.

The optimal etch time for exposing the structure to the second wet chemical etch in order to etch through metal layer 128, remove etch masks 136A-1, 136A-2 and 136B and form pillars 170A-1, 170A-2 and 170B with the desired shapes and dimensions without excessively exposing the copper features to the second wet chemical etch can be established through trial and error.

Pillars 170A-1, 170A-2 and 170B are formed by applying a wet chemical etch to metal base 130 using etch masks 136A-1, 136A-2 and 136B to selectively protect metal base 130. Pillars 170A-1, 170A-2 and 170B are unetched portions of metal base 130 defined by etch masks 136A-1, 136A-2 and 136B, respectively, that contact routing lines 156A, 156A and 156B, respectively, and are formed subtractively.

The wet chemical etch is provided by sequentially applying the first and second wet chemical etches using the copper and nickel etching solutions. The wet chemical etch etches completely through metal base 130 and removes most of metal base 130, thereby effecting a pattern transfer of etch masks 136A-1, 136A-2 and 136B onto metal base 130, exposing routing lines 156A and 156B, adhesive 160 and encapsulant 164, and reducing but not eliminating contact area between metal base 130 and routing lines 156A and 156B.

The wet chemical etch laterally undercuts metal base 130 relative to etch masks 136A-1, 136A-2 and 136B, causing pillars 170A-1 and 170A-2 to taper inwardly as they extend vertically from routing line 156A and causing pillar 170B to taper inwardly as it extends vertically from routing line 156B. A suitable taper is between 45 and slightly less than 90 degrees, such as approximately 75 degrees.

The wet chemical etch also electrically isolates routing lines 156A and 156B from one another, and consequently electrically isolates connection joints 162A and 162B from one another and pads 116A and 116B from one another. That is, since pillars 170A-1 and 170A-2 are the only unetched portions of metal base 130 that contact routing line 156A after the etch occurs, and pillar 170B is the only unetched portion of metal base 130 that contacts routing line 156B after the etch occurs, and pillars 170A-1, 170A-2 and 170B are spaced and separated from one another, metal base 130 no longer electrically connects routing lines 156A and 156B.

Encapsulant 164 provides mechanical support for routing lines 156A and 156B and pillars 170A-1, 170A-2 and 170B and reduces mechanical strain on adhesive 160. Encapsulant 164 protects routing lines 156A and 156B and pillars 170A-1, 170A-2 and 170B from mechanical damage by the wet chemical etch and subsequent cleaning steps (such as rinsing in distilled water and air blowing). For instance, encapsulant 164 absorbs physical force of the wet chemical etch and cleaning steps that might otherwise separate routing line 156A from pillars 170A-1 and 170A-2 and separate routing line 156B from pillar 170B. Thus, encapsulant 164 improves structural integrity and allows the wet chemical etch and subsequent cleaning steps to be applied more vigorously, thereby improving manufacturing throughput.

Pillar 170A-1 includes opposing surfaces 172A-1 and 174A-1 and tapered sidewalls 176A-1 therebetween, pillar 170A-2 includes opposing surfaces 172A-2 and 174A-2 and tapered sidewalls 176A-2 therebetween, and pillar 170B includes opposing surfaces 172B and 174B and tapered sidewalls 176B therebetween. Surfaces 172A-1, 172A-2 and 172B of pillars 170A-1, 170A-2 and 170B constitute unetched portions of surface 132 of metal base 130 provided by metal layer 128, and surfaces 174A-1, 174A-2 and 174B of pillars 170A-1, 170A-2 and 170B constitute unetched portions of surface 134 of metal base 130 provided by metal plate 120.

Surfaces 172A-1 and 172A-2 contact and face towards routing line 156A, and surface 172B contacts and faces towards routing line 156B. Surfaces 174A-1 and 174A-2 are spaced from and face away from routing line 156A and are exposed, and surface 174B is spaced from and faces away from routing line 156B and is exposed. Furthermore, surfaces 174A-1 and 174A-2 contacted and faced towards and were covered by etch masks 136A-1 and 136A-2, respectively, before etch masks 136A-1 and 136A-2 were removed, and surface 174B contacted and faced towards and was covered by etch mask 136B before etch mask 136B was removed. Surfaces 172A-1, 172A-2, 172B, 174A-1, 174A-2 and 174B are flat and parallel to one another. Tapered sidewalls 176A-1 are adjacent to surfaces 172A-1 and 174A-1 and slant inwardly towards surface 174A-1, tapered sidewalls 176A-2 are adjacent to surfaces 172A-2 and 174A-2 and slant inwardly towards surface 174A-2, and tapered sidewalls 176B are adjacent to surfaces 172B and 174B and slant inwardly towards surface 174B.

Pillar 170A-1 has a conical shape with a height (between surfaces 172A-1 and is 174A-1) of 152 microns and a diameter that decreases as the height increases (towards surface 174A-1 and away from surface 172A-1). Surface 172A-1 has a circular shape with a diameter of 500 microns, and surface 174A-1 has a circular shape with a diameter of 350 microns. Surfaces 172A-1 and 174A-1 are vertically aligned with enlarged circular region 148A-1 and one another. Thus, surface 174A-1 is concentrically disposed within the surface areas of enlarged circular region 148A-1 and surface 172A-1, and the periphery of surface 174A-1 is laterally offset from the peripheries of enlarged circular region 148A-1 and surface 172A-1.

Pillar 170A-2 has a conical shape with a height (between surfaces 172A-2 and 174A-2) of 152 microns and a diameter that decreases as the height increases (towards surface 174A-2 and away from surface 172A-2). Surface 172A-2 has a circular shape with a diameter of 500 microns, and surface 174A-2 has a circular shape with a diameter of 350 microns. Surfaces 172A-2 and 174A-2 are vertically aligned with enlarged circular region 148A-2 and one another. Thus, surface 174A-2 is concentrically disposed within the surface areas of enlarged circular region 148A-2 and surface 172A-2, and the periphery of surface 174A-2 is laterally offset from the peripheries of enlarged circular region 148A-2 and surface 172A-2.

Pillar 170B has a conical shape with a height (between surfaces 172B and 174B) of 152 microns and a diameter that decreases as the height increases (towards surface 174B and away from surface 172B). Surface 172B has a circular shape with a diameter of 500 microns, and surface 174B has a circular shape with a diameter of 350 microns. Surfaces 172B and 174B are vertically aligned with enlarged circular region 148B and one another. Thus, surface 174B is concentrically disposed within the surface areas of enlarged circular region 148B and surface 172B, and the periphery of surface 174B is laterally offset from the peripheries of enlarged circular region 148B and surface 172B.

Routing line 156A and pillar 170A-1 contact one another, adhere to one another, are metallurgically bonded to one another, are electrically connected to one another and are non-integral with one another. In addition, routing line 156A and pillar 170A-1 are adjacent to one another, routing line 156A extends laterally from pillar 170A-1, and pillar 170A-1 extends vertically from routing line 156A.

Routing line 156A and pillar 170A-2 contact one another, adhere to one another, are metallurgically bonded to one another, are electrically connected to one another and are non-integral with one another. In addition, routing line 156A and pillar 170A-2 are adjacent to one another, routing line 156A extends laterally from pillar 170A-2, and pillar 170A-2 extends vertically from routing line 156A.

Routing line 156B and pillar 170B contact one another, adhere to one another, are metallurgically bonded to one another, are electrically connected to one another and are non-integral with one another. In addition, routing line 156B and pillar 170B are adjacent to one another, routing line 156B extends laterally from pillar 170B, and pillar 170B extends vertically from routing line 156B.

Pillars 170A-1, 170A-2 and 170B are coplanar with one another, laterally spaced from one another and have essentially identical thicknesses. Furthermore, pillars 170A-1, 170A-2 and 170B are disposed vertically beyond chip 110, adhesive 160, connection joints 162A and 162B and encapsulant 164, and pillar 170A-1 is disposed within the periphery of chip 110, however pillars 170A-2 and 170B are disposed outside the periphery of chip 110.

Conductive trace 178A includes routing line 156A and pillars 170A-1 and 170A-2 and is electrically connected to pad 116A by connection joint 162A, and conductive trace 178B includes routing line 156B and pillar 170B and is electrically connected to pad 116B by connection joint 162B. Conductive trace 178A is adapted for providing horizontal and vertical routing between pad 116A and a ground plane pad (using pillar 170A-1) and between pad 116A and a next level assembly (using pillar 170A-2), and conductive trace 178B is adapted for providing horizontal and vertical routing between pad 116B and a next level assembly (using pillar 170B).

At this stage, routing lines 156A and 156B, adhesive 160, encapsulant 164 and pillars 170A-1, 170A-2 and 170B are exposed, and encapsulant 164 provides mechanical support for adhesive 160 and conductive traces 178A and 178B that is particularly useful after most of metal base 130 is removed by the etch.

FIGS. 18A, 18B, 18C and 18D are cross-sectional, cross-sectional, top and bottom views, respectively, of ground plane 180 which includes opposing major surfaces 182 and 184. Ground plane 180 is a copper plate with a thickness of 100 microns.

FIGS. 19A, 19B, 19C and 19D are cross-sectional, cross-sectional, top and bottom views, respectively, of photoresist layers 186 and 188 formed on ground plane 180. Photoresist layers 186 and 188 are deposited using a dry film lamination process in which hot rolls simultaneously press photoresist layers 186 and 188 onto surfaces 182 and 184, respectively. Reticles (not shown) are positioned proximate to photoresist layers 186 and 188. Thereafter, photoresist layers 186 and 188 are simultaneously patterned by selectively applying light through the reticles, applying a developer solution to remove the photoresist portions rendered soluble by the light, and then hard baking, as is conventional. As a result, photoresist layer 186 contains an opening with a diameter of 300 microns that selectively exposes surface 182 of ground plane 180, and photoresist layer 188 contains an opening with a diameter of 300 microns that selectively exposes surface 184 of ground plane 180. Photoresist layers 186 and 188 have a thickness of 25 microns.

FIGS. 20A, 20B, 20C and 20D are cross-sectional, cross-sectional, top and bottom views, respectively, of opening 190 formed in ground plane 180.

Opening 190 is formed by a wet chemical etch that provides a front-side etch through the opening in photoresist layer 186 to the exposed portion of surface 182 and a back-side etch through the opening in photoresist layer 188 to the exposed portion of surface 184. For instance, the wet chemical etch can be sprayed on the front and back sides of the structure, or the structure can be dipped in the wet chemical.

The wet chemical etch is a copper etching solution, such as a solution containing alkaline ammonia, that is highly selective of copper.

The wet chemical etch etches vertically about 60 microns into ground plane 180. That is, the wet chemical etch provides a "half-etch" that removes slightly over one-half ($60/100$) the thickness of ground plane 180 at the exposed portions. Thus, the front-side etch partially forms opening 190, the back-side etch partially forms opening 190, and the front-side and back-side etches in combination completely form opening 190. Likewise, the front-side and back-side etches are applied simultaneously.

The wet chemical etch also laterally undercuts ground plane 180 relative to photoresist layers 186 and 188, causing opening 190 to taper inwardly as it extends midway between surfaces 182 and 184.

Opening 190 has a diameter of 360 microns at surface 182, a diameter of 360 microns at surface 184, and a diameter of 300 microns midway between surfaces 182 and 184. Thus, opening 190 has an hourglass shape with a depth (between surfaces 182 and 184) of 100 microns and a diameter that decreases as the depth approaches midway between surfaces 182 and 184. Opening 190 includes opposing ends at surfaces 182 and 184 that are vertically aligned with one another, and the center midway between surfaces 182 and 184 is concentrically disposed within the surface areas of the ends at surfaces 182 and 184.

The optimal etch time for exposing ground plane 180 to the wet chemical etch in order to form opening 190 with the desired shape and dimensions can be established through trial and error.

FIGS. 21A, 21B, 21C and 21D are cross-sectional, cross-sectional, top and bottom views, respectively, of ground plane 180 after photoresist layers 186 and 188 are stripped. Photoresist layers 186 and 188 are removed using a solvent, such as a mild alkaline solution with a pH of 9, that is highly selective of photoresist with respect to copper. Therefore, no appreciable amount of ground plane 180 is removed.

FIGS. 22A, 22B, 22C and 22D are cross-sectional, cross-sectional, top and bottom views, respectively, of insulative base 192 formed on routing lines 156A and 156B, adhesive 160, encapsulant 164 and pillars 170A-1, 170A-2 and 170B.

Insulative base 192 may include an organic surface protectant such as HK 2000 which is promptly applied to the structure after etch masks 136A-1, 136A-2 and 136B are removed and pillars 170A-1, 170A-2 and 170B are formed to reduce native oxide formation on the exposed copper surfaces. The use of organic surface protectant layers in insulative bases for semiconductor chip assemblies is well-known in the art.

Thereafter, a liquid resin (A stage) such as Hysol 308 is dispensed over routing lines 156A and 156B, adhesive 160, encapsulant 164 and pillars 170A-1, 170A-2 and 170B. The liquid resin is compliant enough at room temperature to conform to virtually any shape. Therefore, the liquid resin flows over and covers routing lines 156A and 156B, adhesive 160, encapsulant 164 and pillars 170A-1, 170A-2 and 170B.

Thereafter, the structure is placed in an oven and insulative base 192 is heated to a relatively low temperature such as 100° C. As a result, insulative base 192 is partially polymerized (B stage) and forms a gel but is not fully cured. Insulative base 192 extends vertically beyond chip 110, routing lines 156A and 156B, adhesive 160, connection joints 162A and 162B, encapsulant 164 and pillars 170A-1, 170A-2 and 170B.

For convenience of illustration, insulative base 192 is shown below chip 110, routing lines 156A and 156B, adhesive 160, connection joints 162A and 162B, encapsulant 164 and pillars 170A-1, 170A-2 and 170B to retain a single orientation throughout the figures for ease of comparison between the figures, although in this step the structure would be inverted so that gravitational force would assist the liquid resin flow.

FIGS. 23A, 23B, 23C and 23D are cross-sectional, cross-sectional, top and bottom views, respectively, of ground plane 180 mechanically attached and electrically connected to pillar 170A-1 by a press-fit.

Chip 110 and ground plane 180 are positioned relative to one another so that chip 110 and pillar 170A-1 are disposed within the periphery of ground plane 180, pillars 170A-2 and 170B are disposed outside the periphery of ground plane 180, surface 174A-1 of pillar 170A-1 faces towards surface 182 of ground plane 180, and pillar 170A-1 and opening 190 are vertically aligned with one another. Chip 110 and ground plane 180 can be aligned using an automated pattern recognition system.

Ground plane 180 is moved vertically towards chip 110 by applying relatively high pressure to surface 184 of ground plane 180 while chip 110 remains stationary. At this stage, pillar 170A-1 is covered by insulative base 192 which is a gel.

As ground plane 180 continues to move vertically towards chip 110, insulative base 192 proximate to pillar 170A-1 contacts ground plane 180 and enters opening 190, and pillar 170A-1 remains spaced and separated from ground plane 180 and outside opening 190.

As ground plane 180 continues to move vertically towards chip 110, pillar 170A-1 enters opening 190. Since pillar 170A-1 has a diameter at surface 174A-1 of 350 microns, and opening 190 has a diameter at surface 182 of 360 microns, pillar 170A-1 is readily inserted into opening 190 and alignment tolerances are accounted for.

As ground plane 180 continues to move vertically towards chip 110, pillar 170A-1 extends further into opening 190. Since pillar 170A-1 has a diameter at surface 174A-1 of 350 microns, and opening 190 has a diameter midway between surfaces 182 and 184 of 300 microns, pillar 170A-1 becomes increasingly tightly fit within opening 190 as pillar 170A-1 approaches surface 184.

As ground plane 180 continues to move vertically towards chip 110, and pillar 170A-1 extends further into opening 190, pillar 170A-1 is press-fit into opening 190. Thus, pillar 170A-1 is urged into pressure engagement with ground plane 180 at opening 190. Pillar 170A-1 and ground plane 180 incur minor physical distortion at the press-fit. Furthermore, insulative base 192 is squeezed away from the grinding surfaces between pillar 170A-1 and ground plane 180 at the press-fit and pushed through opening 190. As a result, pillar 170A-1 contacts, is mechanically attached to and is electrically connected to ground plane 180 at the press-fit. Moreover, insulative base 192 is squeezed away from ground plane 180, covers ground plane 180 and contacts essentially all of surfaces 182 and 184. As a result, insulative base 192 provides a loose mechanical bond for ground plane 180.

Ground plane 180 ceases to move vertically towards chip 110 as pillar 170A-1 reaches its maximum depth within opening 190 and tunnels no further into opening 190, and the pressure applied to surface 184 of ground plane 180 is released. Pillar 170A-1 extends 95 microns into opening 190 and is spaced from surface 184 by 5 microns.

In this manner, pillar 170A-1 is forcefully driven into opening 190 with a firm low electrical resistance compression, or press-fit. The press-fit provides a strong, stable structure that holds pillar 170A-1 and ground plane 180 in pressure engagement and ensures reliable physical and electrical contact between pillar 170A-1 and ground plane 180.

Ground plane 180 contacts and is electrically connected to pillar 170A-1, which contacts and is electrically connected to routing line 156A, which contacts and is electrically connected to connection joint 162A, which contacts and is electrically connected to pad 116A. As a result, press-fitting pillar 170A-1 into opening 190 electrically connects pad 116A and ground plane 180. The electrically conductive path between pad 116A and ground plane 180 not only includes but also requires routing line 156A, connection joint 162A, pillar 170A-1 and the press-fit. Advantageously, the electrically conductive path is devoid of another pressure contact, another ground plane and a printed circuit board.

Press-fitting pillar 170A-1 into opening 190 also electrically connects pillar 170A-2 and ground plane 180. Although pillar 170A-2 remains electrically connected to pad 116A, pillar 170A-2 is not in an electrically conductive path between pad 116A and ground plane 180. Furthermore, pad 116B, routing line 156B, connection joint 162B and pillar 170B remain electrically isolated from pad 116A, routing line 156A, connection joint 162A, pillars 170A-1 and 170A-2 and ground plane 180.

At this stage, chip 110 is proximate to and disposed within the periphery of ground plane 180. Surfaces 112 and 114 of chip 110 are essentially parallel to surfaces 182 and 184 of ground plane 180. Routing lines 156A and 156B are spaced and separated from ground plane 180 and the press-fit. Pillar 170A-1 is press-fit into opening 190, extends into but not through opening 190, contacts ground plane 180 only at the press-fit, and contacts only ground plane 180 at the press-fit. Ground plane 180 contacts pillar 170A-1 only at the press-fit, contacts only pillar 170A-1 at the press-fit, and is spaced and separated from and disposed vertically beyond chip 110, routing lines 156A and 156B, adhesive 160, connection joints 162A and 162B and encapsulant 164. The press-fit is confined to an interface between pillar 170A-1 and ground plane 180 at opening 190, and the press-fit and opening 190 are disposed within the periphery of chip 110. Insulative base 192 contacts and covers routing lines 156A and 156B, adhesive 160, pillars 170A-1, 170A-2 and 170B and ground plane 180, is sandwiched between routing lines 156A and 156B and ground plane 180, extends into and fills the remaining space in opening 190, extends vertically beyond pillars 170A-1, 170A-2 and 170B and ground plane 180 and is a gel.

For convenience of illustration, ground plane 180 is shown below chip 110, routing lines 156A and 156B, adhesive 160, connection joints 162A and 162B and encapsulant 164 to retain a single orientation throughout the figures for ease of comparison between the figures, although in this step the structure would be inverted so that ground plane 180 can pressed downwardly onto the remaining structure while pillar 170A-1 remains stationary.

FIGS. 24A, 24B, 24C and 24D are cross-sectional, cross-sectional, top and bottom views, respectively, of the structure after insulative base 192 is hardened.

The structure is placed in an oven and insulative base 192 is fully cured (C stage) and hardened at relatively low temperature in the range of 200 to 250° C. to form a solid adhesive insulative thermosetting polyimide layer that protects routing lines 156A and 156B and enhances the mechanically attachment of ground plane 180.

Insulative base 192 contacts and covers routing lines 156A and 156B, adhesive 160, encapsulant 164, pillars 170A-1, 170A-2 and 170B and ground plane 180, is sandwiched between routing lines 156A and 156B and ground plane 180, extends into and fills the remaining space in opening 190, and extends vertically beyond pillars 170A-1, 170A-2 and 170B and ground plane 180.

For convenience of illustration, insulative base 192 is shown below chip 110, routing lines 156A and 156B, adhesive 160, connection joints 162A and 162B, encapsulant 164 and pillars 170A-1, 170A-2 and 170B to retain a single orientation throughout the figures for ease of comparison between the figures, although in this step the structure would be inverted to assist the curing process.

FIGS. 25A, 25B, 25C and 25D are cross-sectional, cross-sectional, top and bottom views, respectively, of the structure after a lower portion of insulative base 192 is removed to expose pillars 170A-1, 170A-2 and 170B and ground plane 180.

The lower portion of insulative base 192 is removed by grinding. In particular, a rotating diamond sand wheel and distilled water are applied to the back-side of the structure. Initially, the diamond sand wheel grinds only insulative base 192. As the grinding continues, insulative base 192 becomes thinner as the grinded surface migrates vertically towards chip 110. Eventually the diamond sand wheel contacts ground plane 180, and as a result, begins to grind ground plane 180 as well. As the grinding continues, ground plane 180 and insulative base 192 become thinner as the grinded surfaces migrate vertically towards chip 110. Eventually the diamond sand wheel contacts pillars 170A-1, 170A-2 and 170B, and as a result, begins to grind pillars 170A-1, 170A-2 and 170B as well. As the grinding continues, pillars 170A-1, 170A-2 and 170B, ground plane 180 and insulative base 192 become thinner as the grinded surfaces migrate vertically towards chip 110. However, the grinding halts soon after it reaches pillars 170A-1, 170A-2 and 170B, and well before it reaches chip 110, routing lines 156A and 156B, adhesive 160, connection joints 162A and 162B or encapsulant 164. As a result, no appreciable amount of pillars 170A-1, 170A-2 and 170B or ground plane 180 is removed. Thereafter, the structure is rinsed in distilled water to remove contaminants.

At this stage, pillars 170A-1, 170A-2 and 170B, ground plane 180 and insulative base 192 are laterally aligned with one another and exposed.

FIGS. 26A, 26B, 26C and 26D are cross-sectional, cross-sectional, top and bottom views, respectively, of metal coating 194A-1 formed on pillar 170A-1 and ground plane 180, metal coating 194A-2 formed on pillar 170A-2 and metal coating 194B formed on pillar 170B.

Initially, the structure is dipped in an activator solution such as dilute palladium chloride of approximately 0.1 grams of palladium chloride and 5 cubic centimeters of hydrochloric acid per liter of water to render pillars 170A-1, 170A-2 and 170B and ground plane 180 catalytic to electroless nickel, then the structure is rinsed in distilled water to remove the palladium from encapsulant 164 and insulative base 192.

Thereafter, the structure is submerged in an electroless nickel plating solution such as Enthone Enplate I-1424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

The exposed copper features include palladium and therefore are catalytic to electroless nickel. Furthermore, encapsulant 164 and insulative base 192 are not catalytic to electroless nickel and therefore a plating mask is not necessary. As a result, the nickel deposits on the palladium-bearing copper surfaces. The nickel electroless plating operation continues until the nickel surface layers are about 4 microns thick. Thereafter, the structure is removed from the electroless nickel plating solution and rinsed in distilled water.

Thereafter, the assembly is removed from the electroless nickel plating solution and briefly submerged in an electroless gold plating solution such as is MacDermid PLANAR™ at 70° C. The exposed nickel surface layers are catalytic to electroless gold. Furthermore, encapsulant 164 and insulative base 192 are not catalytic to electroless gold and therefore a plating mask is not necessary. As a result, the gold deposits on the nickel surface layers. The gold electroless plating operation continues until the gold surface layers are about 0.5 microns thick. Thereafter, the structure is removed from the electroless gold plating solution and rinsed in distilled water.

In this manner, metal coatings 194A-1, 194A-2 and 194B are simultaneously formed during a single electroless plating operation. Metal coating 194A-1 contacts and is electrically connected to and is disposed vertically beyond pillar 170A-1 and ground plane 180, metal coating 194A-2 contacts and is electrically connected to and is disposed vertically beyond pillar 170A-2, and metal coating 194B contacts and is electrically connected to and is disposed vertically beyond pillar 170B.

Metal coatings 194A-1, 194A-2 and 194B are composed of a buried nickel layer that is 4 microns thick and a gold surface layer that is 0.5 microns thick. In metal coating 194A-1, the nickel and gold layers provide corrosion protection for pillar 170A-1 and ground plane 180. In metal coating 194A-2, the buried nickel layer provides the primary mechanical and electrical connection to pillar 170A-2, and the gold surface layer provides a wettable surface to facilitate solder reflow. In metal coating 194B, the buried nickel layer provides the primary mechanical and electrical connection to pillar 170B, and the gold surface layer provides a wettable surface to facilitate solder reflow. For convenience of illustration, the nickel and gold layers are shown as a single layer.

At this stage, the electrically conductive path between pad 116A and ground plane 180 requires routing line 156A, connection joint 162A and pillar 170A-1 and includes metal coating 194A-1 and the press-fit.

FIGS. 27A, 27B, 27C and 27D are cross-sectional, cross-sectional, top and bottom views, respectively, of solder balls 196A-2 and 196B formed on metal coatings 194A-2 and 194B.

Solder balls 196A-2 and 196B are initially tin-lead balls with spherical shapes. The tin-lead balls are dipped in flux to provide solder balls 196A-2 and 196B with flux surface coatings that surround the tin-lead balls. Thereafter, the structure is inverted so that metal coatings 194A-2 and 194B face upwardly, and solder balls 196A-2 and 196B are deposited on metal coatings 194A-2 and 194B, respectively. Solder balls 196A-2 and 196B weakly adhere to metal coatings 194A-2 and 194B due to the flux surface coatings of solder balls 196A-2 and 196B.

Thereafter, heat is applied to reflow solder balls 196A-2 and 196B. Metal coatings 194A-2 and 194B contain gold surface layers that provide wettable surfaces for solder reflow. As a result, solder balls 196A-2 and 196B wet metal coatings 194A-2 and 194B, respectively. The heat is then removed and solder balls 196A-2 and 196B cool and solidify.

Solder ball 196A-2 contacts and is electrically connected to metal coating 194A-2 and extends downwardly beyond metal coating 194A-2. Thus, solder ball 196A-2 provides a reflowable electrical connection to metal coating 194A-2 that protrudes downwardly from metal coating 194A-2 and is exposed.

Solder ball 196B contacts and is electrically connected to metal coating 194B and extends downwardly beyond metal coating 194B. Thus, solder ball 196B provides a reflowable electrical connection to metal coating 194B that protrudes downwardly from metal coating 194B and is exposed.

Solder balls 196A-2 and 196B are coplanar with one another, laterally spaced from one another and have essentially identical thicknesses.

At this stage, conductive trace 178A includes routing line 156A, pillars 170A-1 and 170A-2, metal coating 194A-2 and solder ball 196A-2, and conductive trace 178B includes routing line 156B, pillar 170B, metal coating 194B and solder ball 196B.

FIGS. 28A, 28B, 28C and 28D are cross-sectional, cross-sectional, top and bottom views, respectively, of the structure after encapsulant 164 and insulative base 192 are cut with an excise blade to singulate the assembly from other assemblies.

At this stage, the manufacture of semiconductor chip assembly 198 that includes chip 110, routing lines 156A and 156B, adhesive 160, connection joints 162A and 162B, encapsulant 164, pillars 170A-1, 170A-2 and 170B, ground plane 180, insulative base 192, metal coatings 194A-1, 194A-2 and 194B and solder balls 196A-2 and 196B can be considered complete.

The semiconductor assembly is a first-level package that contains a press-fit ground plane.

The semiconductor chip assembly includes other conductive traces embedded in encapsulant 164 and insulative base 192, and only two conductive traces 178A and 178B are shown for convenience of illustration. The other conductive traces resemble conductive trace 178B and each include a respective pillar, routing line, metal coating and solder ball. The other conductive traces are each electrically connected to a respective pad on chip 110 by a respective connection joint. The other conductive traces each extend beyond an outer edge of chip 110 and provide horizontal fan-out routing and vertical routing for their respective pads. Furthermore, the other conductive traces each include a downwardly protruding solder ball so that the assembly provides a ball grid array (BGA) package.

Chip 110 is designed with the pads electrically isolated from one another. However, the corresponding routing lines are initially electroplated on metal base 130 and electrically connected to one another by metal base 130. Thereafter, once metal base 130 is etched to form the pillars, the routing lines are electrically isolated from one is another by adhesive 160, encapsulant 164 and subsequently insulative base 192. Therefore, the pads remain electrically isolated from one another.

Advantageously, there is no plating bus or related circuitry that need be disconnected or severed from the conductive traces after the pillars are formed.

FIGS. 29A, 29B, 29C and 29D are cross-sectional, cross-sectional, top and bottom views, respectively, of a semiconductor chip assembly in accordance with a second embodiment of the present invention. In the second embodiment, the pillars are disposed within the periphery of the ground plane. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, routing line 256A corresponds to routing line 156A, etc.

Ground plane 280 is formed with openings 290A-1 (corresponding to opening 190), 290A-2 and 290B. Openings 290A-2 and 290B have a diameter of 560 microns at surfaces 282 and 284 and a diameter of 500 microns midway between surfaces 282 and 284. Thus, openings 290A-2 and 290B have a diameter that is 200 microns larger than the diameter of opening 290A-1 at a given depth. Openings 290A-2 and 290B are formed by a slight adjustment to the wet chemical etching operation previously described for opening 190. In particular, the photoresist layers (corresponding to photoresist layers 186 and 188) are patterned to contain additional openings that enable the wet chemical etch to simultaneously form openings 290A-1, 290A-2 and 290B. Furthermore, ground plane 280 has a larger surface area than ground plane 180.

Thereafter, chip 210 and ground plane 280 are positioned relative to one another so that chip 210 and pillars 270A-1, 270A-2 and 270B are disposed within the periphery of ground plane 280 and pillars 270A-1, 270A-2 and 270B are vertically aligned with openings 290A-1, 290A-2 and 290B, respectively.

Thereafter, ground plane 280 is moved vertically towards chip 210, and pillars 270A-1, 270A-2 and 270B enter openings 290A-1, 290A-2 and 290B, respectively. Pillar 270A-1 is press-fit into opening 290A-1, however pillars 270A-2 and 270B remain spaced and separated from and electrically isolated from ground plane 280, and insulative base 292 contacts and is sandwiched between pillars 270A-2 and 270B and ground plane 280 in openings 290A-2 and 290B, respectively.

Thereafter, insulative base 292 is hardened and grinded, and metal coatings 294A-1, 294A-2 and 294B and solder balls 296A-2 and 296B are formed.

Semiconductor chip assembly 298 includes chip 210, routing lines 256A and 256B, adhesive 260, connection joints 262A and 262B, encapsulant 264, pillars 270A-1, 270A-2 and 270B, ground plane 280, insulative base 292, metal coatings 294A-1, 294A-2 and 294B and solder balls 296A-2 and 296B.

FIGS. 30A, 30B, 30C and 30D are cross-sectional, cross-sectional, top and bottom views, respectively, of a semiconductor chip assembly in accordance with a third embodiment of the present invention. In the third embodiment, the insulative base is thinned by plasma etching. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, routing line 356A corresponds to routing line 156A, etc.

After insulative base 392 is hardened, the grinding operation is omitted and instead a blanket plasma etch is applied to the back-side of the structure, thereby reducing the thickness of insulative base 392 and exposing pillars 370A-1, 370A-2 and 370B and ground plane 380 without reducing the thickness of pillars 370A-1, 370A-2 and 370B and ground plane 380. As a result, insulative base 392 is slightly recessed relative to pillars 370A-1, 370A-2 and 370B and ground plane 380.

Thereafter, a brief cleaning step can be applied to remove oxides and debris that may be present on the exposed portions of pillars 370A-1, 370A-2 and 370B and ground plane 380. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pillars 370A-1, 370A-2 and 370B and ground plane 380 without damaging the structure.

Thereafter, metal coatings 394A-1, 394A-2 and 394B and solder balls 396A-2 and 396B are formed.

Semiconductor chip assembly 398 includes chip 310, routing lines 356A and 356B, adhesive 360, connection joints 362A and 362B, encapsulant 364, pillars 370A-1, 370A-2 and 370B, ground plane 380, insulative base 392, metal coatings 394A-1, 394A-2 and 394B and solder balls 396A-2 and 396B.

FIGS. 31A, 31B, 31C and 31D are cross-sectional, cross-sectional, top and bottom views, respectively, of a semiconductor chip assembly in accordance with a fourth embodiment of the present invention. In the fourth embodiment, the solder balls are omitted. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, routing line 456A corresponds to routing line 156A, etc.

The solder balls (corresponding to solder balls 196A-2 and 196B) are omitted. As a result, metal coatings 494A-2 and 494B are exposed and the assembly provides a land grid array (LGA) package.

Semiconductor chip assembly 498 includes chip 410, routing lines 456A and 456B, adhesive 460, connection joints 462A and 462B, encapsulant 464, pillars 470A-1, 470A-2 and 470B, ground plane 480, insulative base 492 and metal coatings 494A-1, 494A-2 and 494B.

FIGS. 32A, 32B, 32C and 32D are cross-sectional, cross-sectional, top and bottom views, respectively, of a semiconductor chip assembly in accordance with a fifth embodiment of the present invention. In the fifth embodiment, the conductive trace that is press-fit contains a single pillar and is adapted to be indirectly connected to external circuitry. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, routing line 556A corresponds to routing line 156A, etc.

The pillar (corresponding to pillar 170A-2) is omitted. Furthermore, the elongated region (corresponding to elongated region 146A) is shortened and the enlarged circular region (corresponding to enlarged circular region 148A-2) is omitted. This is accomplished by a slight adjustment to the electroplating operations previously described for etch masks 136A-1, 136A-2 and 136B and metal lines 144A and 144B. In particular, the photoresist layer (corresponding to photoresist layer 126) is patterned to omit the opening for the etch mask (corresponding to etch mask 136A-2), and therefore the etch mask (corresponding to etch mask 136A-2) is omitted. As a result, the pillar (corresponding to pillar 170A-2) and the metal coating (corresponding to metal coating 194A-2) are omitted, and likewise, the solder ball (corresponding to solder ball 196A-2) is omitted. In addition, the photoresist layer (corresponding to photoresist layer 140) is patterned to reshape the opening for the metal line (corresponding to metal line 144A), and therefore the metal line (corresponding to metal line 144A) is shortened and the enlarged circular region (corresponding to enlarged circular region 148A-2) is omitted.

Although conductive trace 578A is not adapted to be directly connected to external circuitry, conductive trace 578A can still be indirectly connected to external circuitry. For instance, the assembly can include another conductive trace (similar to conductive trace 578B) that is electrically connected to another ground pad (similar to pad 516A) of chip 510 by another connection joint (similar to connection joint 562B). Alternatively, the assembly can include another conductive trace (similar to conductive trace 178A) that is press-fit into ground plane 580 and electrically connected to another ground pad (similar to pad 516A) of another chip (similar to chip 510) by another connection joint (similar to connection joint 562A).

Semiconductor chip assembly 598 includes chip 510, routing lines 556A and 556B, adhesive 560, connection joints 562A and 562B, encapsulant 564, pillars 570A-1 and 570B, ground plane 580, insulative base 592, metal coatings 594A-1 and 594B and solder ball 596B.

FIGS. 33A, 33B, 33C and 33D are cross-sectional, cross-sectional, top and bottom views, respectively, of a semiconductor chip assembly in accordance with a sixth embodiment of the present invention. In the sixth embodiment, the conductive trace that is press-fit contains a single pillar and is adapted to be directly connected to external circuitry. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, chip 610 corresponds to chip 110, routing line 656A corresponds to routing line 156A, etc.

The pillar (corresponding to pillar 170A-2) is omitted. Furthermore, the elongated region (corresponding to elongated region 146A) is shortened, and the enlarged circular region (corresponding to enlarged circular region 148A-2), the metal coating (corresponding to metal coating 194A-2) and the solder ball (corresponding to solder ball 196A-2) are also omitted. This is accomplished in the manner previously described for the fifth embodiment.

Solder ball 696A-1 contacts and is electrically connected to pillar 670A-1 and ground plane 680. Solder ball 696A-1 is initially solder paste deposited into opening 690. Thereafter, before depositing insulative base 692 on the structure, pillar 670A-1 is press-fit into opening 690, thereby squeezing most of the solder paste out of opening 690, and then heat is applied and removed to reflow the solder paste into solder ball 696A-1. As a result, an air gap occupies the space between ground plane 680 and routing lines 656A and 656B, adhesive 660 and encapsulant 664 and that would have otherwise been occupied by the insulative base (corresponding to insulative base 192).

Thereafter, insulative base 692 is dispensed into the air gap and hardened, and the grinding operation is omitted since pillars 670A-1 and 670B, ground plane 680 and solder ball 696A-1 protrude from insulative base 692 and remain exposed. The metal coatings (corresponding to metal coatings 194A-1 and 194B) are omitted, and solder ball 696B is formed on pillar 670B.

Solder ball 696B can be promptly deposited on pillar 670B after forming pillar 670B to reduce native oxide formation on pillar 670B. Alternatively, an organic surface protectant such as HK 2000 can be promptly applied to the structure after forming pillar 670B to reduce native oxide formation on pillar 670B. In either case, pillar 670B provides a wettable surface to facilitate solder reflow.

Semiconductor chip assembly 698 includes chip 610, routing lines 656A and 656B, adhesive 660, connection joints 662A and 662B, encapsulant 664, pillars 670A-1 and 670B, ground plane 680, insulative base 692 and solder balls 696A-1 and 696B.

FIGS. 34A, 34B, 34C and 34D are cross-sectional, cross-sectional, top and bottom views, respectively, of a semiconductor chip assembly in accordance with a seventh embodiment of the present invention. In the seventh embodiment, the chip is flip-chip bonded. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, routing line 756A corresponds to routing line 156A, etc.

Connection joints 762A and 762B are initially solder bumps deposited on pads 716A and 716B, respectively. The solder bumps have hemispherical shapes and a diameter of 100 microns.

Routing lines 756A and 756B are configured to provide vertical alignment between pads 716A and 716B and terminals 754A and 754B, respectively. Thus, the elongated region (corresponding to elongated region 146B) is lengthened and terminals 754A and 754B are laterally shifted. This is accomplished by a slight adjustment to the electroplating operations previously described for metal lines 144A and 144B and terminals 154A and 154B. In particular, the photoresist layer (corresponding to photoresist layer 140) is patterned to reshape the opening for the metal line (corresponding to metal line 144B), and therefore the metal line (corresponding to metal line 144B) is lengthened. In addition, the photoresist layer (corresponding to photoresist layer 150) is patterned to laterally shift the openings for terminals 754A and 754B, and therefore terminals 754A and 754B are laterally shifted relative to routing lines 756A and 756B, respectively.

Chip 710 is inverted and positioned such that connection joint 762A contacts and is sandwiched between pad 716A and terminal 754A, and connection joint 762B contacts and is sandwiched between pad 716B and terminal 754B. Thereafter, heat is applied to reflow connection joints 762A and 762B, the heat is removed and connection joints 762A and 762B cool and solidify into hardened solder joints that mechanically attach and electrically connect pads 716A and 716B to routing lines 756A and 756B, respectively. Furthermore, connection joints 762A and 762B exhibit localized wetting and do not collapse, and chip 710 remains spaced and separated from routing lines 756A and 756B.

Thereafter, adhesive 760 is dispensed into and underfills the open gap between chip 710 and the metal base (corresponding to metal base 130) and between chip 710 and routing lines 756A and 756B, and then adhesive 760 is hardened. As a result, adhesive 760 contacts and is sandwiched between chip 710 and the metal base (corresponding to metal base 130) and between chip 710 and routing lines 756A and 756B, contacts connection joints 762A and 762B and is spaced and separated from pads 716A and 716B. Thus, adhesive 760 is significantly thicker than adhesive 160. A suitable underfill adhesive is Namics U8443.

Thereafter, encapsulant 764 is formed, pillars 770A-1, 770A-2 and 770B are formed, insulative base 792 is deposited on the structure, ground plane 780 is press-fit on the structure, insulative base 792 is hardened and grinded, and metal coatings 794A-1, 794A-2 and 794B and solder balls 796A-2 and 796B are formed.

Semiconductor chip assembly 798 includes chip 710, routing lines 756A and 756B, adhesive 760, connection joints 762A and 762B, encapsulant 764, pillars 770A-1, 770A-2 and 770B, ground plane 780, insulative base 792, metal coatings 794A-1, 794A-2 and 794B and solder balls 796A-2 and 796B.

FIGS. 35A, 35B, 35C and 35D are cross-sectional, cross-sectional, top and bottom views, respectively, of a semiconductor chip assembly in accordance with an eighth embodiment of the present invention. In the eighth embodiment, the chip is mechanically attached to the routing lines, then the pillars are formed, and then the connection joints are formed. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, routing line 856A corresponds to routing line 156A, etc.

Pads 816A and 816B are treated to accommodate an electroless nickel connection joint by forming a nickel surface layer on the aluminum base. For instance, chip 810 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of NaNO$_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Routing lines 856A and 856B are configured to provide vertical alignment with pads 816A and 816B, respectively, and the terminals (corresponding to terminals 154A and 154B) are omitted. Thus, the elongated region (corresponding to elongated region 146B) is lengthened, and routing lines 856A and 856B consist of the metal lines (corresponding to metal lines 144A and 144B, respectively). Furthermore, the elongated regions (corresponding to elongated regions 146A and 146B) have a width (orthogonal to the elongated length) of 50 microns. This is accomplished by a slight adjustment to the electroplating operations previously described for metal lines 144A and 144B and terminals 154A and 154B. In particular, the photoresist layer (corresponding to photoresist layer 140) is patterned to reshape the openings for the metal lines (corresponding to metal lines 144A and 144B), and therefore the metal lines (corresponding to metal lines 144A and 144B) have narrower widths and the metal line (corresponding to metal line 144B) is lengthened. In addition, the photoresist layers (corresponding to photoresist layers 150 and 152) and the associated electroplating operation for the terminals (corresponding to terminals 154A and 154B) are omitted.

Adhesive 860 is deposited on the metal base (corresponding to metal base 130) and routing lines 856A and 856B.

Chip 810 is inverted and positioned such that adhesive 860 contacts and is sandwiched between pad 816A and routing line 856A, and between pad 816B and routing line 856B. Furthermore, routing line 856A partially overlaps pad 816A, and routing line 856B partially overlaps pad 816B.

Thereafter, encapsulant 864 and pillars 870A-1, 870A-2 and 870B are formed.

Thereafter, through-hole 861A is formed in adhesive 860 that exposes pad 816A and routing line 856A, and through-hole 861B is formed in adhesive 860 that exposes pad 816B and routing line 856B.

Through-hole 861A is formed through adhesive 860 by applying a suitable etch that is highly selective of adhesive 860 with respect to pad 816A and routing line 856A. In this instance, a selective TEA CO$_2$ laser etch is applied. The laser is directed at and vertically aligned with and centered relative to pad 816A. The laser has a spot size of 70 microns, and pad 816A has a length and width of 100 microns. As a result, the laser strikes pad 816A and portions of routing line 856A and adhesive 860 that extend within the periphery of pad 816A, and ablates adhesive 860. The laser drills through and removes a portion of adhesive 860. However, portions of adhesive 860 that extend across the peripheral edges of pad 816A are outside the scope of the laser and remain intact. Likewise, routing line 856A shields a portion of adhesive 860 from the laser etch, and a portion of adhesive 860 sandwiched between pad 816A and routing line 856A remains intact. The laser etch is anisotropic, and therefore little or none of adhesive 860 sandwiched between pad 816A and routing line 856A is undercut or removed. Through-hole 861A may slightly undercut adhesive 860 between pad 816A and routing line 856A and have a diameter that is slightly larger than 70 microns due to the beam angle of the laser, the thermal effects of the laser, and/or the isotropic nature of an oxygen plasma or wet chemical cleaning step. For convenience of explanation, this slight undercut and enlargement is ignored. However, through-hole 861A is formed without damaging chip 810 or routing line 856A and does not extend into chip 810.

Through-hole 861B is formed in the same manner as through-hole 861A.

Thereafter, a brief cleaning step can be applied to remove oxides and debris that may be present on the exposed portions of pads 816A and 816B and routing lines 856A and 856B. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pads 816A and 816B and routing lines 856A and 856B without damaging the structure.

Thereafter, connection joints 862A and 862B are formed. Connection joint 862A is electrolessly plated on the exposed portions of pad 816A, routing line 856A and pillars 870A-1 and 870A-2, and connection joint 862B is electrolessly plated on the exposed portions of pad 816B, routing line 856B and pillar 870B.

The structure is submerged in an electroless nickel plating solution such as Enthone Enplate NI-424 at 85° C. Pads 816A and 816B include exposed nickel surface layers and therefore are catalytic to electroless nickel. Furthermore, adhesive 860 and encapsulant 864 are not catalytic to electroless nickel and therefore a plating mask is not necessary.

Connection joint 862A plates on pad 816A and eventually contacts and electrically connects pad 816A and routing line 856A in through-hole 861A. Likewise, connection joint 862B plates on pad 816B and eventually contacts and electrically connects pad 816B and routing line 856B in through-hole 861B. The electroless nickel plating operation continues until connection joints 862A and 862B are about 10 microns thick. Thereafter, the structure is removed from the electroless nickel plating solution and rinsed in distilled water. In this manner, connection joints 862A and 862B are simultaneously formed during a single electroless plating operation.

Thereafter, insulative base 892 is deposited on the structure, ground plane 880 is press-fit on the structure, insulative base 892 is hardened and grinded, and metal coatings 894A-1, 894A-2 and 894B and solder balls 896A-2 and 896B are formed.

Figure 35A:
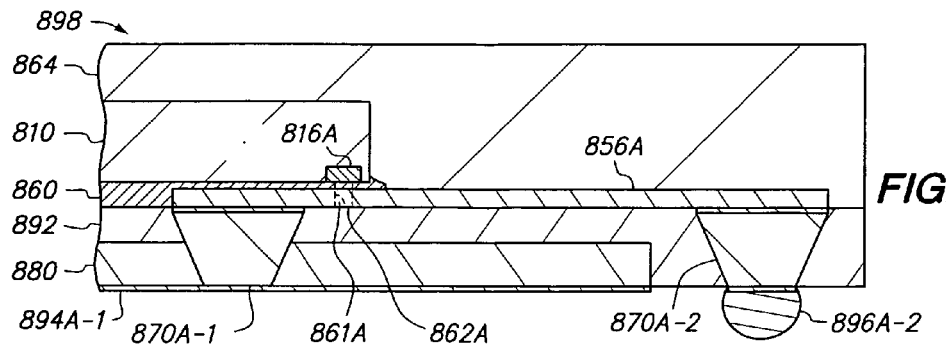
FIGS. 35A, 35B, 35C and 35D are cross-sectional, cross-sectional, top and bottom views, respectively, of a semiconductor chip assembly in accordance with an eighth embodiment of the present invention.
Figure 35B:
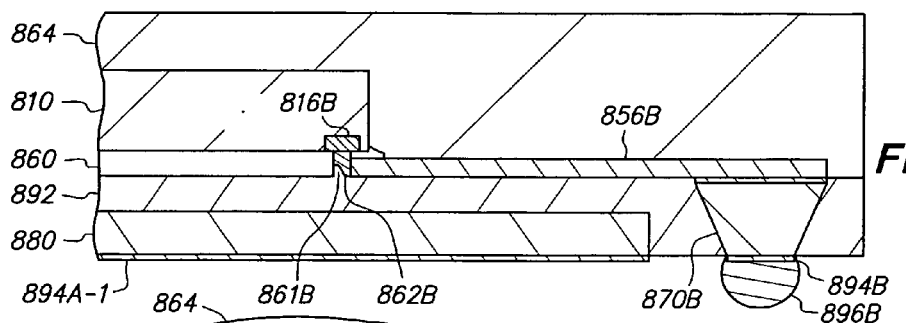
Figure 35C:
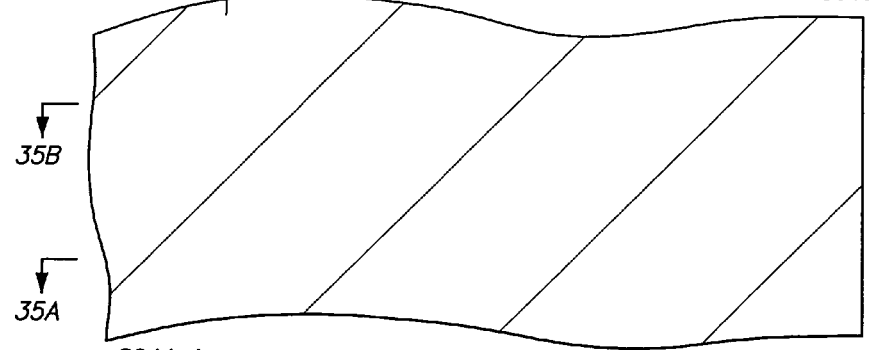
Figure 35D:
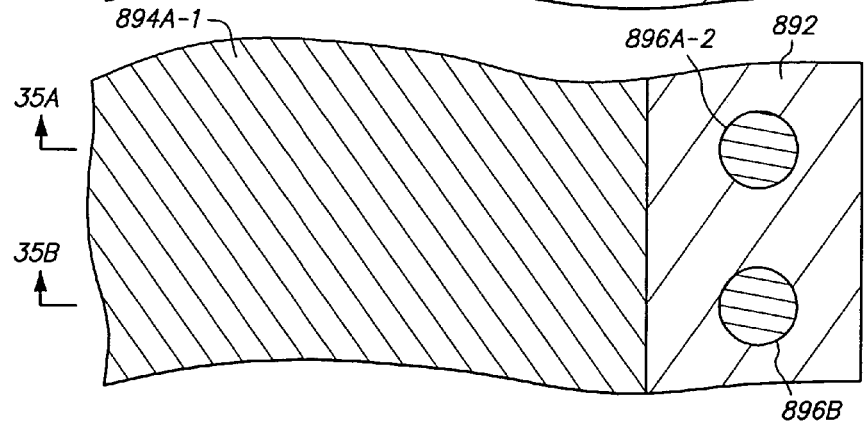
Figure 36A:
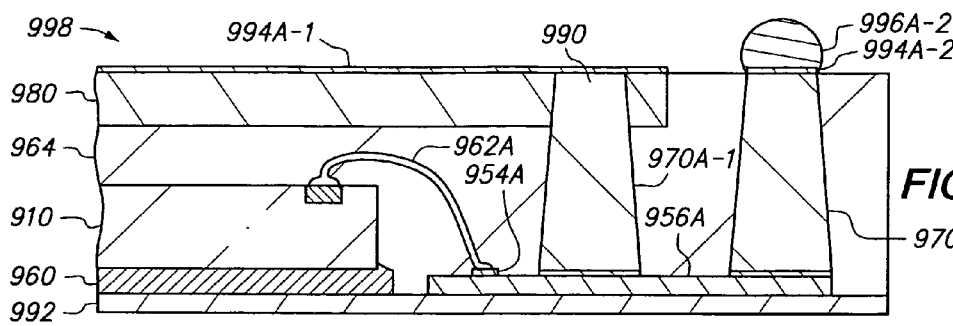
FIGS. 36A, 36B, 36C and 36D are cross-sectional, cross-sectional, top and bottom views, respectively, of a semiconductor chip assembly in accordance with a ninth embodiment of the present invention.
Figure 36B:
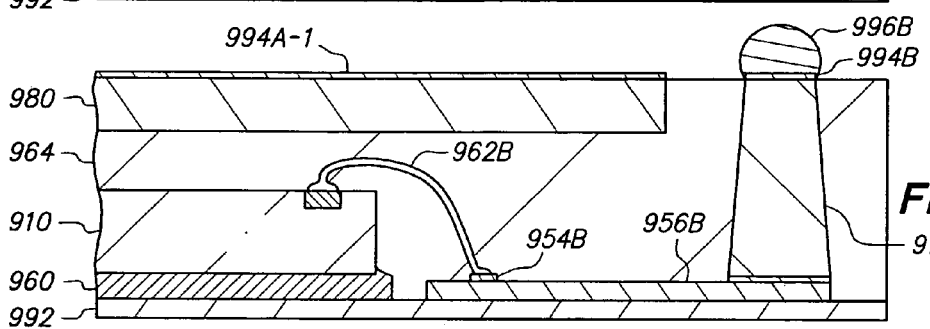
Figure 36C:
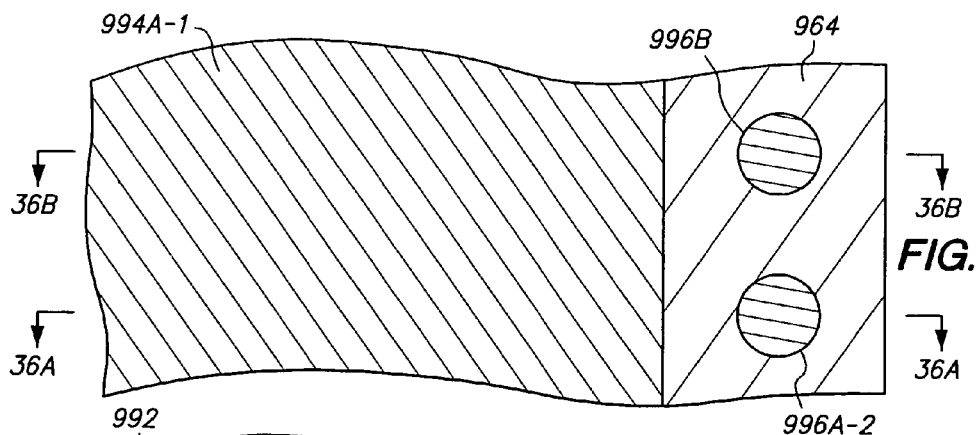
Figure 36D:
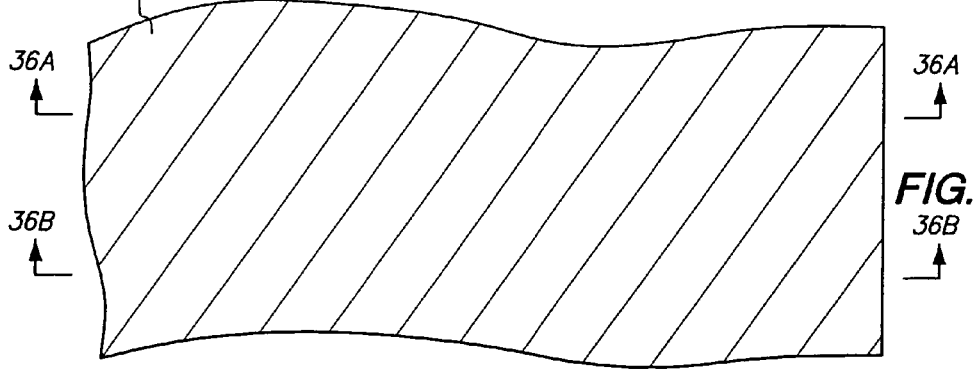

Through-hole 861A and connection joint 862A are shown in phantom in FIG. 35A.

Semiconductor chip assembly 898 includes chip 810, routing lines 856A and 856B, adhesive 860, connection joints 862A and 862B, encapsulant 864, pillars 870A-1, 870A-2 and 870B, ground plane 880, insulative base 892, metal coatings 894A-1, 894A-2 and 894B and solder balls 896A-2 and 896B.

FIGS. 36A, 36B, 36C and 36D are cross-sectional, cross-sectional, top and bottom views, respectively, of a semiconductor chip assembly in accordance with a ninth embodiment of the present invention. In the ninth embodiment, the pillars are formed, then the chip is mechanically attached to the pillars and the routing lines, and then the connection joints are formed. For purposes of brevity, any description in the first embodiment is incorporated herein insofar as the same is applicable, and the same description need not be repeated. Likewise, elements of the ninth embodiment similar to those in the first embodiment have corresponding reference numerals indexed at nine-hundred rather than one-hundred. For instance, chip 910 corresponds to chip 110, routing line 956A corresponds to routing line 156A, etc.

The metal plate (corresponding to metal plate 120) has a thickness of 300 microns.

Pillar 970A-1 is laterally shifted to be disposed outside the periphery of chip 910. Furthermore, the elongated region (corresponding to elongated region 146A) is shortened. This is accomplished by a slight adjustment to the electroplating operations previously described for etch masks 136A-1, 136A-2 and 136B and metal lines 144A and 144B. In particular, the photoresist layer (corresponding to photoresist layer 126) is patterned to laterally shift the opening for the etch mask (corresponding to etch mask 136A-1), and therefore pillar 970A-1 is laterally shifted relative to routing line 956A. In addition, the photoresist layer (corresponding to photoresist layer 140) is patterned to reshape the opening for the metal line (corresponding to metal line 144A), and therefore the metal line (corresponding to metal line 144A) is shortened.

Ground plane 980 is configured to laterally shift opening 990 to provide vertical alignment between pillar 970A-1 and opening 990. This is accomplished by a slight adjustment to the wet chemical etching operation previously described for opening 190. In particular, the photoresist layers (corresponding to photoresist layers 186 and 188) are patterned to laterally shift the openings that define opening 990, and therefore opening 990 is laterally shifted relative to ground plane 980.

Insulative base 992 is deposited on routing lines 956A and 956B and the metal base (corresponding to metal base 130), and then insulative base 992 is partially polymerized and forms a gel.

Thereafter, the structure is placed on a support (not shown) similar to metal plate 120 such that insulative base 992 contacts the support and is sandwiched between the metal base (corresponding to metal base 130) and the support and between routing lines 956A and 956B and the support while insulative base 992 is a gel, and then insulative base 992 is hardened.

Thereafter, pillars 970A-1, 970A-2 and 970B are formed and the etch masks (corresponding to etch masks 136A-1, 136A-2 and 136B) are removed.

Thereafter, a protective mask is deposited on the support, and then terminals 954A and 954B are formed.

Thereafter, adhesive 960 is deposited on insulative base 992, then chip 910 is placed on adhesive 960, and then adhesive 960 is hardened. Pillars 970A-1, 970A-2 and 970B are disposed outside the periphery of chip 910. Furthermore, pillars 970A-1, 970A-2 and 970B are not disposed vertically beyond chip 910, and instead extend across the thickness of chip 910.

Thereafter connection joints 962A and 962B are formed.

Thereafter, encapsulant 964 is formed. Encapsulant 964 is similar to insulative base 192 (rather than encapsulant 164). Accordingly, encapsulant 964 is deposited on chip 910, routing lines 956A and 956B, adhesive 960, connection joints 962A and 962B, pillars 970A-1, 970A-2 and 970B and insulative base 992, and then encapsulant 964 is partially polymerized and forms a gel.

Thereafter, ground plane 980 is press-fit on the structure, and then encapsulant 964 is hardened.

Thereafter, the protective mask is removed and then the support is etched and removed.

Thereafter, encapsulant 964 is grinded, and metal coatings 994A-1, 994A-2 and 994B and solder balls 996A-2 and 996B are formed.

Semiconductor chip assembly 998 includes chip 910, routing lines 956A and 956B, adhesive 960, connection joints 962A and 962B, encapsulant 964, pillars 970A-1, 970A-2 and 970B, ground plane 980, insulative base 992, metal coatings 994A-1, 994A-2 and 994B and solder balls 996A-2 and 996B.

FIGS. 37A, 37B, 37C, 37D, 37E and 37F are cross-sectional, cross-sectional, cross-sectional, cross-sectional, top and bottom views, respectively, of a semiconductor chip assembly in accordance with a tenth embodiment of the present invention. In the tenth embodiment, the assembly is a multi-chip module. For purposes of brevity, any description in the first embodiment is incorporated herein insofar as the same is applicable, and the same description need not be repeated. Likewise, elements of the tenth embodiment similar to those in the first embodiment have corresponding reference numerals indexed at one-thousand rather than one-hundred. For instance, chips 1010' and 1010" correspond to chip 110, routing lines 1056A' and 1056A" correspond to routing line 156A, etc.

Chips 1010' and 1010" include ground pads 1016A' and 1016A", respectively, and input/output pads 1016B' and 1016B", respectively.

Ground plane 1080 is formed with openings 1090' and 1090". Openings 1090' and 1090" are formed using a slight adjustment to the wet chemical etching operation previously described for opening 190. In particular, the photoresist layers (corresponding to photoresist layers 186 and 188) are patterned to contain additional openings that enable the wet chemical etch to simultaneously form openings 1090' and 1090". Furthermore, ground plane 1080 has a larger surface area than ground plane 180.

Routing lines 1056A', 1056B', 1056A" and 1056B" and the associated etch masks (corresponding to two sets of etch masks 136A-1, 136A-2 and 136B) are formed on the metal base (corresponding to metal base 130). This is accomplished by a slight adjustment to the electroplating operations previously described for etch masks 136A-1, 136A-2 and 136B, metal lines 144A and 144B and terminals 154A and 154B. In particular, the photoresist layer (corresponding to photoresist layer 126) is patterned to contain additional openings that enable the electroplating operation to simultaneously form the additional etch masks (corresponding to etch masks 136A-1, 136A-2 and 136B), and therefore two sets of etch masks are formed. As a result, additional pillars (corresponding to pillars 170A-1, 170A-2 and 170B) shall also be formed. In addition, the photoresist layer (corresponding to photoresist layer 140) is patterned to contain additional openings that enable the electroplating operation to simultaneously form the additional metal lines (corresponding to metal lines 144A and 144B), and therefore two sets of metal lines are formed. In addition, the photoresist layer (corresponding to photoresist layer 150) is patterned to contain additional openings that enable the electroplating operation to simultaneously form the additional terminals on the additional metal lines (corresponding to metal lines 144A and 144B), and therefore terminals 1054A', 1054B', 1054A" and 1054B" are formed.

Thereafter, adhesives 1060' and 1060" are deposited on the structure, then chips 1010' and 1010" are placed on adhesives 1060' and 1060", respectively, and then adhesives 1060' and 1060" are simultaneously hardened.

Thereafter, connection joints 1062A', 1062B', 1062A" and 1062B" are formed to contact and electrically connect pads 1016A', 1016B', 1016A" and 1016B" and routing lines 1056A', 1056B', 1056A" and 1056B", respectively. As a result, pads 1016A', 1016B', 1016A" and 1016B" are electrically connected to one another by the metal base, and routing lines 1056A', 1056B', 1056A" and 1056B" are electrically connected to one another by the metal base.

Thereafter, encapsulant 1064 is formed and contacts and covers chips 1010' and 1010", routing lines 1056A', 1056B', 1056A" and 1056B", adhesives 1060' and 1060" and connection joints 1062A', 1062B', 1062A" and 1062B".

Thereafter, the metal base is etched to form pillars 1070A-1', 1070A-2', 1070B', 1070A-1", 1070A-2" and 1070B" and remove the etch masks. Pillars 1070A-1' and 1070A-2' contact and are electrically connected to routing line 1056A', pillar 1070B' contacts and is electrically connected to routing line 1056B', pillars 1070A-1" and 1070A-2" contact and are electrically connected to routing line 1056A", and pillar 1070B" contacts and is electrically connected to routing line 1056B". As a result, pads 1016A', 1016B', 1016A" and 1016B" are electrically isolated from one another, and routing lines 1056A', 1056B', 1056A" and 1056B" are electrically isolated from one another.

Thereafter, insulative base 1092 is deposited on and contacts and covers routing lines 1056A', 1056B', 1056A" and 1056B", adhesives 1060' and 1060", encapsulant 1064 and pillars 1070A-1', 1070A-2', 1070B', 1070A-1", 1070A-2" and 1070B" and is a gel.

Thereafter, chips 1010' and 1010" and ground plane 1080 are positioned relative to one another so that chips 1010' and 1010" and pillars 1070A-1' and 1070A-1" are disposed within the periphery of ground plane 1080, pillars 1070A-2', 1070B', 1070A-2" and 1070B" are disposed outside the periphery of ground plane 1080, and pillars 1070A-1' and 1070A-1" are vertically aligned with openings 1090' and 1090", respectively.

Thereafter, ground plane 1080 is moved vertically towards chips 1010' and 1010", and pillars 1070A-1' and 1070A-1" enter openings 1090' and 1090", respectively. Pillars 1070A-1' and 1070A-1" are simultaneously press-fit into openings 1090' and 1090", respectively, at first and second press-fits, respectively, and pillars 1070A-2', 1070B', 1070A-2" and 1070B" remain spaced and separated from ground plane 1080. As a result, pillars 1070A-1' and 1070A-1" are electrically connected to ground plane 1080 and one another, and consequently pads 1016A' and 1016A" are also electrically connected to ground plane 1080 and one another, and pillars 1070A-2' and 1070A-2" are electrically connected to ground plane 1080 and one another. However, pillars 1070B' and 1070B" remain spaced and separated from and electrically isolated from ground plane 1080 and one another.

Thereafter, insulative base 1092 is hardened and grinded, and metal coatings 1094A-1, 1094A-2', 1094B', 1094A-2" and 1094B" and solder balls 1096A-2', 1096B', 1096A-2" and 1096B" are formed.

Chips 1010' and 1010" are coplanar with and laterally spaced from one another and have essentially identical thicknesses, routing lines 1056A', 1056B', 1056A" and 1056B" are coplanar with and laterally spaced from one another and have essentially identical thicknesses, and pillars 1070A-1', 1070A-2', 1070B', 1070A-1", 1070A-2" and 1070B" are coplanar with and laterally spaced from one another and have essentially identical thicknesses. Routing lines 1056A', 1056B', 1056A" and 1056B" are also spaced from ground plane 1080 and the first and second press-fits. Pillar 1070A-1', opening 1090' and the first press-fit are disposed within the periphery of chip 1010' and outside the periphery of chip 1010", and pillar 1070A-1", opening 1090" and the second press-fit are disposed within the periphery of chip 1010" and outside the periphery of chip

1010'. Metal coating 1094A-1 contacts and is electrically connected to pillars 1070A-1' and 1070A-1" and ground plane 1080.

The electrically conductive path between pad 1016A' and ground plane 1080 includes routing line 1056A', connection joint 1062A' and pillar 1070A-1' and the first press-fit and excludes routing line 1056A", connection joint 1062A", pillar 1070A-1" and the second press-fit, and the electrically conductive path between pad 1016A" and ground plane 1080 includes routing line 1056A", connection joint 1062A", pillar 1070A-1" and the second press-fit and excludes routing line 1056A', connection joint 1062A', pillar 1070A-1' and the first press-fit.

Figure 37A:
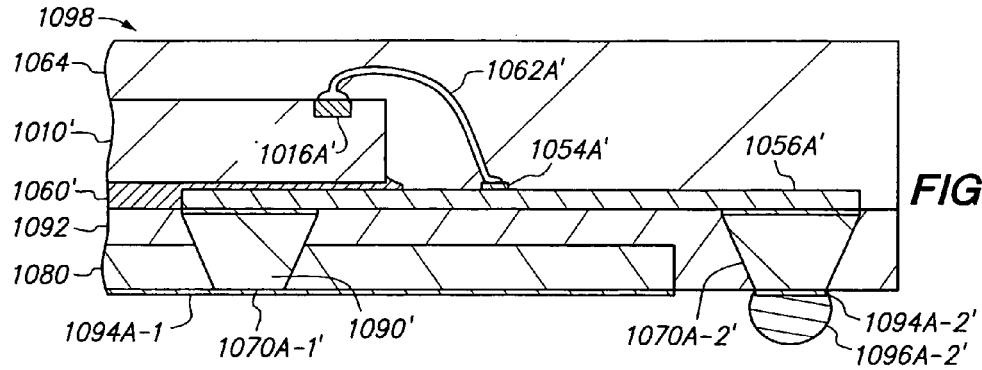
FIGS. 37A, 37B, 37C, 37D, 37E and 37F are cross-sectional, cross-sectional, cross-sectional, cross-sectional, top and bottom views, respectively, of a semiconductor chip assembly in accordance with a tenth embodiment of the present invention.
Figure 37B:
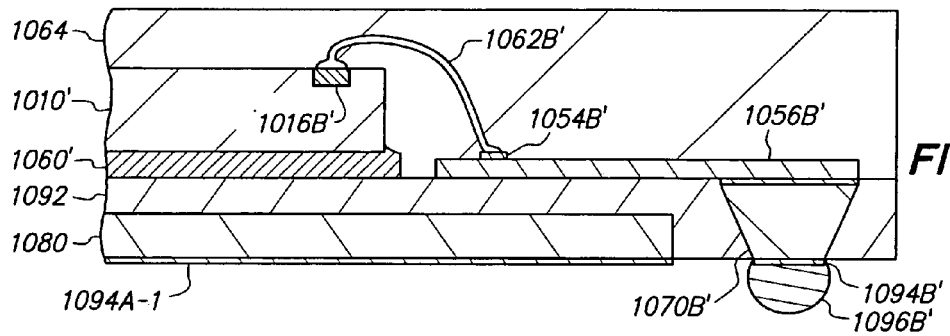
Figure 37C:
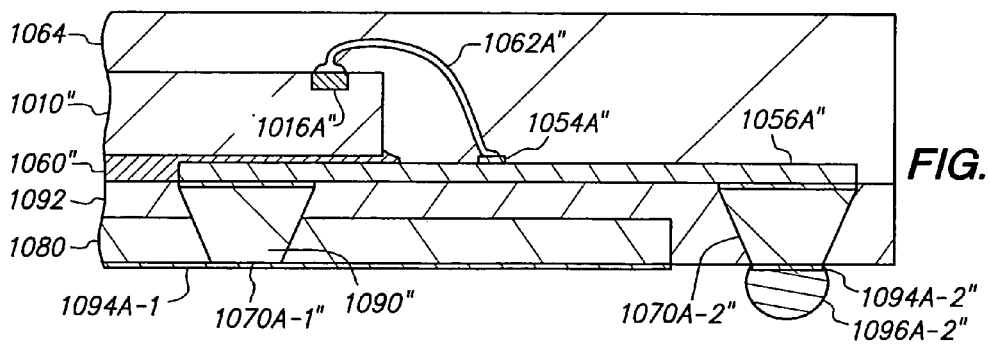
Figure 37D:
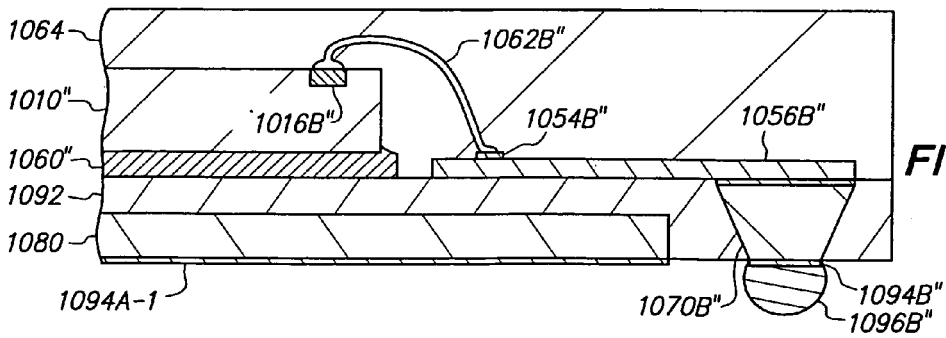
Figure 37E:
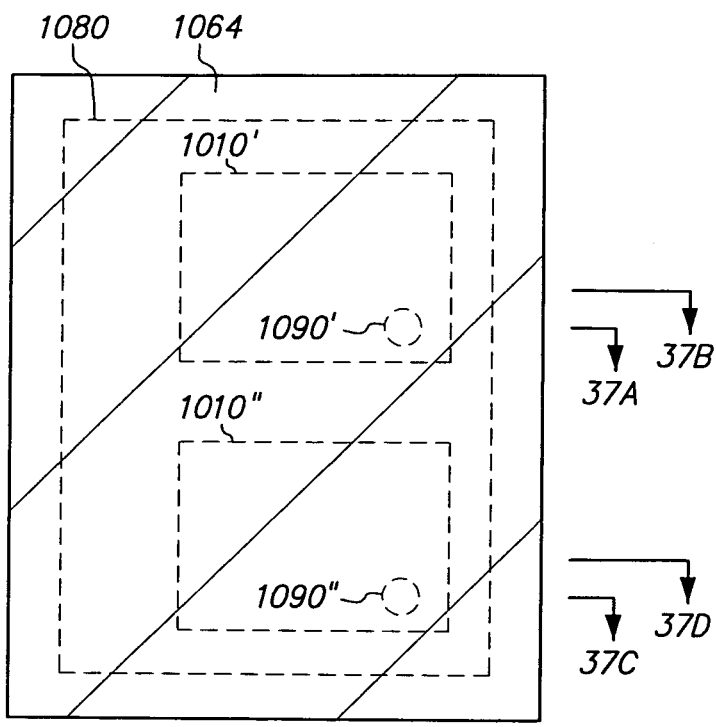
Figure 37F:
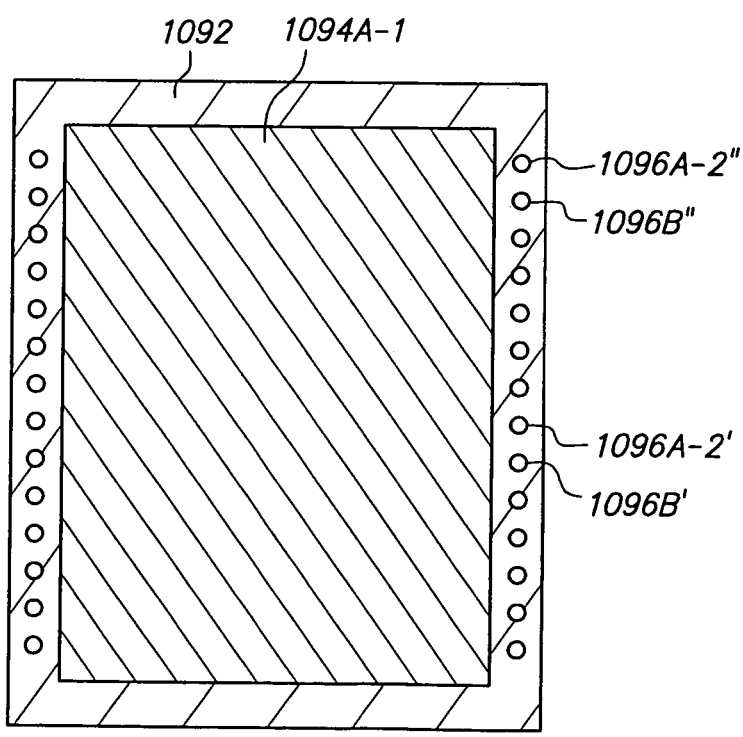

Chips 1010' and 1010", ground plane 1080 and openings 1090' and 1090" are shown in phantom in FIG. 37E.

Semiconductor chip assembly 1098 includes chips 1010' and 1010", routing lines 1056A', 1056B', 1056A" and 1056B", adhesives 1060' and 1060", connection joints 1062A', 1062B', 1062A" and 1062B", encapsulant 1064, pillars 1070A-1', 1070A-2', 1070B', 1070A-1", 1070A-2" and 1070B", ground plane 1080, insulative base 1092, metal coatings 1094A-1, 1094A-2', 1094B', 1094A-2" and 1094B" and solder balls 1096A-2', 1096B', 1096A-2" and 1096B".

The semiconductor chip assemblies described above are merely exemplary. Numerous other embodiments are contemplated. For instance, the insulative base, the metal coatings and/or the solder balls can be omitted. In addition, the embodiments described above can generally be combined with one another. For instance, the land grid array package in the second embodiment can be combined with the plasma etch in the third embodiment, the conductive traces in the fourth and fifth embodiments can be combined with the ground plane in the sixth embodiment, the flip-chip in the seventh embodiment and the connection joint in the eighth embodiment can be combined with the pillar in the ninth embodiment, and the multi-chip module in the tenth embodiment can be combined with any other embodiment. The embodiments described above can be mixed-and-matched with one another and with other embodiments depending on design and reliability considerations.

The metal plate, the metal layer, the metal base and the ground plane can be various metals such as copper, copper alloys, nickel, iron-nickel alloys, aluminum, and so on, and can be a single layer or multiple layers.

The metal base need not necessarily be dedicated solely to pillar formation. For instance, portions of the metal base can be selectively etched to form the pillars, and another portion of the metal base that is disposed within the periphery of the chip and spaced from the pillars can remain intact and provide a heat sink.

The routing line can be various conductive metals including copper, gold, nickel, silver, palladium, tin, combinations thereof, and alloys thereof. The preferred composition of the routing line will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). Likewise, the routing line can fan-in or fan-out or both.

The routing line can be formed on the metal base by numerous deposition techniques including electroplating and electroless plating. In addition, the routing line can be deposited on the metal base as a single layer or multiple layers. For instance, the routing line can be a 10 micron layer of gold, or alternatively, a 9.5 micron layer of nickel electroplated on a 0.5 micron layer of gold electroplated on a copper base to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the routing line can consist of a non-copper layer electroplated on a copper base and a copper layer electroplated on the non-copper layer. Suitable non-copper layers include nickel, gold, palladium and silver. After the routing line is formed, a wet chemical etch can be applied that is highly selective of copper with respect to the non-copper layer to etch the copper base and form the pillar without removing the copper or non-copper layers. The non-copper layer provides an etch stop that prevents the wet chemical etch from removing the copper layer. Furthermore, it is understood that in the context of the present invention, the routing line and the metal base are different metals (or metallic materials) even if a multi-layer routing line includes a single layer that is similar to the metal base (such as the example described above) or a single layer of a multi-layer metal base.

The routing line can also be formed by etching a metal layer attached to the metal base. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. In this manner, the routing line can be formed semi-additively and include unetched portions of the metal layer and the plated metal. Likewise, the routing line can be formed subtractively from the metal layer, regardless of whether the plated metal etch mask remains attached to the routing line.

The routing line can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds.

The etch mask can be a wide variety of materials including copper, gold, nickel, palladium, tin, solder, photoresist and epoxy, can be formed by a wide variety of processes including electroplating, electroless plating, printing, reflowing and curing, and can have a wide variety of shapes and sizes. The etch mask can be deposited on the metal base before, during or after the routing line is deposited on the metal base, can be disposed on a planar top surface of the metal base or a recess in the metal base, and if disposed in a recess need not necessarily fill the recess. Furthermore, the etch mask can remain permanently attached to the pillar or be removed as or after the pillar is formed.

The etch mask is undercut by a wet chemical etch that forms the pillar but can subsequently be confined to the tip of the pillar, for instance by dislodging a portion of the etch mask outside the tip of the pillar by mechanical brushing, sand blasting, air blowing or water rinsing, or by reflowing a solder etch mask when the pillar does not provide a wettable surface. Alternatively, a solder etch mask can be reflowed to conformally coat the entire pillar and contact the insulative base, for instance by depositing flux on the pillar so that the pillar provides a wettable surface before the solder reflow operation.

The pillar can be formed in numerous manners. For instance, the metal base can be etched to form a recess and expose what shall become the tip of the pillar, then the etch mask can be deposited in the recess, then the metal base can be attached to the chip, and then the metal base can be etched to undercut the metal base beneath the etch mask for the first time and form the pillar. Alternatively, the metal base can be etched to form a recess and expose what shall become the tip of the pillar, then the etch mask can be deposited in the recess, then the metal base can be etched to undercut the metal base beneath the etch mask for the first time, then the metal base can be attached to the chip, and then the metal base can be etched again to undercut the metal base beneath the etch mask for the second time and form the pillar. Preferably, etching the metal base forms the pillar from an unetched portion of the metal base also electrically isolates the pillar from other pillars. In either case, etching the metal base to form the pillar does not preclude etching and undercutting the metal base beneath the etch mask at an earlier stage (such as the example described above). Furthermore, etching the metal base to form the pillar can include an overetch such as 20 to 30% in order to assure that the pillar is electrically isolated from other pillars and compensate for non-uniformities and manufacturing tolerances.

The pad can have numerous shapes including a flat rectangular shape and a bumped shape. If desired, the pad can be treated to accommodate the connection joint.

Numerous adhesives can be applied to mechanically attach the chip to the routing line. For instance, the adhesive can be applied as a paste, a laminated layer, or a liquid applied by screen-printing, spin-on, or spray-on. The adhesive can be a single layer that is applied to a base and then contacted to the chip or a single layer that is applied to the chip and then contacted to a base. Similarly, the adhesive can be multiple layers with a first layer applied to a base, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The adhesive can be conductive or non-conductive. Non-conductive adhesives are preferred for low cost, high bonding strength applications, whereas thermally conductive adhesives are preferred when high thermal dissipation and a matched thermal coefficient of expansion are important, and electrically conductive adhesives are preferred when the chip needs to be grounded. Conductive adhesives can initially be an epoxy paste that includes an epoxy resin, a curing agent, an accelerator and a filler, that is subsequently cured or hardened to form a solid adherent layer. For thermally conductive adhesives, the filler can be an inert material such as silica (powdered fused quartz) that improves thermal conductivity, thermal shock resistance and thermal coefficient of expansion matching. For electrically conductive adhesives, the filler can be a metallic material such as silver particles that contact one another to provide an electrically conductive path.

The encapsulant can be deposited using a wide variety of techniques including printing and transfer molding. For instance, the encapsulant can be printed on the chip as an epoxy paste and then cured or hardened to form a solid adherent protective layer. The encapsulant can be any of the adhesives mentioned above. Furthermore, the encapsulant need not necessarily contact the chip. For instance, a glob-top coating can be deposited on the chip after mechanically attaching the chip to the routing line, and then the encapsulant can be formed on the glob-top coating. Moreover, the encapsulant need not necessarily contact the metal base, the routing line or the insulative base. For instance, a solder mask can be deposited on the metal base and the routing line, then the chip can be mechanically attached to the routing line, and then the encapsulant can be formed on the chip and the solder mask.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W.L. Gore & Associates of Eau Claire, Wis. are suitable.

The insulative base can be deposited in numerous manners, including printing and transfer molding. Furthermore, the insulative base can be deposited on and contact the pillar, the routing line, the adhesive and the encapsulant as a gel without contacting the ground plane, then contact the ground plane during the press-fitting operation and then be hardened, or alternatively, the insulative base can be deposited on and contact the pillar, the routing line, the adhesive, the encapsulant and the ground plane as a gel after the press-fitting operation and then be hardened.

The insulative base can be thinned to expose the pillar using a wide variety of techniques including grinding (including mechanical polishing and chemical-mechanical polishing), blanket laser ablation and blanket plasma etching. Likewise, the insulative base can have a selected portion removed to expose the pillar using a wide variety of techniques including selective laser ablation and selective plasma etching.

The insulative base can be laterally aligned with the pillar by grinding the insulative base without grinding the pillar or the ground plane, and then grinding the insulative base and the pillar without grinding the ground plane (if the pillar extends through and protrudes from the ground plane before the grinding occurs), or alternatively, by grinding the insulative base without grinding the pillar or the ground plane, then grinding the insulative base and the ground plane without grinding the pillar, and then grinding the insulative base, the pillar and the ground plane (if the pillar extends into but not through and is recessed relative to the ground plane before the grinding occurs).

The connection joint can be formed from a wide variety of materials including copper, gold, nickel, palladium, tin, alloys thereof, and combinations thereof, can be formed by a wide variety of processes including electroplating, electroless plating, ball bonding, solder reflowing, conductive adhesive curing, and welding, and can have a wide variety of shapes and sizes. The shape and composition of the connection joint depends on the composition of the routing line as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

The conductive trace can function as a power, ground or signal trace depending on the purpose of the associated chip pad.

The conductive trace can include a single pillar that is press-fit into the opening in the ground plane, or multiple pillars of which a single pillar is press-fit into the opening in the ground plane and the other pillars are not press-fit into openings in the ground plane, or multiple pillars that are press-fit into multiple openings in the ground plane. Furthermore, any pillar that is press-fit into an opening in the ground plane can be disposed within or outside the periphery of the chip. For instance, the conductive trace can include a single pillar that is press-fit into the opening in the ground plane and disposed within or outside the periphery of the chip, or the conductive trace can include multiple pillars that are press-fit into multiple openings in the ground plane and any combination of these pillars can be disposed within or outside the periphery of the chip.

The conductive trace can include a vertically protruding ball, pillar, columnar post, bumped terminal or contact terminal that extends vertically beyond the routing line. A pillar is particularly well-suited for reducing thermal mismatch related stress in the next level assembly, and a bumped terminal is particularly well-suited for providing vertical compliance in the next level assembly. Further details regarding conductive traces with various pillars, bumped terminals and contact terminals are set forth in U.S. application Ser. No. 09/878,649 filed Jun. 11, 2001 by Charles W. C. Lin entitled "Method of Making a Semiconductor Chip Assembly with a Conductive Trace Subtractively Formed Before and After Chip Attachment," U.S. application Ser. No. 09/878,626 filed Jun. 11, 2001 by Charles W. C. Lin entitled "Method of Connecting a Conductive Trace to a Semiconductor Chip," U.S. application Ser. No. 09/997,973 filed Nov. 29, 2001 by Charles W. C. Lin et al. entitled "Method of Connecting a Bumped Conductive Trace to a Semiconductor Chip," U.S. application Ser. No. 10/156,277 filed May 28, 2002 by Charles W. C. Lin entitled "Method of Making a Pillar in a Laminated Structure for a Semiconductor Chip Assembly," U.S. application Ser. No. 10/156,469 filed May 28, 2002 by Charles W. C. Lin et al. entitled "Method of Making a Bumped Terminal in a Laminated Structure for a Semiconductor Chip Assembly," U.S. application Ser. No. 10/165,483 filed Jun. 6, 2002 by Charles W. C. Lin et al. entitled "Method of Making a Contact Terminal with a Plated Metal Peripheral Sidewall Portion for a Semiconductor Chip Assembly," U.S. application Ser. No. 10/188,459 filed Jul. 3, 2002 by Charles W. C. Lin et al. entitled "Method of Connecting a Conductive Trace and an Insulative Base to a Semiconductor Chip using Multiple Etch Steps," U.S. application Ser. No. 10/356,372 filed Feb. 1, 2003 by Charles W. C. Lin et al. entitled "Method of Connecting a Conductive Trace and an Insulative Base to a Semiconductor Chip using Multiple Etch Steps," U.S. application Ser. No. 10/356,800 filed Feb. 1, 2003 by Charles W. C. Lin et al. entitled "Method of Connecting an Additively and Subtractively Formed Conductive Trace and an Insulative Base to a Semiconductor Chip," U.S. application Ser. No. 10/403,736 filed Mar. 31, 2003 by Charles W. C. Lin et al. entitled "Method of Making a Semiconductor Chip Assembly with Simultaneously Formed Interconnect and Connection Joint," and U.S. application Ser. No. 10/714,794 filed Nov. 17, 2003 by Chuen Rong Leu et al. entitled "Semiconductor Chip Assembly with Embedded Metal Pillar" which are incorporated by reference.

After the conductive trace is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

A soldering material or solder ball can be deposited on the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

It is understood that, in the context of the present invention, press-fitting the pillar into the opening in the ground plane, thereby electrically connecting the ground plane and the pad, means that press-fitting the pillar into the opening in the ground plane electrically connects the ground plane and the pad. This is true regardless of whether the pillar contacts and is electrically connected to the ground plane during the press-fit operation before the press-fit is complete. This is also true regardless of whether the pillar contacts and is electrically connected to the ground plane as the pillar and the ground plane move towards one another during the press-fit operation. This is also true regardless of whether the pillar contacts and is electrically connected to the ground plane as the pillar tunnels into the opening in the ground plane during the press-fit operation. This is also true regardless of whether the conductive trace includes multiple pillars that are press-fit into multiple openings in the ground plane at essentially the same time during the press-fit operation. This is also true regardless of whether another conductive trace electrically connected to another ground pad includes another pillar and the pillars are press-fit into openings in the ground plane at essentially the same time during the press-fit operation. This is also true regardless of whether the connection joint that contacts and electrically connects the conductive trace and the pad includes or requires a passive component such as a capacitor or a resistor. This is also true regardless of whether the electrically conductive path between the ground plane and the pad includes or requires a passive component such as a capacitor or a resistor. This is also true regardless of whether the metal coating or another conductor contacts and is electrically connected to the pillar and the ground plane after the press-fit operation.

The "upward" and "downward" vertical directions do not depend on the orientation of the assembly, as will be readily apparent to those skilled in the art. For instance, the pillar tapers inwardly and extends vertically beyond the routing line in the "downward" direction, regardless of whether the assembly is inverted and/or mounted on a printed circuit board. Likewise, the routing line extends "laterally" from the pillar regardless of whether the assembly is inverted, rotated or slated. Thus, the "upward" and "downward" directions are opposite one another and orthogonal to the "lateral" direction. Moreover, the encapsulant and the chip are shown above the insulative base with a single orientation throughout the drawings for ease of comparison between the figures, although the assembly and its components may be inverted at various manufacturing stages.

The working format for the semiconductor chip assembly can be a single assembly or multiple assemblies based on the manufacturing design. For instance, a single assembly can be manufactured individually. Alternatively, numerous assemblies can be simultaneously batch manufactured using a single metal base, a single encapsulant and a single insulative base and then separated from one another. For example, the routing lines and etch masks for multiple assemblies can be electroplated on the metal base, then separate spaced adhesives for the respective assemblies can be selectively deposited on the metal base, then the chips can be placed on the corresponding adhesives, then the adhesives can be simultaneously hardened, then the connection joints for the respective assemblies can be formed, then the encapsulant can be deposited on the metal base, the routing lines, the connection joints, the chips and the adhesives, then the metal base can be etched to simultaneously form the pillars, then the insulative base can be deposited on the pillars, the routing lines, the adhesives and the encapsulant as a gel, then separate spaced ground planes can be press-fit on the respective assemblies, then the insulative base can be hardened and grinded, then the metal coatings can be simultaneously electrolessly plated on the respective pillars and ground planes, then the solder balls can be deposited and simultaneously reflowed on the respective assemblies, and then the encapsulant and the insulative base can be cut, thereby separating the individual assemblies from one another.

The semiconductor chip assembly can have a wide variety of packaging formats as required by the next level assembly. For instance, the conductive traces can be configured so that the assembly is a grid array such as a ball grid array (BGA), column grid array (CGA), land grid array (LGA) or pin grid array (PGA).

Advantageously, the semiconductor chip assembly of the present invention is reliable and inexpensive. The encapsulant and the insulative base can protect the chip from handling damage, provide a known dielectric barrier for the conductive trace and protect the assembly from contaminants and unwanted solder reflow during the next level assembly. The encapsulant can provide mechanical support for the conductive trace after the pillar is formed. The mode of the connection can shift from the initial mechanical coupling to metallurgical coupling to assure sufficient metallurgical bond strength. Furthermore, the conductive trace can be mechanically and metallurgically coupled to the chip without wire bonding, TAB, solder or conductive adhesive, although the process is flexible enough to accommodate these techniques if desired. The process is highly versatile and permits a wide variety of mature connection joint technologies to be used in a unique and improved manner. The tapered pillar is particularly well-suited for reducing thermal mismatch related stress in the next level assembly and yields enhanced reliability for the next level assembly that exceeds that of conventional BGA packages. Furthermore, the ground plane can be mechanically and electrically coupled to the pillar conveniently and cost-effectively using a press-fit. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A semiconductor chip assembly, comprising:
   a semiconductor chip that includes a conductive pad;
   a conductive trace; and
   a ground plane, wherein the conductive trace is press-fit into an opening in the ground plane, an electrically conductive path between the ground plane and the pad includes the press-fit, and the assembly is devoid of a printed circuit board.

2. The assembly of claim 1, wherein the chip is proximate to the ground plane.

3. The assembly of claim 1, wherein the chip is within a periphery of the ground plane.

4. The assembly of claim 1, wherein the chip includes first and second opposing major surfaces, the ground plane includes first and second opposing major surfaces, and the first and second surfaces of the chip are essentially parallel to the first and second surfaces of the ground plane.

5. The assembly of claim 1, wherein the conductive trace includes a pillar and a routing line, the pillar extends vertically from the routing line and is press-fit into the opening, and the routing line extends laterally from the pillar and is spaced from the ground plane.

6. The assembly of claim 1, wherein the conductive trace contacts the ground plane only at the press-fit.

7. The assembly of claim 1, wherein the conductive trace contacts only the ground plane at the press-fit.

8. The assembly of claim 1, wherein the opening extends vertically from the chip only as far as the ground plane.

9. The assembly of claim 1, wherein the opening is disposed within a periphery of the chip.

10. The assembly of claim 1, wherein the press-fit is confined to an interface between the conductive trace and the ground plane.

11. The assembly of claim 1, wherein the press-fit is disposed within a periphery of the chip.

12. The assembly of claim 1, wherein the electrically conductive path requires the press-fit.

13. The assembly of claim 1, wherein the electrically conductive path is devoid of a pressure contact other than the press-fit.

14. The assembly of claim 1, wherein the electrically conductive path is devoid of another ground plane.

15. The assembly of claim 1, including an encapsulant that contacts and covers the chip and is spaced from the ground plane.

16. The assembly of claim 1, including an insulative base that contacts the ground plane and is spaced from the chip.

17. The assembly of claim 1, including a metal coating that contacts and covers the ground plane, contacts the conductive trace, covers the opening and is exposed.

18. The assembly of claim 1, wherein the assembly is devoid of another chip.

19. The assembly of claim 1, wherein the assembly is devoid of another ground plane.

20. The assembly of claim 1, wherein the assembly is a first-level package.

21. A semiconductor chip assembly, comprising:
a semiconductor chip that includes first and second opposing major surfaces, wherein the first surface of the chip includes a conductive pad;
a conductive trace that includes a pillar and a routing line, wherein the pillar is adjacent to and extends vertically from the routing line, and the routing line is adjacent to and extends laterally from the pillar;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane, an electrically conductive path between the ground plane and the pad includes the pillar, the routing line, the connection joint and the press-fit, and the assembly is devoid of a printed circuit board.

22. The assembly of claim 21, wherein the chip is proximate to and within a periphery of the ground plane.

23. The assembly of claim 21, wherein the conductive trace contacts the ground plane only at the press-fit.

24. The assembly of claim 21, wherein the conductive trace contacts only the ground plane at the press-fit.

25. The assembly of claim 21, wherein the conductive trace is disposed vertically beyond the chip.

26. The assembly of claim 21, wherein the pillar has a conical shape in which its diameter decreases as it extends vertically from the routing line, and the routing line is an essentially flat planar lead.

27. The assembly of claim 21, wherein the pillar and the routing line contact one another, are metallurgically bonded to one another and are not integral with one another.

28. The assembly of claim 21, wherein the opening extends vertically from the chip only as far as the ground plane.

29. The assembly of claim 21, wherein the press-fit is confined to an interface between the pillar and the ground plane.

30. The assembly of claim 21, wherein the connection joint is a wire bond.

31. The assembly of claim 21, wherein the pillar, the opening and the press-fit are disposed within a periphery of the chip.

32. The assembly of claim 31, wherein the routing line and the connection joint extend within and outside the periphery of the chip.

33. The assembly of claim 21, wherein the ground plane is a single-piece metal plate.

34. The assembly of claim 21, wherein the ground plane is disposed vertically beyond the chip.

35. The assembly of claim 21, wherein the electrically conductive path requires the routing line and the connection joint.

36. The assembly of claim 21, wherein the electrically conductive path requires the pillar.

37. The assembly of claim 21, including an encapsulant that contacts and covers the chip, covers the pillar and the routing line and is spaced from the ground plane.

38. The assembly of claim 21, including an insulative base that contacts the pillar, the routing line and the ground plane, is sandwiched between the routing line and the ground plane and is spaced from the chip.

39. The assembly of claim 21, including a metal coating that contacts and covers the pillar and the ground plane, covers the opening, is spaced from the routing line and is exposed.

40. The assembly of claim 21, wherein the assembly is a first-level package.

41. A semiconductor chip assembly, comprising:
a semiconductor chip that includes first and second opposing major surfaces, wherein the first surface of the chip includes a conductive pad;
a conductive trace that includes a pillar and a routing line, wherein the pillar is adjacent to and extends vertically from the routing line and has a diameter that decreases as it extends vertically from the routing line, the routing line is adjacent to and extends laterally from the pillar and is an essentially flat planar lead, and the pillar and the routing line contact one another, are metallurgically bonded to one another and are not integral with one another;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, an electrically conductive path between the ground plane and the pad includes the pillar, the routing line, the connection joint and the press-fit, and the assembly is devoid of a printed circuit board.

42. The assembly of claim 41, wherein the chip is proximate to and within a periphery of the ground plane.

43. The assembly of claim 41, wherein the conductive trace contacts the ground plane only at the press-fit, and the conductive trace contacts only the ground plane at the press-fit.

44. The assembly of claim 41, wherein the conductive trace is disposed vertically beyond the chip, and the ground plane is disposed vertically beyond the chip, the routing line and the connection joint.

45. The assembly of claim 41, wherein the opening extends vertically from the chip only as far as the ground plane, and the press-fit is confined to an interface between the pillar and the ground plane.

46. The assembly of claim 41, wherein the connection joint is a wire bond.

47. The assembly of claim 41, wherein the pillar, the opening and the press-fit are disposed within a periphery of the chip.

48. The assembly of claim 41, wherein the electrically conductive path requires the routing line and the connection joint.

49. The assembly of claim 41, including an encapsulant that contacts and covers the chip, covers the pillar and the routing line and is spaced from the ground plane, and an insulative base that contacts the pillar, the routing line and the ground plane, is sandwiched between the routing line and the ground plane and is spaced from the chip.

50. The assembly of claim 41, wherein the assembly is a first-level package.

51. A semiconductor chip assembly, comprising:
   a semiconductor chip that includes first and second opposing major surfaces, wherein the first surface of the chip includes a conductive pad;
   a conductive trace that includes a pillar and a routing line, wherein the pillar is adjacent to and extends vertically from the routing line, and the routing line is adjacent to and extends laterally from the pillar;
   a connection joint that contacts and electrically connects the routing line and the pad; and
   a ground plane that includes first and second opposing major surfaces and an opening therebetween, wherein the first and second surfaces of the chip are essentially parallel to the first and second surfaces of the ground plane, the pillar is press-fit into the opening, the routing line is 1 spaced from the ground plane and the press-fit, the conductive trace contacts the ground plane only at the press-fit, the conductive trace contacts only the ground plane at the press-fit, an electrically conductive path between the ground plane and the pad includes the pillar, the routing line, the connection joint and the press-fit, and the assembly is devoid of a printed circuit board.

52. The assembly of claim 51, wherein the chip is proximate to and within a periphery of the ground plane.

53. The assembly of claim 51, wherein the pillar has a diameter that decreases as it extends vertically from the routing line, the routing line is an essentially flat planar lead, and the pillar and the routing line contact one another, adhere to one another and are not integral with one another.

54. The assembly of claim 51, wherein the conductive trace is disposed vertically beyond the chip, and the ground plane is disposed vertically beyond the chip, the routing line and the connection joint.

55. The assembly of claim 51, wherein the opening extends vertically from the chip only as far as the ground plane, and the press-fit is confined to an interface between the pillar and the ground plane.

56. The assembly of claim 51, wherein the connection joint is a wire bond.

57. The assembly of claim 51, wherein the pillar, the opening and the press-fit are disposed within a periphery of the chip.

58. The assembly of claim 51, wherein the electrically conductive path requires the pillar, the routing line and the connection joint.

59. The assembly of claim 51, including an encapsulant that contacts and covers the chip, covers the pillar and the routing line and is spaced from the ground plane, and an insulative base that contacts the pillar, the routing line and the ground plane, is sandwiched between the routing line and the ground plane and is spaced from the chip.

60. The assembly of claim 51, wherein the assembly is a first-level package.

61. A semiconductor chip assembly, comprising:
   a semiconductor chip that includes first and second opposing major surfaces, wherein the first surface of the chip includes a conductive pad;
   a conductive trace that includes a pillar and a routing line, wherein the pillar is adjacent to and extends vertically from the routing line, and the routing line is adjacent to and extends laterally from the pillar;
   a connection joint that contacts and electrically connects the routing line and the pad; and
   a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, the pillar, the opening and the press-fit are disposed vertically beyond the chip and within a periphery of the chip, an electrically conductive path between the ground plane and the pad includes the pillar, the routing line, the connection joint and the press-fit, and the assembly is devoid of a printed circuit board.

62. The assembly of claim 61, wherein the chip is proximate to and within a periphery of the ground plane.

63. The assembly of claim 61, wherein the pillar has a diameter that decreases as it extends vertically from the routing line, the routing line is an essentially flat planar lead, and the pillar and the routing line contact one another, adhere to one another and are not integral with one another.

64. The assembly of claim 61, wherein the conductive trace contacts the ground plane only at the press-fit, and the conductive trace contacts only the ground plane at the press-fit.

65. The assembly of claim 61, wherein the conductive trace is disposed vertically beyond the chip, and the ground plane is disposed vertically beyond the chip, the routing line and the connection joint.

66. The assembly of claim 61, wherein the opening extends vertically from the chip only as far as the ground plane, and the press-fit is confined to an interface between the pillar and the ground plane.

67. The assembly of claim 61, wherein the connection joint is a wire bond.

68. The assembly of claim 61, wherein the electrically conductive path requires the pillar, the routing line and the connection joint.

69. The assembly of claim 61, including an encapsulant that contacts and covers the chip, covers the pillar and the routing line and is spaced from the ground plane, and an insulative base that contacts the pillar, the routing line and the ground plane, is sandwiched between the routing line and the ground plane and is spaced from the chip.

70. The assembly of claim 61, wherein the assembly is a first-level package.

71. A semiconductor chip assembly, comprising:
   a semiconductor chip that includes first and second opposing major surfaces, wherein the first surface of the chip includes a conductive pad;
   a conductive trace that includes a pillar and a routing line, wherein the pillar is adjacent to and extends vertically from the routing line, and the routing line is adjacent to and extends laterally from the pillar;

a connection joint that contacts and electrically connects the routing line and the pad; and a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, an electrically conductive path between the ground plane and the pad requires the routing line and the connection joint, includes the pillar and the press-fit and is devoid of another ground plane and another press-fit, and the assembly is devoid of a printed circuit board.

72. The assembly of claim 71, wherein the chip is proximate to and within a periphery of the ground plane.

73. The assembly of claim 71, wherein the pillar has a diameter that decreases as it extends vertically from the routing line, the routing line is an essentially flat planar lead, and the pillar and the routing line contact one another, adhere to one another and are not integral with one another.

74. The assembly of claim 71, wherein the conductive trace contacts the ground plane only at the press-fit, and the conductive trace contacts only the ground plane at the press-fit.

75. The assembly of claim 71, wherein the conductive trace is disposed vertically beyond the chip, and the ground plane is disposed vertically beyond the chip, the routing line and the connection joint.

76. The assembly of claim 71, wherein the opening extends vertically from the chip only as far as the ground plane, and the press-fit is confined to an interface between the pillar and the ground plane.

77. The assembly of claim 71, wherein the connection joint is a wire bond.

78. The assembly of claim 71, wherein the pillar, the opening and the press-fit are disposed within a periphery of the chip.

79. The assembly of claim 71, including an encapsulant that contacts and covers the chip, covers the pillar and the routing line and is spaced from the ground plane, and an insulative base that contacts the pillar, the routing line and the ground plane, is sandwiched between the routing line and the ground plane and is spaced from the chip.

80. The assembly of claim 71, wherein the assembly is a first-level package.

81. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line, and the routing line is adjacent to and extends laterally from the pillar;

a connection joint that contacts and electrically connects the routing line and the pad;

a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, and an electrically conductive path between the ground plane and the pad includes the pillar, the routing line, the connection joint and the press-fit;

an encapsulant that contacts and covers the chip, covers the pillar and the routing line and is spaced from the ground plane; and an insulative base that contacts the pillar, the routing line and the ground plane, is sandwiched between the routing line and the ground plane and is spaced from the chip.

82. The assembly of claim 81, wherein the chip is proximate to and within a periphery of the ground plane.

83. The assembly of claim 81, wherein the pillar has a diameter that decreases as it extends vertically from the routing line, the routing line is an essentially flat planar lead, and the pillar and the routing line contact one another, adhere to one another and are not integral with one another.

84. The assembly of claim 81, wherein the conductive trace is disposed vertically beyond the chip, and the ground plane is disposed vertically beyond the chip, the routing line and the connection joint.

85. The assembly of claim 81, wherein the opening extends vertically from the chip only as far as the ground plane, and the press-fit is confined to an interface between the pillar and the ground plane.

86. The assembly of claim 81, wherein the connection joint is a wire bond.

87. The assembly of claim 81, wherein the pillar, the opening and the press-fit are disposed within a periphery of the chip.

88. The assembly of claim 81, wherein the electrically conductive path requires the routing line and the connection joint.

89. The assembly of claim 81, wherein the encapsulant contacts the routing line and the insulative base.

90. The assembly of claim 81, wherein the assembly is a first-level package.

91. A semiconductor chip assembly, comprising:

a semiconductor chip that includes first and second opposing major surfaces, wherein the first surface of the chip includes a conductive pad;

a conductive trace that includes a first pillar, a second pillar and a routing line, wherein the first pillar is adjacent to and extends vertically from the routing line, the routing line is adjacent to and extends laterally from the first pillar, the second pillar is adjacent to and extends vertically from the routing line, and the routing line is adjacent to and extends laterally from the second pillar;

a connection joint that contacts and electrically connects the routing line and the pad; and a ground plane that includes first and second opposing major surfaces and an opening therebetween, wherein the first and second surfaces of the chip are essentially parallel to the first and second surfaces of the ground plane, the first pillar is press-fit into the opening, the routing line is spaced from the ground plane and the press-fit, an electrically conductive path between the ground plane and the pad includes the first pillar, the routing line, the connection joint and the press-fit, the second pillar is electrically connected to the pad and is not in an electrically conductive path between the ground plane and the pad, and the assembly is devoid of a printed circuit board.

92. The assembly of claim 91, wherein the chip is proximate to and within a periphery of the ground plane.

93. The assembly of claim 91, wherein:

the first pillar has a diameter that decreases as it extends vertically from the routing line, and the first pillar and the routing line contact one another, adhere to one another and are not integral with one another;

the second pillar has a diameter that decreases as it extends vertically from the routing line, and the second pillar and the routing line contact one another, adhere to one another and are not integral with one another; and the routing line is an essentially flat planar lead.

94. The assembly of claim 91, wherein the conductive trace contacts the ground plane only at the press-fit, and the conductive trace contacts only the ground plane at the press-fit.

95. The assembly of claim 91, wherein the conductive trace is disposed vertically beyond the chip, and the ground plane is disposed vertically beyond the chip, the routing line and the connection joint.

96. The assembly of claim 91, wherein the opening extends vertically from the chip only as far as the ground plane, and the press-fit is confined to an interface between the first pillar and the ground plane.

97. The assembly of claim 91, wherein the connection joint is a wire bond.

98. The assembly of claim 91, wherein the first pillar, the opening and the press-fit are disposed within a periphery of the chip, and the second pillar is disposed outside the periphery of the chip.

99. The assembly of claim 91, including an encapsulant that contacts and covers the chip, covers the first and second pillars and the routing line and is spaced from the ground plane, and an insulative base that contacts the first and second pillars, the routing line and the ground plane, is sandwiched between the routing line and the ground plane and is spaced from the chip.

100. The assembly of claim 91, wherein the assembly is a first-level package.

101. A semiconductor chip assembly, comprising:
a semiconductor chip that includes first and second opposing major surfaces, wherein the first surface of the chip includes first and second conductive pads;
a first conductive trace that includes a first pillar and a first routing line, wherein the first pillar is adjacent to and extends vertically from the first routing line, and the first routing line is adjacent to and extends laterally from the first pillar;
a second conductive trace that includes a second pillar and a second routing line, wherein the second pillar is adjacent to and extends vertically from the second routing line, and the second routing line is adjacent to and extends laterally from the second pillar;
a first connection joint that contacts and electrically connects the first routing line and the first pad;
a second connection joint that contacts and electrically connects the second routing line and the second pad; and
a ground plane that includes first and second opposing major surfaces and an opening therebetween, wherein the first and second surfaces of the chip are essentially parallel to the first and second surfaces of the ground plane, the first pillar is press-fit into the opening, the first routing line is spaced from the ground plane and the press-fit, an electrically conductive path between the ground plane and the first pad includes the first pillar, the first routing line, the first connection joint and the press-fit, the second conductive trace is electrically isolated from the first conductive trace and the ground plane, and the assembly is devoid of a printed circuit board.

102. The assembly of claim 101, wherein the chip is proximate to and within a periphery of the ground plane.

103. The assembly of claim 101, wherein:
the first pillar has a diameter that decreases as it extends vertically from the first routing line, the first routing line is an essentially flat planar lead, and the first pillar and the first routing line contact one another, adhere to one another and are not integral with one another; and
the second pillar has a diameter that decreases as it extends vertically from the second routing line, the second routing line is an essentially flat planar lead, and the second pillar and the second routing line contact one another, adhere to one another and are not integral with one another.

104. The assembly of claim 101, wherein the first conductive trace contacts the ground plane only at the press-fit, and the first conductive trace contacts only the ground plane at the press-fit.

105. The assembly of claim 101, wherein the first and second conductive traces are disposed vertically beyond the chip, and the ground plane is disposed vertically beyond the chip, the first and second routing lines and the first and second connection joints.

106. The assembly of claim 101, wherein the opening extends vertically from the chip only as far as the ground plane, and the press-fit is confined to an interface between the first pillar and the ground plane.

107. The assembly of claim 101, wherein the first and second connection joints are wire bonds.

108. The assembly of claim 101, wherein the first pillar, the opening and the press-fit are disposed within a periphery of the chip, and the second pillar is disposed outside the periphery of the chip.

109. The assembly of claim 101, including an encapsulant that contacts and covers the chip, covers the first and second pillars and the first and second routing lines and is spaced from the ground plane, and an insulative base that contacts the first and second pillars, the first and second routing lines and the ground plane, is sandwiched between the first and second routing lines and the ground plane and is spaced from the chip.

110. The assembly of claim 101, wherein the assembly is a first-level package.

111. A semiconductor chip assembly, comprising:
a first semiconductor chip that includes first and second opposing major surfaces, wherein the first surface of the first chip includes a first conductive pad;
a second semiconductor chip that includes first and second opposing major surfaces, wherein the first surface of the second chip includes a second conductive pad;
a first conductive trace that includes a first pillar and a first routing line, wherein the first pillar is adjacent to and extends vertically from the first routing line, and the first routing line is adjacent to and extends laterally from the first pillar;
a second conductive trace that includes a second pillar and a second routing line, wherein the second pillar is adjacent to and extends vertically from the second routing line, and the second routing line is adjacent to and extends laterally from the second pillar;
a first connection joint that contacts and electrically connects the first routing line and the first pad;
a second connection joint that contacts and electrically connects the second routing line and the second pad; and
a ground plane that includes first and second opposing major surfaces and first and second openings therebetween, wherein the first and second surfaces of the first and second chips are essentially parallel to the first and second surfaces of the ground plane, the first pillar is press-fit into the first opening at a first press-fit, the first routing line is spaced from the ground plane and the first press-fit, the second pillar is press-fit into the second opening at a second press-fit, the second routing line is spaced from the ground plane and the second press-fit, a first electrically conductive path between the ground plane and the first pad includes the first pillar, the first routing line, the first connection joint and the first press-fit and excludes the second conductive trace and the second connection joint, a second electrically conductive path between the ground plane and the second pad includes the second pillar, the second routing line, the second connection joint and the second press-fit and excludes the first conductive trace and the first connection joint, and the assembly is devoid of a printed circuit board.

112. The assembly of claim 111, wherein the first and second chips are proximate to and within a periphery of the ground plane.

113. The assembly of claim 111, wherein:
the first pillar has a diameter that decreases as it extends vertically from the first routing line, the first routing line is an essentially flat planar lead, and the first pillar and the first routing line contact one another, adhere to one another and are not integral with one another; and
the second pillar has a diameter that decreases as it extends vertically from the second routing line, the second routing line is an essentially flat planar lead, and the second pillar and the second routing line contact one another, adhere to one another and are not integral with one another.

114. The assembly of claim 111, wherein the first conductive trace contacts the ground plane only at the first press-fit, the first conductive trace contacts only the ground plane at the first press-fit, the second conductive trace contacts the ground plane only at the second first press-fit, and the second conductive trace contacts only the ground plane at the second press-fit.

115. The assembly of claim 111, wherein the first and second conductive traces are disposed vertically beyond the first and second chips, and the ground plane is disposed vertically beyond the first and second chips, the first and second routing lines and the first and second connection joints.

116. The assembly of claim 111, wherein the first opening extends vertically from the first chip only as far as the ground plane, the first press-fit is confined to an interface between the first pillar and the ground plane, the second opening extends vertically from the second chip only as far as the ground plane, and the second press-fit is confined to an interface between the second pillar and the ground plane.

117. The assembly of claim 111, wherein the first and second connection joints are wire bonds.

118. The assembly of claim 111, wherein the first pillar, the first opening and the first press-fit are disposed within a periphery of the first chip, and the second pillar, the second opening and the second press-fit are disposed within a periphery of the second chip.

119. The assembly of claim 111, including an encapsulant that contacts and covers the first and second chips, covers the first and second pillars and the first and second routing lines and is spaced from the ground plane, and an insulative base that contacts the first and second pillars, the first and second routing lines and the ground plane, is sandwiched between the first and second routing lines and the ground plane and is spaced from the first and second chips.

120. The assembly of claim 111, wherein the assembly is a first-level package.

121. A semiconductor chip assembly, comprising:
a semiconductor chip that includes first and second opposing major surfaces, wherein the first surface of the chip includes a conductive pad;
a conductive trace that includes a first pillar, a second pillar and a routing line, wherein the first pillar is adjacent to and extends vertically from the routing line, the routing line is adjacent to and extends laterally from the first pillar, the second pillar is adjacent to and extends vertically from the routing line, the routing line is adjacent to and extends laterally from the second pillar, and the first and second pillars are coplanar with and laterally spaced from one another and have essentially identical thicknesses;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the first pillar is press-fit into the opening, the routing line is spaced from the ground plane and the press-fit, an electrically conductive path between the ground plane and the pad includes the first pillar, the routing line, the connection joint and the press-fit, the second pillar is electrically connected to the pad and is not in an electrically conductive path between the ground plane and the pad, and the assembly is devoid of a printed circuit board.

122. The assembly of claim 121, wherein the chip is proximate to and within a periphery of the ground plane.

123. The assembly of claim 121, wherein:
the first pillar has a diameter that decreases as it extends vertically from the routing line, and the first pillar and the routing line contact one another, adhere to one another and are not integral with one another;
the second pillar has a diameter that decreases as it extends vertically from the routing line, and the second pillar and the routing line contact one another, adhere to one another and are not integral with one another; and
the routing line is an essentially flat planar lead.

124. The assembly of claim 121, wherein the conductive trace contacts the ground plane only at the press-fit, and the conductive trace contacts only the ground plane at the press-fit.

125. The assembly of claim 121, wherein the conductive trace is disposed vertically beyond the chip, and the ground plane is disposed vertically beyond the chip, the routing line and the connection joint.

126. The assembly of claim 121, wherein the opening extends vertically from the chip only as far as the ground plane, and the press-fit is confined to an interface between the first pillar and the ground plane.

127. The assembly of claim 121, wherein the connection joint is a wire bond.

128. The assembly of claim 121, wherein the first pillar, the opening and the press-fit are disposed within a periphery of the chip, and the second pillar is disposed outside the periphery of the chip.

129. The assembly of claim 121, including an encapsulant that contacts and covers the chip, covers the first and second pillars and the routing line and is spaced from the ground plane, and an insulative base that contacts the first and second pillars, the routing line and the ground plane, is sandwiched between the routing line and the ground plane and is spaced from the chip.

130. The assembly of claim 121, wherein the assembly is a first-level package.

131. A semiconductor chip assembly, comprising:
a semiconductor chip that includes first and second opposing major surfaces, wherein the first surface of the chip includes first and second conductive pads;
a first conductive trace that includes a first pillar and a first routing line, wherein the first pillar is adjacent to and extends vertically from the first routing line, and the first routing line is adjacent to and extends laterally from the first pillar;
a second conductive trace that includes a second pillar and a second routing line, wherein the second pillar is adjacent to and extends vertically from the second routing line, and the second routing line is adjacent to and extends laterally from the second pillar;
a first connection joint that contacts and electrically connects the first routing line and the first pad;
a second connection joint that contacts and electrically connects the second routing line and the second pad; and
a ground plane that includes first and second opposing major surfaces and an opening therebetween, wherein the first and second surfaces of the chip are essentially parallel to the first and second surfaces of the ground plane, the first and second pillars are coplanar with and laterally spaced from one another and have essentially identical thicknesses, the first and second routing lines are coplanar with and laterally spaced from one another and have essentially identical thicknesses, the first pillar is press-fit into the opening, the first routing line is spaced from the ground plane and the press-fit, an electrically conductive path between the ground plane and the first pad includes the first pillar, the first routing line, the first connection joint and the press-fit, the second conductive trace is electrically isolated from the first conductive trace and the ground plane, and the assembly is devoid of a printed circuit board.

132. The assembly of claim 131, wherein the chip is proximate to and within a periphery of the ground plane.

133. The assembly of claim 131, wherein:
the first pillar has a diameter that decreases as it extends vertically from the first routing line, the first routing line is an essentially flat planar lead, and the first pillar and the first routing line contact one another, adhere to one another and are not integral with one another; and
the second pillar has a diameter that decreases as it extends vertically from the second routing line, the second routing line is an essentially flat planar lead, and the second pillar and the second routing line contact one another, adhere to one another and are not integral with one another.

134. The assembly of claim 131, wherein the first conductive trace contacts the ground plane only at the press-fit, and the first conductive trace contacts only the ground plane at the press-fit.

135. The assembly of claim 131, wherein the first and second conductive traces are disposed vertically beyond the chip, and the ground plane is disposed vertically beyond the chip, the first and second routing lines and the first and second connection joints.

136. The assembly of claim 131, wherein the opening extends vertically from the chip only as far as the ground plane, and the press-fit is confined to an interface between the first pillar and the ground plane.

137. The assembly of claim 131, wherein the first and second connection joints are wire bonds.

138. The assembly of claim 131, wherein the first pillar, the opening and the press-fit are disposed within a periphery of the chip, and the second pillar is disposed outside the periphery of the chip.

139. The assembly of claim 131, including an encapsulant that contacts and covers the chip, covers the first and second pillars and the first and second routing lines and is spaced from the ground plane, and an insulative base that contacts the first and second pillars, the first and second routing lines and the ground plane, is sandwiched between the first and second routing lines and the ground plane and is spaced from the chip.

140. The assembly of claim 131, wherein the assembly is a first-level package.

141. A semiconductor chip assembly, comprising:
a first semiconductor chip that includes first and second opposing major surfaces, wherein the first surface of the first chip includes a first conductive pad;
a second semiconductor chip that includes first and second opposing major surfaces, wherein the first surface of the second chip includes a second conductive pad;
a first conductive trace that includes a first pillar and a first routing line, wherein the first pillar is adjacent to and extends vertically from the first routing line, and the first routing line is adjacent to and extends laterally from the first pillar;
a second conductive trace that includes a second pillar and a second routing line, wherein the second pillar is adjacent to and extends vertically from the second routing line, and the second routing line is adjacent to and extends laterally from the second pillar;
a first connection joint that contacts and electrically connects the first routing line and the first pad;
a second connection joint that contacts and electrically connects the second routing line and the second pad; and
a ground plane that includes first and second opposing major surfaces and first and second openings therebetween, wherein the first and second surfaces of the first and second chips are essentially parallel to the first and second surfaces of the ground plane, the first and second chips are laterally spaced from one another, the first and second pillars are coplanar with and laterally spaced from one another and have essentially identical thicknesses, the first and second routing lines are coplanar with and laterally spaced from one another and have essentially identical thicknesses, the first pillar is press-fit into the first opening at a first press-fit, the first routing line is spaced from the ground plane and the first press-fit, the second pillar is press-fit into the second opening at a second press-fit, the second routing line is spaced from the ground plane and the second press-fit, a first electrically conductive path between the ground plane and the first pad includes the first pillar, the first routing line, the first connection joint and the first press-fit and excludes the second conductive trace and the second connection joint, a second electrically conductive path between the ground plane and the second pad includes the second pillar, the second routing line, the second connection joint and the second press-fit and excludes the first conductive trace and the first connection joint, and the assembly is devoid of a printed circuit board.

142. The assembly of claim 141, wherein the first and second chips are proximate to and within a periphery of the ground plane.

143. The assembly of claim 141, wherein:
the first pillar has a diameter that decreases as it extends vertically from the first routing line, the first routing line is an essentially flat planar lead, and the first pillar and the first routing line contact one another, adhere to one another and are not integral with one another; and
the second pillar has a diameter that decreases as it extends vertically from the second routing line, the second routing line is an essentially flat planar lead, and the second pillar and the second routing line contact one another, adhere to one another and are not integral with one another.

144. The assembly of claim 141, wherein the first conductive trace contacts the ground plane only at the first press-fit, the first conductive trace contacts only the ground plane at the first press-fit, the second conductive trace contacts the ground plane only at the second first press-fit, and the second conductive trace contacts only the ground plane at the second press-fit.

145. The assembly of claim 141, wherein the first and second conductive traces are disposed vertically beyond the first and second chips, and the ground plane is disposed vertically beyond the first and second chips, the first and second routing lines and the first and second connection joints.

146. The assembly of claim 141, wherein the first opening extends vertically from the first chip only as far as the ground plane, the first press-fit is confined to an interface between the first pillar and the ground plane, the second opening extends vertically from the second chip only as far as the ground plane, and the second press-fit is confined to an interface between the second pillar and the ground plane.

147. The assembly of claim 141, wherein the first and second connection joints are wire bonds.

148. The assembly of claim 141, wherein the first pillar, the first opening and the first press-fit are disposed within a periphery of the first chip, and the second pillar, the second opening and the second press-fit are disposed within a periphery of the second chip.

149. The assembly of claim 141, including an encapsulant that contacts and covers the first and second chips, covers the first and second pillars and the first and second routing lines and is spaced from the ground plane, and an insulative base that contacts the first and second pillars, the first and second routing lines and the ground plane, is sandwiched between the first and second routing lines and the ground plane and is spaced from the first and second chips.

150. The assembly of claim 141, wherein the assembly is a first-level package.

151. The assembly of claims 1, 21, 41, 51, 61, 71, 81, 91, 101, 121 or 131, wherein the ground plane is a metal plate and the assembly is a first-level package.

152. The assembly of claim 151, wherein the ground plane is not sandwiched between insulative layers.

153. The assembly of claim 151, wherein the opening extends vertically from the chip only as far as the ground plane.

154. The assembly of claim 151, wherein any press-fit in the assembly includes an interface with the ground plane.

155. The assembly of claim 151, wherein any electrically conductive path in the assembly that includes a press-fit includes a press-fit with the ground plane.

156. The assembly of claims 111 or 141, wherein the ground plane is a metal plate and the assembly is a first-level package.

157. The assembly of claim 156, wherein the ground plane is not sandwiched between insulative layers.

158. The assembly of claim 156, wherein the first and second openings extend vertically from the first and second chips only as far as the ground plane.

159. The assembly of claim 156, wherein any press-fit in the assembly includes an interface with the ground plane.

160. The assembly of claim 156, wherein any electrically conductive path in the assembly that includes a press-fit includes a press-fit with the ground plane.

161. The assembly of claims 5, 21, 41, 51, 61, 71, 81, 91 or 121, wherein the conductive trace extends laterally beyond the chip in only a single lateral direction.

162. The assembly of claims 101 or 131, wherein the first and second conductive traces extend laterally beyond the chip in only a single lateral direction.

163. The assembly of claims 111 or 141, wherein the first conductive trace extends laterally beyond the first chip in only a single lateral direction, and the second conductive trace extends laterally beyond the second chip in only a single lateral direction.

164. The assembly of claims 5, 21, 41, 51, 61, 71, 81, 91 or 121, wherein the conductive trace is laterally aligned with the pad.

165. The assembly of claims 101, 111, 131 or 141, wherein the first conductive trace is laterally aligned with the first pad and the second conductive trace is laterally aligned with the second pad.

166. The assembly of claims 5, 21, 41, 51, 61, 71, 81, 91 or 121, wherein the conductive trace is devoid of a press-fit.

167. The assembly of claims 101, 111, 131 or 141, wherein the first conductive trace is devoid of a press-fit and the second conductive trace is devoid of a press-fit.

168. The assembly of claims 5, 21, 41, 51, 61, 71 or 81, wherein the pillar is disposed vertically beyond the routing line.

169. The assembly of claims 91 or 121, wherein the first and second pillars are disposed vertically beyond the routing line.

170. The assembly of claims 101, 111, 131 or 141, wherein the first pillar is disposed vertically beyond the first routing line and the second pillar is disposed vertically beyond the second routing line.

171. The assembly of claims 5, 21, 41, 51, 61, 71, 91 or 121, wherein the routing line is disposed vertically beyond any press-fit in the assembly.

172. The assembly of claims 101, 111, 131 or 141, wherein the first and second routing lines are disposed vertically beyond any press-fit in the assembly.

173. A semiconductor chip assembly, comprising:
a semiconductor chip that includes a conductive pad;
a conductive trace;
a ground plane, wherein the conductive trace is press-fit into an opening in the ground plane, and an electrically conductive path between the ground plane and the pad includes the press-fit; and
a metal coating that contacts and covers the ground plane, contacts the conductive trace, covers the opening and is exposed.

174. A semiconductor chip assembly, comprising:
a semiconductor chip that includes first and second opposing major surfaces, wherein the first surface of the chip includes a conductive pad;

a conductive trace that includes a pillar and a routing line, wherein the pillar is adjacent to and extends vertically from the routing line, the routing line is adjacent to and extends laterally from the pillar, and the pillar and the routing line contact one another, are metallurgically bonded to one another and are not integral with one another;

a connection joint that contacts and electrically connects the routing line and the pad; and a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane, and an electrically conductive path between the ground plane and the pad includes the pillar, the routing line, the connection joint and the press-fit.

175. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line, and the routing line is adjacent to and extends laterally from the pillar;

a connection joint that contacts and electrically connects the routing line and the pad;

a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane, and an electrically conductive path between the ground plane and the pad includes the pillar, the routing line, the connection joint and the press-fit; and an insulative base that contacts the pillar, the routing line and the ground plane, is sandwiched between the routing line and the ground plane and is spaced from the chip.

176. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line, and the routing line is adjacent to and extends laterally from the pillar;

a connection joint that contacts and electrically connects the routing line and the pad;

a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane, and an electrically conductive path between the ground plane and the pad includes the pillar, the routing line, the connection joint and the press-fit; and a metal coating that contacts and covers the pillar and the ground plane, covers the opening, is spaced from the routing line and is exposed.

177. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line and has a diameter that decreases as it extends vertically from the routing line, the routing line is adjacent to and extends laterally from the pillar and is an essentially flat planar lead, and the pillar and the routing line contact one another, are metallurgically bonded to one another and are not integral with one another;

a connection joint that contacts and electrically connects the routing line and the pad;

a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, and an electrically conductive path between the ground plane and the pad includes the pillar, the routing line, the connection joint and the press-fit;

an encapsulant that contacts and covers the chip, covers the pillar and the routing line and is spaced from the ground plane; and an insulative base that contacts the pillar, the routing line and the ground plane, is sandwiched between the routing line and the ground plane and is spaced from the chip.

178. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line, and the routing line is adjacent to and extends laterally from the pillar;

a connection joint that contacts and electrically connects the routing line and the pad;

a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, the conductive trace contacts the ground plane only at the press-fit, the conductive trace contacts only the ground plane at the press-fit, and an electrically conductive path between the ground plane and the pad includes the pillar, the routing line, the connection joint and the press-fit;

an encapsulant that contacts and covers the chip, covers the pillar and the routing line and is spaced from the ground plane; and an insulative base that contacts the pillar, the routing line and the ground plane, is sandwiched between the routing line and the ground plane and is spaced from the chip.

179. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line, and the routing line is adjacent to and extends laterally from the pillar;

a connection joint that contacts and electrically connects the routing line and the pad;

a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, the pillar, the opening and the press-fit are disposed vertically beyond the chip and within a periphery of the chip, and an electrically conductive path between the ground plane and the pad includes the pillar, the routing line, the connection joint and the press-fit;

an encapsulant that contacts and covers the chip, covers the pillar and the routing line and is spaced from the ground plane; and an insulative base that contacts the pillar, the routing line and the ground plane, is sandwiched between the routing line and the ground plane and is spaced from the chip.

180. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line, and the routing line is adjacent to and extends laterally from the pillar;

a connection joint that contacts and electrically connects the routing line and the pad;

a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, and an electrically conductive path between the ground plane and the pad requires the routing line and the connection joint, includes the pillar and the press-fit and is devoid of another ground plane and another press-fit;

an encapsulant that contacts and covers the chip, covers the pillar and the routing line and is spaced from the ground plane; and an insulative base that contacts the pillar, the routing line and the ground plane, is sandwiched between the routing line and the ground plane and is spaced from the chip.

181. A semiconductor chip assembly, comprising:

a semiconductor chip that includes first and second opposing major surfaces, wherein the first surface of the chip includes a conductive pad;

a conductive trace that includes a first pillar, a second pillar and a routing line, wherein the first pillar is adjacent to and extends vertically from the routing line, the routing line is adjacent to and extends laterally from the first pillar, the second pillar is adjacent to and extends vertically from the routing line, and the routing line is adjacent to and extends laterally from the second pillar;

a connection joint that contacts and electrically connects the routing line and the pad;

a ground plane that includes first and second opposing major surfaces and an opening therebetween, wherein the first and second surfaces of the chip are essentially parallel to the first and second surfaces of the ground plane, the first pillar is press-fit into the opening, the routing line is spaced from the ground plane and the press-fit, an electrically conductive path between the ground plane and the pad includes the first pillar, the routing line, the connection joint and the press-fit, and the second pillar is electrically connected to the pad and is not in an electrically conductive path between the ground plane and the pad;

an encapsulant that contacts and covers the chip, covers the first and second pillars and the routing line and is spaced from the ground plane; and an insulative base that contacts the first and second pillars, the routing line and the ground plane, is sandwiched between the routing line and the ground plane and is spaced from the chip.

182. A semiconductor chip assembly, comprising:

a semiconductor chip that includes first and second opposing major surfaces, wherein the first surface of the chip includes first and second conductive pads;

a first conductive trace that includes a first pillar and a first routing line, wherein the first pillar is adjacent to and extends vertically from the first routing line, and the first routing line is adjacent to and extends laterally from the first pillar;

a second conductive trace that includes a second pillar and a second routing line, wherein the second pillar is adjacent to and extends vertically from the second routing line, and the second routing line is adjacent to and extends laterally from the second pillar;

a first connection joint that contacts and electrically connects the first routing line and the first pad;

a second connection joint that contacts and electrically connects the second routing line and the second pad;

a ground plane that includes first and second opposing major surfaces and an opening therebetween, wherein the first and second surfaces of the chip are essentially parallel to the first and second surfaces of the ground plane, the first pillar is press-fit into the opening, the first routing line is spaced from the ground plane and the press-fit, an electrically conductive path between the ground plane and the first pad includes the first pillar, the first routing line, the first connection joint and the press-fit, and the second conductive trace is electrically isolated from the first conductive trace and the ground plane;

an encapsulant that contacts and covers the chip, covers the first and second pillars and the first and second routing lines and is spaced from the ground plane; and an insulative base that contacts the first and second pillars, the first and second routing lines and the ground plane, is sandwiched between the first and second routing lines and the ground plane and is spaced from the chip.

183. A semiconductor chip assembly, comprising:

a first semiconductor chip that includes first and second opposing major surfaces, wherein the first surface of the first chip includes a first conductive pad;

a second semiconductor chip that includes first and second opposing major surfaces, wherein the first surface of the second chip includes a second conductive pad;

a first conductive trace that includes a first pillar and a first routing line, wherein the first pillar is adjacent to and extends vertically from the first routing line, and the first routing line is adjacent to and extends laterally from the first pillar;

a second conductive trace that includes a second pillar and a second routing line, wherein the second pillar is adjacent to and extends vertically from the second routing line, and the second routing line is adjacent to and extends laterally from the second pillar;

a first connection joint that contacts and electrically connects the first routing line and the first pad;

a second connection joint that contacts and electrically connects the second routing line and the second pad;

a ground plane that includes first and second opposing major surfaces and first and second openings therebetween, wherein the first and second surfaces of the first and second chips are essentially parallel to the first and second surfaces of the ground plane, the first pillar is press-fit into the first opening at a first press-fit, the first routing line is spaced from the ground plane and the first press-fit, the second pillar is press-fit into the second opening at a second press-fit, the second routing line is spaced from the ground plane and the second press-fit, a first electrically conductive path between the ground plane and the first pad includes the first pillar, the first routing line, the first connection joint and the first press-fit and excludes the second conductive trace and the second connection joint, and a second electrically conductive path between the ground plane and the second pad includes the second pillar, the second routing line, the second connection joint and the second press-fit and excludes the first conductive trace and the first connection joint;

an encapsulant that contacts and covers the first and second chips, covers the first and second pillars and the first and second routing lines and is spaced from the ground plane; and an insulative base that contacts the first and second pillars, the first and second routing lines and the ground plane, is sandwiched between the first and second routing lines and the ground plane and is spaced from the first and second chips.

184. A semiconductor chip assembly, comprising:

a semiconductor chip that includes first and second opposing major surfaces, wherein the first surface of the chip includes a conductive pad;

a conductive trace that includes a first pillar, a second pillar and a routing line, wherein the first pillar is adjacent to and extends vertically from the routing line, the routing line is adjacent to and extends laterally from the first pillar, the second pillar is adjacent to and extends vertically from the routing line, the routing line is adjacent to and extends laterally from the second pillar, and the first and second pillars are coplanar with and laterally spaced from one another and have essentially identical thicknesses;

a connection joint that contacts and electrically connects the routing line and the pad;

a ground plane that includes first and second opposing major surfaces and an opening therebetween, wherein the first and second surfaces of the chip are essentially parallel to the first and second surfaces of the ground plane, the first pillar is press-fit into the opening, the routing line is spaced from the ground plane and the press-fit, an electrically conductive path between the ground plane and the pad includes the first pillar, the routing line, the connection joint and the press-fit, and the second pillar is electrically connected to the pad and is not in an electrically conductive path between the ground plane and the pad;

an encapsulant that contacts and covers the chip, covers the first and second pillars and the routing line and is spaced from the ground plane; and an insulative base that contacts the first and second pillars, the routing line and the ground plane, is sandwiched between the routing line and the ground plane and is spaced from the chip.

185. A semiconductor chip assembly, comprising:

a semiconductor chip that includes first and second opposing major surfaces, wherein the first surface of the chip includes first and second conductive pads;

a first conductive trace that includes a first pillar and a first routing line, wherein the first pillar is adjacent to and extends vertically from the first routing line, and the first routing line is adjacent to and extends laterally from the first pillar;

a second conductive trace that includes a second pillar and a second routing line, wherein the second pillar is adjacent to and extends vertically from the second routing line, and the second routing line is adjacent to and extends laterally from the second pillar;

a first connection joint that contacts and electrically connects the first routing line and the first pad;

a second connection joint that contacts and electrically connects the second routing line and the second pad;

a ground plane that includes first and second opposing major surfaces and an opening therebetween, wherein the first and second surfaces of the chip are essentially parallel to the first and second surfaces of the ground plane, the first and second pillars are coplanar with and laterally spaced from one another and have essentially identical thicknesses, the first and second routing lines are coplanar with and laterally spaced from one another and have essentially identical thicknesses, the first pillar is press-fit into the opening, the first routing line is spaced from the ground plane and the press-fit, an electrically conductive path between the ground plane and the first pad includes the first pillar, the first routing line, the first connection joint and the press-fit, and the second conductive trace is electrically isolated from the first conductive trace and the ground plane;

an encapsulant that contacts and covers the chip, covers the first and second pillars and the first and second routing lines and is spaced from the ground plane; and an insulative base that contacts the first and second pillars, the first and second routing lines and the ground plane, is sandwiched between the first and second routing lines and the ground plane and is spaced from the chip.

186. A semiconductor chip assembly, comprising:

a first semiconductor chip that includes first and second opposing major surfaces, wherein the first surface of the first chip includes a first conductive pad;

a second semiconductor chip that includes first and second opposing major surfaces, wherein the first surface of the second chip includes a second conductive pad;

a first conductive trace that includes a first pillar and a first routing line, wherein the first pillar is adjacent to and extends vertically from the first routing line, and the first routing line is adjacent to and extends laterally from the first pillar;

a second conductive trace that includes a second pillar and a second routing line, wherein the second pillar is adjacent to and extends vertically from the second routing line, and the second routing line is adjacent to and extends laterally from the second pillar;

a first connection joint that contacts and electrically connects the first routing line and the first pad;

a second connection joint that contacts and electrically connects the second routing line and the second pad;

a ground plane that includes first and second opposing major surfaces and first and second openings therebetween, wherein the first and second surfaces of the first and second chips are essentially parallel to the first and second surfaces of the ground plane, the first and second chips are laterally spaced from one another, the first and second pillars are coplanar with and laterally spaced from one another and have essentially identical thicknesses, the first and second routing lines are coplanar with and laterally spaced from one another and have essentially identical thicknesses, the first pillar is press-fit into the first opening at a first press-fit, the first routing line is spaced from the ground plane and the first press-fit, the second pillar is press-fit into the second opening at a second press-fit, the second routing line is spaced from the ground plane and the second press-fit, a first electrically conductive path between the ground plane and the first pad includes the first pillar, the first routing line, the first connection joint and the first press-fit and excludes the second conductive trace and the second connection joint, and a second electrically conductive path between the ground plane and the second pad includes the second pillar, the second routing line, the second connection joint and the second press-fit and excludes the first conductive trace and the first connection joint;

an encapsulant that contacts and covers the first and second chips, covers the first and second pillars and the first and second routing lines and is spaced from the ground plane; and an insulative base that contacts the first and second pillars, the first and second routing lines and the ground plane, is sandwiched between the first and second routing lines and the ground plane and is spaced from the first and second chips.

187. A semiconductor chip assembly, comprising:

a semiconductor chip that includes a conductive pad;

a conductive trace; and a ground plane, wherein the conductive trace is press-fit into an opening in the ground plane, an electrically conductive path between the ground plane and the pad includes the press-fit, the ground plane is a metal plate that is not sandwiched between insulative layers, and the assembly is a first-level package.

188. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line, and the routing line is adjacent to and extends laterally from the pillar;

a connection joint that contacts and electrically connects the routing line and the pad; and a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane, an electrically conductive path between the ground plane and the pad includes the pillar, the routing line, the connection joint and the press-fit, the ground plane is a metal plate that is not sandwiched between insulative layers, and the assembly is a first-level package.

189. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line and has a diameter that decreases as it extends vertically from the routing line, the routing line is adjacent to and extends laterally from the pillar and is an essentially flat planar lead, and the pillar and the routing line contact one another, are metallurgically bonded to one another and are not integral with one another;

a connection joint that contacts and electrically connects the routing line and the pad; and a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, an electrically conductive path between the ground plane and the pad includes the pillar, the routing line, the connection joint and the press-fit, the ground plane is a metal plate that is not sandwiched between insulative layers, and the assembly is a first-level package.

190. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line, and the routing line is adjacent to and extends laterally from the pillar;

a connection joint that contacts and electrically connects the routing line and the pad; and a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, the conductive trace contacts the ground plane only at the press-fit, the conductive trace contacts only the ground plane at the press-fit, an electrically conductive path between the ground plane and the pad includes the pillar, the routing line, the connection joint and the press-fit, the ground plane is a metal plate that is not sandwiched between insulative layers, and the assembly is a first-level package.

191. A semiconductor chip assembly, comprising:

a semiconductor chip that includes first and second opposing major surfaces, wherein the first surface of the chip includes a conductive pad;

a conductive trace that includes a pillar and a routing line, wherein the pillar is adjacent to and extends vertically from the routing line, and the routing line is adjacent to and extends laterally from the pillar;

a connection joint that contacts and electrically connects the routing line and the pad; and a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, the pillar, the opening and the press-fit are disposed vertically beyond the chip and within a periphery of the chip, an electrically conductive path between the ground plane and the pad includes the pillar, the routing line, the connection joint and the press-fit, the ground plane is a metal plate that is not sandwiched between insulative layers, and the assembly is a first-level package.

192. A semiconductor chip assembly, comprising:
a semiconductor chip that includes first and second opposing major surfaces, wherein the first surface of the chip includes a conductive pad;
a conductive trace that includes a pillar and a routing line, wherein the pillar is adjacent to and extends vertically from the routing line, and the routing line is adjacent to and extends laterally from the pillar;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, an electrically conductive path between the ground plane and the pad requires the routing line and the connection joint, includes the pillar and the press-fit and is devoid of another ground plane and another press-fit, the ground plane is a metal plate that is not sandwiched between insulative layers, and the assembly is a first-level package.

193. A semiconductor chip assembly, comprising:
a semiconductor chip that includes first and second opposing major surfaces, wherein the first surface of the chip includes a conductive pad;
a conductive trace that includes a first pillar, a second pillar and a routing line, wherein the first pillar is adjacent to and extends vertically from the routing line, the routing line is adjacent to and extends laterally from the first pillar, the second pillar is adjacent to and extends vertically from the routing line, and the routing line is adjacent to and extends laterally from the second pillar;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the first pillar is press-fit into the opening, the routing line is spaced from the ground plane and the press-fit, an electrically conductive path between the ground plane and the pad includes the first pillar, the routing line, the connection joint and the press-fit, the second pillar is electrically connected to the pad and is not in an electrically conductive path between the ground plane and the pad, the ground plane is a metal plate that is not sandwiched between insulative layers, and the assembly is a first-level package.

194. A semiconductor chip assembly, comprising:
a semiconductor chip that includes first and second opposing major surfaces, wherein the first surface of the chip includes first and second conductive pads;
a first conductive trace that includes a first pillar and a first routing line, wherein the first pillar is adjacent to and extends vertically from the first routing line, and the first routing line is adjacent to and extends laterally from the first pillar;

a second conductive trace that includes a second pillar and a second routing line, wherein the second pillar is adjacent to and extends vertically from the second routing line, and the second routing line is adjacent to and extends laterally from the second pillar;
a first connection joint that contacts and electrically connects the first routing line and the first pad;
a second connection joint that contacts and electrically connects the second routing line and the second pad; and
a ground plane that includes first and second opposing major surfaces and an opening therebetween, wherein the first and second surfaces of the chip are essentially parallel to the first and second surfaces of the ground plane, the first pillar is press-fit into the opening, the first routing line is spaced from the ground plane and the press-fit, an electrically conductive path between the ground plane and the first pad includes the first pillar, the first routing line, the first connection joint and the press-fit, the second conductive trace is electrically isolated from the first conductive trace and the ground plane, the ground plane is a metal plate that is not sandwiched between insulative layers, and the assembly is a first-level package.

195. A semiconductor chip assembly, comprising:
a first semiconductor chip that includes first and second opposing major surfaces, wherein the first surface of the first chip includes a first conductive pad;
a second semiconductor chip that includes first and second opposing major surfaces, wherein the first surface of the second chip includes a second conductive pad;
a first conductive trace that includes a first pillar and a first routing line, wherein the first pillar is adjacent to and extends vertically from the first routing line, and the first routing line is adjacent to and extends laterally from the first pillar;
a second conductive trace that includes a second pillar and a second routing line, wherein the second pillar is adjacent to and extends vertically from the second routing line, and the second routing line is adjacent to and extends laterally from the second pillar;
a first connection joint that contacts and electrically connects the first routing line and the first pad;
a second connection joint that contacts and electrically connects the second routing line and the second pad; and
a ground plane that includes first and second opposing major surfaces and first and second openings therebetween, wherein the first and second surfaces of the first and second chips are essentially parallel to the first and second surfaces of the ground plane, the first pillar is press-fit into the first opening at a first press-fit, the first routing line is spaced from the ground plane and the first press-fit, the second pillar is press-fit into the second opening at a second press-fit, the second routing line is spaced from the ground plane and the second press-fit, a first electrically conductive path between the ground plane and the first pad includes the first pillar, the first routing line, the first connection joint and the first press-fit and excludes the second conductive trace and the second connection joint, a second electrically conductive path between the ground plane and the second pad includes the second pillar, the second routing line, the second connection joint and the second press-fit and excludes the first conductive trace and the first connection joint, the ground plane is a metal plate that is not sandwiched between insulative layers, and the assembly is a first-level package.

196. A semiconductor chip assembly, comprising:

a semiconductor chip that includes first and second opposing major surfaces, wherein the first surface of the chip includes a conductive pad;

a conductive trace that includes a first pillar, a second pillar and a routing line, wherein the first pillar is adjacent to and extends vertically from the routing line, the routing line is adjacent to and extends laterally from the first pillar, the second pillar is adjacent to and extends vertically from the routing line, the routing line is adjacent to and extends laterally from the second pillar, and the first and second pillars are coplanar with and laterally spaced from one another and have essentially identical thicknesses;

a connection joint that contacts and electrically connects the routing line and the pad; and a ground plane that includes first and second opposing major surfaces and an opening therebetween, wherein the first and second surfaces of the chip are essentially parallel to the first and second surfaces of the ground plane, the first pillar is press-fit into the opening, the routing line is spaced from the ground plane and the press-fit, an electrically conductive path between the ground plane and the pad includes the first pillar, the routing line, the connection joint and the press-fit, the second pillar is electrically connected to the pad and is not in an electrically conductive path between the ground plane and the pad, the ground plane is a metal plate that is not sandwiched between insulative layers, and the assembly is a first-level package.

197. A semiconductor chip assembly, comprising:

a semiconductor chip that includes first and second opposing major surfaces, wherein the first surface of the chip includes first and second conductive pads;

a first conductive trace that includes a first pillar and a first routing line, wherein the first pillar is adjacent to and extends vertically from the first routing line, and the first routing line is adjacent to and extends laterally from the first pillar;

a second conductive trace that includes a second pillar and a second routing line, wherein the second pillar is adjacent to and extends vertically from the second routing line, and the second routing line is adjacent to and extends laterally from the second pillar;

a first connection joint that contacts and electrically connects the first routing line and the first pad;

a second connection joint that contacts and electrically connects the second routing line and the second pad; and a ground plane that includes first and second opposing major surfaces and an opening therebetween, wherein the first and second surfaces of the chip are essentially parallel to the first and second surfaces of the ground plane, the first and second pillars are coplanar with and laterally spaced from one another and have essentially identical thicknesses, the first and second routing lines are coplanar with and laterally spaced from one another and have essentially identical thicknesses, the first pillar is press-fit into the opening, the first routing line is spaced from the ground plane and the press-fit, an electrically conductive path between the ground plane and the first pad includes the first pillar, the first routing line, the first connection joint and the press-fit, the second conductive trace is electrically isolated from the first conductive trace and the ground plane, the ground plane is a metal plate that is not sandwiched between insulative layers, and the assembly is a first-level package.

198. A semiconductor chip assembly, comprising:

a first semiconductor chip that includes first and second opposing major surfaces, wherein the first surface of the first chip includes a first conductive pad;

a second semiconductor chip that includes first and second opposing major surfaces, wherein the first surface of the second chip includes a second conductive pad;

a first conductive trace that includes a first pillar and a first routing line, wherein the first pillar is adjacent to and extends vertically from the first routing line, and the first routing line is adjacent to and extends laterally from the first pillar;

a second conductive trace that includes a second pillar and a second routing line, wherein the second pillar is adjacent to and extends vertically from the second routing line, and the second routing line is adjacent to and extends laterally from the second pillar;

a first connection joint that contacts and electrically connects the first routing line and the first pad;

a second connection joint that contacts and electrically connects the second routing line and the second pad; and a ground plane that includes first and second opposing major surfaces and first and second openings therebetween, wherein the first and second surfaces of the first and second chips are essentially parallel to the first and second surfaces of the ground plane, the first and second chips are laterally spaced from one another, the first and second pillars are coplanar with and laterally spaced from one another and have essentially identical thicknesses, the first and second routing lines are coplanar with and laterally spaced from one another and have essentially identical thicknesses, the first pillar is press-fit into the first opening at a first press-fit, the first routing line is spaced from the ground plane and the first press-fit, the second pillar is press-fit into the second opening at a second press-fit, the second routing line is spaced from the ground plane and the second press-fit, a first electrically conductive path between the ground plane and the first pad includes the first pillar, the first routing line, the first connection joint and the first press-fit and excludes the second conductive trace and the second connection joint, a second electrically conductive path between the ground plane and the second pad includes the second pillar, the second routing line, the second connection joint and the second press-fit and excludes the first conductive trace and the first connection joint, the ground plane is a metal plate that is not sandwiched between insulative layers, and the assembly is a first-level package.

199. A semiconductor chip assembly, comprising:

a semiconductor chip that includes a conductive pad;

a conductive trace that includes a pillar and a routing line, wherein the pillar extends vertically from and is disposed vertically beyond the routing line, and the routing line extends laterally from the pillar; and a ground plane, wherein the pillar is press-fit into an opening in the ground plane, the routing line is spaced from the ground plane, and an electrically conductive path between the ground plane and the pad includes the press-fit.

200. A semiconductor chip assembly, comprising:
a semiconductor chip that includes first and second opposing major surfaces, wherein the first surface of the chip includes a conductive pad;
a conductive trace that includes a pillar and a routing line, wherein the pillar is adjacent to and extends vertically from and is disposed vertically beyond the routing line, and the routing line is adjacent to and extends laterally from the pillar;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane, and an electrically conductive path between the ground plane and the pad includes the pillar, the routing line, the connection joint and the press-fit.

201. A semiconductor chip assembly, comprising:
a semiconductor chip that includes first and second opposing major surfaces, wherein the first surface of the chip includes a conductive pad;
a conductive trace that includes a pillar and a routing line, wherein the pillar is adjacent to and extends vertically from and is disposed vertically beyond the routing line and has a diameter that decreases as it extends vertically from the routing line, the routing line is adjacent to and extends laterally from the pillar and is an essentially flat planar lead, and the pillar and the routing line contact one another, are metallurgically bonded to one another and are not integral with one another;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, and an electrically conductive path between the ground plane and the pad includes the pillar, the routing line, the connection joint and the press-fit.

202. A semiconductor chip assembly, comprising:
a semiconductor chip that includes first and second opposing major surfaces, wherein the first surface of the chip includes a conductive pad;
a conductive trace that includes a pillar and a routing line, wherein the pillar is adjacent to and extends vertically from and is disposed vertically beyond the routing line, and the routing line is adjacent to and extends laterally from the pillar;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, the conductive trace contacts the ground plane only at the press-fit, the conductive trace contacts only the ground plane at the press-fit, and an electrically conductive path between the ground plane and the pad includes the pillar, the routing line, the connection joint and the press-fit.

203. A semiconductor chip assembly, comprising:
a semiconductor chip that includes first and second opposing major surfaces, wherein the first surface of the chip includes a conductive pad;
a conductive trace that includes a pillar and a routing line, wherein the pillar is adjacent to and extends vertically from and is disposed vertically beyond the routing line, and the routing line is adjacent to and extends laterally from the pillar;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, the pillar, the opening and the press-fit are disposed vertically beyond the chip and within a periphery of the chip, and an electrically conductive path between the ground plane and the pad includes the pillar, the routing line, the connection joint and the press-fit.

204. A semiconductor chip assembly, comprising:
a semiconductor chip that includes first and second opposing major surfaces, wherein the first surface of the chip includes a conductive pad;
a conductive trace that includes a pillar and a routing line, wherein the pillar is adjacent to and extends vertically from and is disposed vertically beyond the routing line, and the routing line is adjacent to and extends laterally from the pillar;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the pillar is press-fit into the opening, the routing line is spaced from the ground plane and the press-fit, and an electrically conductive path between the ground plane and the pad requires the routing line and the connection joint, includes the pillar and the press-fit and is devoid of another ground plane and another press-fit.

205. A semiconductor chip assembly, comprising:
a semiconductor chip that includes first and second opposing major surfaces, wherein the first surface of the chip includes a conductive pad;
a conductive trace that includes a first pillar, a second pillar and a routing line, wherein the first pillar is adjacent to and extends vertically from and is disposed vertically beyond the routing line, the routing line is adjacent to and extends laterally from the first pillar, the second pillar is adjacent to and extends vertically from and is disposed vertically beyond the routing line, and the routing line is adjacent to and extends laterally from the second pillar;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the first pillar is press-fit into the opening, the routing line is spaced from the ground plane and the press-fit, an electrically conductive path between the ground plane and the pad includes the first pillar, the routing line, the connection joint and the press-fit, and the second pillar is electrically connected to the pad and is not in an electrically conductive path between the ground plane and the pad.

206. A semiconductor chip assembly, comprising:
a semiconductor chip that includes first and second opposing major surfaces, wherein the first surface of the chip includes first and second conductive pads;
a first conductive trace that includes a first pillar and a first routing line, wherein the first pillar is adjacent to and extends vertically from and is disposed vertically beyond the first routing line, and the first routing line is adjacent to and extends laterally from the first pillar;
a second conductive trace that includes a second pillar and a second routing line, wherein the second pillar is adjacent to and extends vertically from and is disposed vertically beyond the second routing line, and the second routing line is adjacent to and extends laterally from the second pillar;
a first connection joint that contacts and electrically connects the first routing line and the first pad;
a second connection joint that contacts and electrically connects the second routing line and the second pad; and
a ground plane that includes first and second opposing major surfaces and an opening therebetween, wherein the first and second surfaces of the chip are essentially parallel to the first and second surfaces of the ground plane, the first pillar is press-fit into the opening, the first routing line is spaced from the ground plane and the press-fit, an electrically conductive path between the ground plane and the first pad includes the first pillar, the first routing line, the first connection joint and the press-fit, and the second conductive trace is electrically isolated from the first conductive trace and the ground plane.

207. A semiconductor chip assembly, comprising:
a first semiconductor chip that includes first and second opposing major surfaces, wherein the first surface of the first chip includes a first conductive pad;
a second semiconductor chip that includes first and second opposing major surfaces, wherein the first surface of the second chip includes a second conductive pad;
a first conductive trace that includes a first pillar and a first routing line, wherein the first pillar is adjacent to and extends vertically from and is disposed vertically beyond the first routing line, and the first routing line is adjacent to and extends laterally from the first pillar;
a second conductive trace that includes a second pillar and a second routing line, wherein the second pillar is adjacent to and extends vertically from and is disposed vertically beyond the second routing line, and the second routing line is adjacent to and extends laterally from the second pillar;
a first connection joint that contacts and electrically connects the first routing line and the first pad;
a second connection joint that contacts and electrically connects the second routing line and the second pad; and
a ground plane that includes first and second opposing major surfaces and first and second openings therebetween, wherein the first and second surfaces of the first and second chips are essentially parallel to the first and second surfaces of the ground plane, the first pillar is press-fit into the first opening at a first press-fit, the first routing line is spaced from the ground plane and the first press-fit, the second pillar is press-fit into the second opening at a second press-fit, the second routing line is spaced from the ground plane and the second press-fit, a first electrically conductive path between the ground plane and the first pad includes the first pillar, the first routing line, the first connection joint and the first press-fit and excludes the second conductive trace and the second connection joint, and a second electrically conductive path between the ground plane and the second pad includes the second pillar, the second routing line, the second connection joint and the second press-fit and excludes the first conductive trace and the first connection joint.

208. A semiconductor chip assembly, comprising:
a semiconductor chip that includes first and second opposing major surfaces, wherein the first surface of the chip includes a conductive pad;
a conductive trace that includes a first pillar, a second pillar and a routing line, wherein the first pillar is adjacent to and extends vertically from and is disposed vertically beyond the routing line, the routing line is adjacent to and extends laterally from the first pillar, the second pillar is adjacent to and extends vertically from and is disposed vertically beyond the routing line, the routing line is adjacent to and extends laterally from the second pillar, and the first and second pillars are coplanar with and laterally spaced from one another and have essentially identical thicknesses;
a connection joint that contacts and electrically connects the routing line and the pad; and
a ground plane that includes first and second opposing major surfaces and an opening therebetween, wherein the first and second surfaces of the chip are essentially parallel to the first and second surfaces of the ground plane, the first pillar is press-fit into the opening, the routing line is spaced from the ground plane and the press-fit, an electrically conductive path between the ground plane and the pad includes the first pillar, the routing line, the connection joint and the press-fit, and the second pillar is electrically connected to the pad and is not in an electrically conductive path between the ground plane and the pad.

209. A semiconductor chip assembly, comprising:
a semiconductor chip that includes first and second opposing major surfaces, wherein the first surface of the chip includes first and second conductive pads;
a first conductive trace that includes a first pillar and a first routing line, wherein the first pillar is adjacent to and extends vertically from and is disposed vertically beyond the first routing line, and the first routing line is adjacent to and extends laterally from the first pillar;
a second conductive trace that includes a second pillar and a second routing line, wherein the second pillar is adjacent to and extends vertically from and is disposed vertically beyond the second routing line, and the second routing line is adjacent to and extends laterally from the second pillar;
a first connection joint that contacts and electrically connects the first routing line and the first pad;
a second connection joint that contacts and electrically connects the second routing line and the second pad; and
a ground plane that includes first and second opposing major surfaces and an opening therebetween, wherein the first and second surfaces of the chip are essentially parallel to the first and second surfaces of the ground plane, the first and second pillars are coplanar with and laterally spaced from one another and have essentially identical thicknesses, the first and second routing lines are coplanar with and laterally spaced from one another and have essentially identical thicknesses, the first pillar is press-fit into the opening, the first routing line is spaced from the ground plane and the press-fit, an electrically conductive path between the ground plane and the first pad includes the first pillar, the first routing line, the first connection joint and the press-fit, and the second conductive trace is electrically isolated from the first conductive trace and the ground plane.

210. A semiconductor chip assembly, comprising:

a first semiconductor chip that includes first and second opposing major surfaces, wherein the first surface of the first chip includes a first conductive pad;

a second semiconductor chip that includes first and second opposing major surfaces, wherein the first surface of the second chip includes a second conductive pad;

a first conductive trace that includes a first pillar and a first routing line, wherein the first pillar is adjacent to and extends vertically from and is disposed vertically beyond the first routing line, and the first routing line is adjacent to and extends laterally from the first pillar;

a second conductive trace that includes a second pillar and a second routing line, wherein the second pillar is adjacent to and extends vertically from and is disposed vertically beyond the second routing line, and the second routing line is adjacent to and extends laterally from the second pillar;

a first connection joint that contacts and electrically connects the first routing line and the first pad;

a second connection joint that contacts and electrically connects the second routing line and the second pad; and a ground plane that includes first and second opposing major surfaces and first and second openings therebetween, wherein the first and second surfaces of the first and second chips are essentially parallel to the first and second surfaces of the ground plane, the first and second chips are laterally spaced from one another, the first and second pillars are coplanar with and laterally spaced from one another and have essentially identical thicknesses, the first and second routing lines are coplanar with and laterally spaced from one another and have essentially identical thicknesses, the first pillar is press-fit into the first opening at a first press-fit, the first routing line is spaced from the ground plane and the first press-fit, the second pillar is press-fit into the second opening at a second press-fit, the second routing line is spaced from the ground plane and the second press-fit, a first electrically conductive path between the ground plane and the first pad includes the first pillar, the first routing line, the first connection joint and the first press-fit and excludes the second conductive trace and the second connection joint, and a second electrically conductive path between the ground plane and the second pad includes the second pillar, the second routing line, the second connection joint and the second press-fit and excludes the first conductive trace and the first connection joint.

* * * * *

UNITED STATES PATENT AND TRADEMARK OFFICE
CERTIFICATE OF CORRECTION

| | |
|---|---|
| PATENT NO. | : 7,157,791 B1 |
| APPLICATION NO. | : 10/866393 |
| DATED | : January 2, 2007 |
| INVENTOR(S) | : Charles W.C. Lin |

Page 1 of 1

It is certified that error appears in the above-identified patent and that said Letters Patent is hereby corrected as shown below:

<u>Column 49</u>
Line 34, delete "1" after "is".

Signed and Sealed this

Seventeenth Day of April, 2007

JON W. DUDAS
*Director of the United States Patent and Trademark Office*